(12) United States Patent
Hamamoto et al.

(10) Patent No.: US 6,757,212 B2
(45) Date of Patent: Jun. 29, 2004

(54) CLOCK SYNCHRONOUS TYPE SEMICONDUCTOR MEMORY DEVICE

(75) Inventors: Takeshi Hamamoto, Hyogo (JP); Takeo Miki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/034,544

(22) Filed: Jan. 3, 2002

(65) Prior Publication Data

US 2002/0141280 A1 Oct. 3, 2002

(30) Foreign Application Priority Data

Mar. 28, 2001 (JP) ........................................ 2001-092352

(51) Int. Cl.[7] .............................. G11C 8/00; G11C 7/00
(52) U.S. Cl. ........................ 365/233; 365/220; 365/221
(58) Field of Search ............................. 365/233, 189.04, 365/189.01, 189.05, 189.12, 220, 221, 230.08

(56) References Cited

U.S. PATENT DOCUMENTS

| | | | | |
|---|---|---|---|---|
| 5,930,198 A | * | 7/1999 | Ryan | ........................... 365/233 |
| 6,002,615 A | * | 12/1999 | Sawada | .................. 365/189.01 |
| 6,029,250 A | * | 2/2000 | Keeth | ........................... 711/167 |
| 6,166,989 A | | 12/2000 | Hamamoto et al. | |
| 6,229,758 B1 | * | 5/2001 | Agata | ........................... 365/233 |

FOREIGN PATENT DOCUMENTS

JP 11-213666 8/1999

OTHER PUBLICATIONS

U.S. patent application Ser. No. 09/666,133, "Clock Synchronous Type Semiconductor Memory Device That Can Switch Word Configuration," filed Sep. 20, 2000, Continuation of U.S. patent No. 6,166,989.

* cited by examiner

Primary Examiner—Thong Le
(74) Attorney, Agent, or Firm—McDermott, Will & Emery

(57) ABSTRACT

A clock signal, which is generated by utilizing a delay circuit having a delay time depending on the operation frequency of an internal clock signal, is applied to a first circuit for activation thereof, and a clock signal, which has a fixed delay not dependent on the clock frequency and is adjusted in phase with respect to an external clock signal, is applied to a second circuit receiving the output signal of the first circuit for operation thereof. Thus, the operation timing of the second circuit can be set to be as late as possible. Consequently, it is possible to mitigate the operation conditions of the first circuit, to achieve a high speed data transfer. Even in the high speed operation, internal data can be reliably taken in, and transferred accurately.

19 Claims, 30 Drawing Sheets

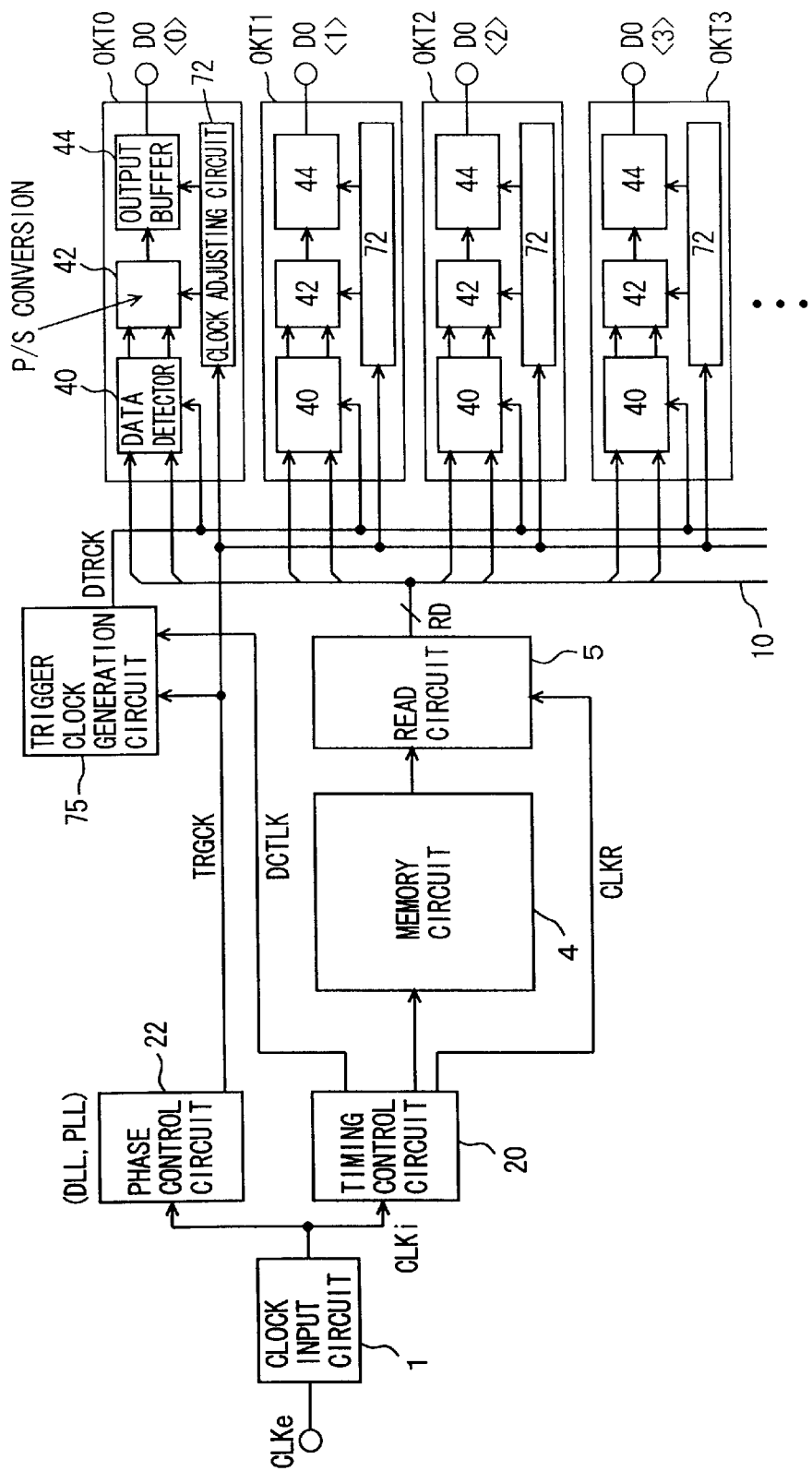
F I G. 17

: Tmd + Tpd < Tld

CLOCK SYNCHRONOUS TYPE SEMICONDUCTOR MEMORY DEVICE

BACKGROUND OF THE INVENTION

1. Field of the Invention

The present invention relates to a semiconductor memory device, and, more particularly, to a construction of a data output section of a clock synchronous type semiconductor memory that is operated synchronized with a clock signal externally applied. More specifically, the present invention relates to a construction that is capable of transmitting internal data at high speed in a clock synchronous type semiconductor memory.

2. Description of the Background Art

FIG. 37 is a diagram schematically showing a portion related to a data reading in a conventional clock synchronous type semiconductor memory device. In FIG. 37, the data reading section includes: an internal clock generation circuit 1 for buffering an external clock signal CLKe to generate an internal clock signal CLKi, a clock control circuit 2 for generating various control clock signals such as CLKR and CLKO in accordance with internal clock signal CLKi and an operation mode instruction (command) from an address/command control circuit 3, address/command control circuit 3 for receiving an address and a command ACG and for generating an internal address and an operation mode instruction signal, a memory circuit 4 for reading stored data from a memory cell under a control of address/command control circuit 3, a reading circuit 5 for transferring data read from a selected memory cell of memory circuit 4 in accordance with read out clock signal CLKR from clock control circuit 2, and an output control circuit 6 for transferring data transferred from reading circuit 5 in accordance with output clock signal CLKO from clock control circuit 2 to generate an external read data Q.

In accordance with the address and command ACG, address/command control circuit 3 applies a command for specifying a data reading instruction to clock control circuit 2 in reading data. Address/command control circuit 3 also applies a reading instruction signal for instructing a data reading operation to memory circuit 4 together with an address signal.

Memory circuit 4 includes memory cells that are arranged in rows and columns, and a memory cell selection circuit for selecting a row and column of the memory cells in accordance with the internal address signal from address/command control circuit 3. Reading circuit 5, the construction of which will be described later, includes a preamplifier and a shifter, amplifies data of the selected memory cell of memory circuit 4, and transfers the resultant signal in accordance with reading clock signal CLKR.

Output control circuit 6, the construction of which will be described later, takes in data transferred from reading circuit 5 in accordance with output clock signal CLKO, executes a buffering process on the data for external output. Both of these reading clock signal CLKR and output clock signal CLKO are generated by using a delay circuit, etc., based upon internal clock signal CLKi.

In the synchronous type semiconductor memory device shown in FIG. 37, an address/command capturing is carried out in synchronization with a rising or falling edge of internal clock signal CLKi generated by buffering external clock signal CLKe, and internal read out data is transferred in accordance with reading clock signal CLKR. Then, output control circuit 6 buffers the internal read out data in synchronization with a rising or falling edge of output clock signal CLKO to generate external data Q. When this semiconductor memory device is operated in a signal data rate mode, the external data outputting is carried out in response to one of rising and falling edges of internal clock CLKi. In contrast, when this semiconductor memory device is operated in a double data rate mode, the data outputting is carried out in response to both of the rising and falling edges of internal clock CLKi.

FIG. 38 is a diagram schematically showing the construction of reading circuit 5 shown in FIG. 37. In reading circuit 5, data of a plurality of bits that is read out in parallel with each other from memory circuit 4 is selectively transferred to an internal read data line 10. FIG. 38 schematically shows the construction related to one-bit data.

In FIG. 38, reading circuit 5 includes a preamplifier 5a that amplifies data read out on a pair of internal data lines IO and ZIO from memory circuit 4 in response to the activation of a preamplifier activation signal PAEj, and a shifter 5b that transfers the amplified data of preamplifier 5a in synchronization with shift clock signal CLKf. This shifter 5b includes an output driver for driving an internal read data transmission line 10. Preamplifiers 5a are placed in parallel with each other for internal read data transmission line 10 so that an output signal of the preamplifier activated by preamplifier activation signal PAEj is transmitted to internal read data transmission line 10 through the corresponding shifter.

Preamplifier activation signal PAEj is generated based upon a main preamplifier activation signal PAE and a preamplifier selection signal, and used for activating one of a plurality of preamplifiers placed in parallel with each other. Shifter 5b, which is a column latency shifter, carries out a transferring operation in a (column latency—2) cycle period, and adjusts the transfer period of the internal data so that, after a lapse of the column latency period since the receipt of a read command, valid data is externally outputted. A shift clock signal CLKf is generated based upon internal clock signal CLKi and the preamplifier selection signal so that the shift clock signal is applied to the shifter that is arranged in associated with the selected preamplifier.

A read data driver may be placed at an output section of this shifter 5b. Through internal read data transmission line 10, upon reading data, data Qi of one bit is transferred in accordance with internal clock signal CLKi. Preamplifier activation signal PAEj and a selection signal SELj are respectively generated based upon the column address signal, and the activation timings thereof are determined based upon internal clock signal CLKi.

FIG. 39 is a diagram schematically showing the construction of output control circuit 6 shown in FIG. 37. In FIG. 39, output control circuit 6 includes a read data detector 6a for taking in and amplifying internal reading data Qi on internal read data transmission line 10 in response to the activation of a detector enable signal DEN, and an output buffer circuit 6b for transferring the amplified data received from read data detector 6a to generate external output data Q, in accordance with an output clock signal CLKQ.

Read data detector 6a latches read out data Qi in synchronization with internal clock signal CLKi, and amplifies the latched data to apply the resultant data to output buffer circuit 6b. Output clock signal CLKO, shown in FIG. 37, corresponds to a pair of read data detector enable signal DEN and output signal CLKQ, and output clock signal CLKQ is generated by delaying internal clock signal CLKi by a predetermined period of time in reading data. In the same manner, detector enable signal DEN is also activated after a lapse of a predetermined time period based upon internal clock signal CLKi.

The delay times of these signals DEN and CLKQ are adjusted in accordance with the frequency of clock signal CLKi, and also changed in accordance with the frequency of clock signal CLKi.

Therefore, in this output control circuit 6 also, the data amplifying and transferring operations are carried out in synchronization with internal clock signal CLKi so that output data Q is outputted in synchronization with internal clock signal CLKi.

FIG. 40 is a timing chart representing the data reading operation of reading circuit 5 shown in FIG. 38. As shown in FIG. 40, upon receipt of the read command instructing a data reading operation, a read activation signal RP is activated for a predetermined period (during a burst length period) in synchronization with a rise of internal clock signal CLKi. Here, the burst length period indicates the number of pieces of data successively outputted through one data terminal when one read command is applied.

When read activation signal RP is activated, a main preamplifier activation signal MPAE is activated in accordance with internal clock signal CLKi. According to main preamplifier activation signal MPAE and a preamplifier selection signal, generated in accordance with the column address signal applied at the time of the application of the read command, preamplifier activation signal PAEj shown in FIG. 38 is activated. When main preamplifier activation signal MPAE (preamplifier activation signal PAEj) is activated, a preamplifier 5a, shown in FIG. 38, is activated so that data on internal read data lines IO and ZIO is amplified to generate the resultant, amplified data PD for application to shifter 5b.

A shift clock signal CLKf is generated in accordance with internal clock signal CLKi so that, when shift clock signal CLKf goes high, shifter 5b takes in output data PD of preamplifier 5a, and when shift clock signal CLKf goes low, shifter 5b is set to the latch state. Therefore, in shifter 5b, the internal data changes in synchronization with a rise of this shift clock signal CLKf.

In accordance with shift clock CLKf, shifter 5b carries out a shifting operation for a predetermined clock cycle period so that internal read data Qi is transmitted to internal read data transmission line 10. Here, FIG. 40 shows one example in which shifter 5b carries out a shifting operation of one clock cycle for a case in which column latency corresponds to 3.

Shift clock signal CLKf is generated in accordance with internal clock signal CLKi and read activation signal RP independently of main preamplifier activation signal MPAE through a separated path from that of main preamplifier activation signal MPAE. This shift clock signal CLKf has a delay time td with respect to internal clock signal CLKi. This delay time td is constant when the frequency of clock signal CLKi is constant, and generated by using a delay circuit having a delay time thereof adjusted in accordance with the clock frequency.

Therefore, when, after main preamplifier activation signal MPAE is activated and output data PD of preamplifier 5a is set to the definite state, shift clock signal CLKf goes high, shifter 5b can accurately take in and transfer output data PD of amplifier 5a.

FIG. 41 is a diagram schematically showing the relationship in phase between shift clock signal CLKf and main preamplifier activation signal MPAE. After the read command is applied, the data of a selected memory is transferred to a pair of internal data lines IOP (IO, ZIO). The time required for the data of selected memory cell to be transmitted, through internal line pair IOP to preamplifier 5a is determined in advance by an interconnection delay and such in the semiconductor memory device. With this delay time taken into consideration, main amplifier activation signal MPAE is activated after a lapse of time tA since the read command is applied. In accordance with activation of main preamplifier activation signal MPAE, output data PD of the preamplifier is allowed to change.

When the read command is applied, shift clock signal CLKf is generated in a path separated from that of main preamplifier activation signal MPAE, and rises after a lapse of time td in accordance with internal clock signal CLKi. Shift clock signal CLKf has a fixed pulse width. Therefore, in the case when this High level period of shift clock signal CLKf is completed prior to the change in output data PD of the preamplifier, an erroneous data reading is carried out, failing to carry out an accurate data reading operation.

This delay time td that shift clock signal CLKf has is optimally set in accordance with the frequency of clock signal CLKi at the time of designing, however, this delay time td tends to vary due to deviations in manufacturing parameters or others. Therefore, in the case when these main preamplifier activation signal MPAE and shift clock signal CLKf are formed through separated, individual paths, a timing margin needs to be taken into consideration, and a high speed operation can not implemented.

It is desirable for a data transmitting time from preamplifier 5a to shifter 5b to be made as short as possible from the viewpoint of a high speed access. Therefore, the activation timing of preamplifier 5a is normally changed in accordance with the operation frequency, and at the time of a high speed operation, preamplifier 5a is activated as fast as possible. At this time, shifter 5a is also made faster in activation timing correspondingly, and in order to advance the activation timing of shifter 5b, the activation timing of shifter 5b is changed in accordance with internal clock signal CLKi in the same manner. Therefore, the activation timing of each of preamplifier 5a and shifter 5b needs to be changed in accordance with the frequency of the clock signal, causing the above-mentioned problem with a timing margin or the like at the time of this change of activation.

Moreover, as shown in FIG. 40, preamplifier 5a latches output data PD for one clock cycle period. Therefore, in the case when preamplifier 5a latches output data PD for one clock cycle period, as indicated by a broken line in FIG. 41, if shift clock signal CLKf changes after the change of output data PD of the preamplifier, the set up time and hold time of the preamplifier output data with respect to shift clock signal CLKf need to be ensured. Consequently, there arises a problem that the cycle time could not shortened, and therefore, it is not possible to implement a high speed operation.

Thus, in reading circuit 5, in the case when shift clock signal CLKf for shifter 5b is generated with a predetermined delay time based upon internal clock signal CLKi in a path separated from that of preamplifier activation signal PAEj (main preamplifier activation signal MPAE) of preamplifier 5a, the timing margin needs to be set greater, and the set up/hold time of preamplifier output data PD with respect to shift clock signal CLKf needs to be ensured. Thus, there arises the problem that it is not possible to carry out a data reading operation at high speed.

It could be considered that shift clock signal CLKf is generated in response to the activation of preamplifier activation signal MPAE. In this case, however, an inherent delay time occurs from the activation of the preamplifier to the generation of the shift clock signal, causing an adverse effect on the high speed operation.

FIG. 42 is a diagram schematically showing the construction of a part for generating the signals transmitted to output control circuit 6 shown in FIG. 39. A control clock generation circuit shown in FIG. 42 is included in clock control circuit 2 shown in FIG. 37.

In FIG. 42, clock control circuit 2 includes a read control circuit 2a for generating read activation signal RP in accordance with read command READ, a detector clock generation circuit 2b for generating detector enable signal DEN by delaying internal clock signal CLKi by a predetermined time in accordance with the activation of read activation signal RP from read control circuit 2a, and an output clock generation circuit 2c for generating output clock signal CLKQ with a predetermined delay time in synchronization with internal clock signal CLKi upon activation of read activation signal RP. These detector enable signal DEN and output clock signal CLKQ each have a delay time that is set in accordance with the frequency of internal clock signal CLKi, and also have a predetermined time width.

As shown in FIG. 42, detector enable signal DEN and output clock signal CLKQ are generated in separated, individual paths. Upon data outputting, output clock signal CLKQ is generated during a burst length period in accordance with the activation of output enable signal OE generated inside thereof, in data outputting. The generation start timing of output clock signal CLKQ is determined in accordance with a column latency CL. Detector enable signal DEN needs to be activated at a faster timing as compared with output clock signal CLKQ, with the data latching and transferring operation in output buffer circuit 6b taken into account. Thus, data clock generation circuit 2b and output clock generation circuit 2c are formed of individual, separated circuits.

Therefore, as shown in FIG. 43, after a lapse of time tB since the read command is applied, internal read data Qi is transmitted to read data detector 6a as shown in FIG. 39, and set to the definite state. In the case where the delay time of detector enable signal DEN becomes shorter due to deviations of transistor parameters or other and detector enable signal DEN is activated at time t0, the read detector 6a takes in and amplifies internal read data Qi in the non-definite state and therefore, it becomes impossible to carry out an accurate data reading operation.

The read data detector 6a is set to the latching state when detector enable signal DEN is activated, and the latched data is amplified. Therefore, when read data detector 6a enters the latching state at time t0, detector enable signal DEN is activated before internal read data Qi is made definite, resulting in an inaccurate data reading operation. Consequently, it is necessary to activate detector enable signal DEN at time t1 after internal read data Qi is made definite, and it is therefore necessary to take into consideration a margin for the delay time of the detector enable signal. Thus, it becomes impossible to implement a high speed operation.

In particular, the time required for the data to be transmitted by reading circuit 5 shown in FIG. 38 from a selected memory cell to read data detector 6a through the internal read data transmission line is predetermined in accordance with the frequency of the clock signal by taking a margin in this reading circuit 5 into consideration. Therefore, in the case where the delay time of the detector enable signal DEN varies due to variations in process parameters or the like, it becomes impossible to implement an accurate data reading operation.

In particular, in the case when the time tB is changed in accordance with the frequency of the clock signal, it is necessary to also adjust the generation timing of detector enable signal DEN in response to the changing, and a high speed operation can not be implemented due to the above-mentioned problem with timing.

Since it is necessary to take this margin of detector enable signal DEN into consideration, it is necessary to allow output buffer circuit 6b to perform the data transfer operation, with output clock signal CLKQ being set to the activated state at time tc after detector enable signal DEN is activated at time t1, and it becomes impossible to implement a high speed data reading operation. Moreover, at this time, since output clock signal CLKQ and detector enable signal DEN are produced through separated individual paths, output clock signal CLKQ needs to be activated by taking the timing margins of these detector enable signal DEN and output clock signal CLKQ into consideration. Consequently, the activation timing of the output buffer circuit is further delayed, and it becomes impossible to implement a data outputting operation at high speed.

In the case of a clock synchronous type memory, output buffer circuit 6b is required to output data in synchronization with the edge of the clock signal. Therefore, when the output buffer circuit is operated in response to output clock signal CLKQ, output buffer circuit 6b needs to be operated by taking signal propagation delays in data detector 6a and the buffer circuit 6b into consideration. In this case, the control signals DEN and CLKQ for these circuits 6a and 6b are generated in accordance with clock signal CLKi, and this timing adjustment becomes difficult.

More specifically, assuming that the signal propagation delay in each of data detector 6a and output buffer 6b is 2 ns (nanosecond) and that the clock cycle is 10 ns, detector enable signal DEN is activated after a lapse of 8 ns relative to the edge of clock signal CLKi. When this clock cycle becomes 8 ns, for example, it is necessary to activate detector enable signal DEN after a lapse of 6 ns relative to the edge of the clock signal. Therefore, it is necessary to change the activation timings of these activation control signals DEN and CLKi for these output circuits in accordance with the cycle time of the clock signal, or the frequency thereof, and it is therefore necessary to take timing margins for these control signals into consideration, making it impossible to carry out a data outputting operation at high speed.

Moreover, when the activation timing of the output control signal is changed in accordance with the frequency of the clock signal, the data transfer timing of the circuitry on the preceding stage also needs to be adjusted. In order to carry out an accurate data transferring, it is necessary to take into consideration a margin for adjusted timing in the circuit on the preceding stage, making it impossible to implement a high speed operation.

The above-mentioned problem that the margin for a variation in delay time of detector enable signal DEN exerts an adverse effect on the high speed operability, becomes more conspicuous when the data outputting is performed in the double data rate mode. Specifically, when the data outputting is carried out in the double data rate mode, data of a plurality of bits, read in parallel with each other, needs to be converted to series data inside the output circuit, and the data needs to be latched in a parallel/serial conversion circuit at faster timing, and transferred to an output circuit. Since a high speed operability is required, the timing conditions with respect to the double data rate become more strict and it becomes impossible to ensure the high speed operability.

SUMMARY OF THE INVENTION

It is an object of the present invention to provide a synchronous type semiconductor memory device which can output data stably at high speed.

Another object of the present invention is to provide a synchronous type semiconductor memory device which can easily optimize the internal data reading timing.

Still another object of the present invention is to provide a synchronous type semiconductor memory device allowing data to be read accurately at high speed.

Further object of the present invention is to provide a semiconductor device which can transfer internal data accurately at high speed.

A semiconductor memory device in accordance with the first aspect of the present invention includes: a clock generation circuit for generating an output clock signal in accordance with a basic clock signal; a reading clock generation circuit for generating a reading clock signal from the basic clock signal in a manner different from the output clock signal; an internal reading circuit for transmitting data of a selected memory cell in a memory array in according with the reading clock signal to an internal data line; a latch circuit for latching data on the internal data line in accordance with the output clock signal; and an output circuit for transferring the latched data in the latch circuit in accordance with the output clock signal.

A semiconductor memory device in accordance with the second aspect of the present invention includes: a preamplifier circuit for amplifying data transferred from a memory array in response to a first clock signal generated in accordance with an external clock signal; and a shift circuit for transferring output data from the preamplifier circuit in response to a second clock signal. The second clock signal is a clock signal having a phase adjusted relative to the external clock signal.

A semiconductor memory device in accordance with the third aspect of the present invention includes: a first circuit for generating and outputting first data from applied data in accordance with a first clock signal generated from an external clock signal; and a second circuit for generating and outputting second data in accordance with the data generated by the first circuit, in accordance with a second clock signal that is generated from the external clock signal in a manner different from the first clock signal.

Applied data is latched or transferred by using a clock signal generated by adjusting in phase the basic clock signal or external clock signal. Thus, different from a construction utilizing a fixed delay adjusted in accordance with the frequency, even when the phase/frequency of the basic clock signal or the external clock signal is changed, the data taking-in timing of the internal data with respect to these clock edges can be fixed by taking the data transfer time into consideration so that it becomes possible to take in data accurately even when the frequency or phase of the basic clock signal is changed.

By setting the taking-in timing in a fixed manner, the signal transfer timing of the preceding circuit can be flexibly adjusted in response to the frequency of the clock signal, thereby making it possible to optimize the operation timing of the circuit on the preceding stage in accordance with the frequency of the clock signal.

Moreover, in the output circuit or the internal reading circuit, triggering signals are generated from the same clock signal so that the timing adjustment is easily carried out and the timing margin can be reduced. Thus, it becomes possible to ensure high speed operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a schematic diagram showing the construction of a main part of a semiconductor memory device in accordance with a fifth embodiment of the present invention;

DESCRIPTION OF THE PREFERRED EMBODIMENTS

First Embodiment

Figure 1:
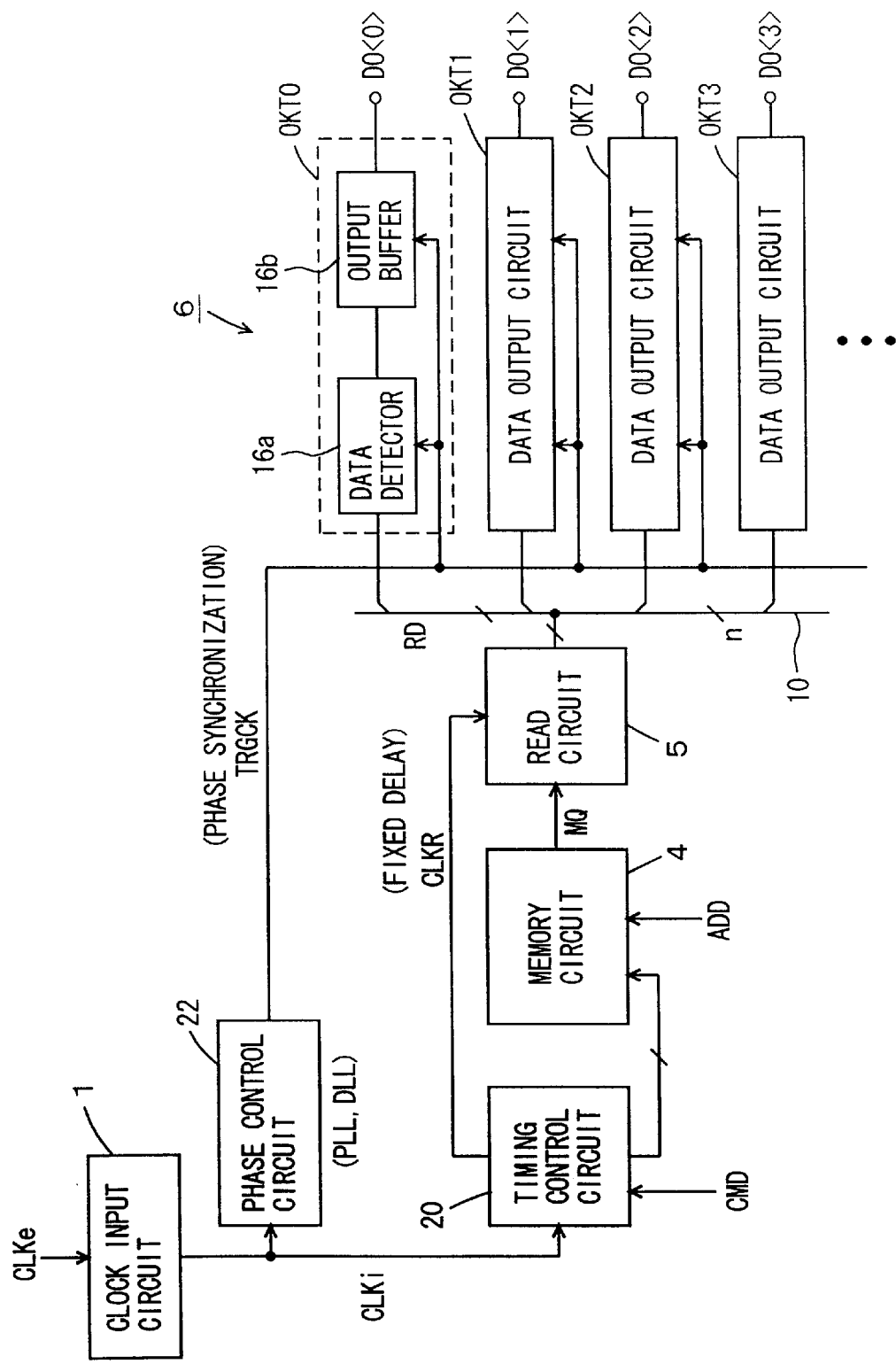
FIG. 1 is a schematic diagram showing the entire construction of a semiconductor memory device in accordance with a first embodiment of the present invention.

FIG. 1 is a schematic diagram showing the construction of a portion related to a data outputting operation in a synchronous type semiconductor memory device in accordance with the first embodiment of the present invention. In FIG. 1, the synchronous type semiconductor memory device includes: a clock input circuit 1 for generating an internal clock signal CLKi from an external clock signal CLKe; a phase control circuit 22 for generating an output trigger clock signal TRGCLK by adjusting in phase internal clock signal CLKi from clock input circuit 1; a timing control circuit 20 for generating various operation controlling clock signals based upon internal clock signal CLKi, in accordance with a command CMD instructing an operation mode; a memory circuit 4 that is operated in accordance with a control clock signal from timing control circuit 20, and selects a memory cell on an address specified by an address signal ADD to read data of the selected memory cell, and a reading circuit 5 that transfers internal read data MQ read from memory circuit 4 to an internal data bus (internal reading data transmission line) 10 in accordance with read trigger clock signal CLKR from timing control circuit 20.

Internal data bus 10 is indicated by the same reference numeral as the internal read data line since it transfers internal read data RD of a plurality bits (n bits), however, it is referred to as "internal data bus".

Clock input circuit 1 is constituted of a buffer circuit or a differential amplifier circuit, and generates internal clock signal CLKi corresponding to external clock signal CLKe, from external clock signal CLKe. This clock input circuit 1 preferably includes a one-shot pulse generation circuit, and generates a clock signal having a pulse width (High level period) not dependent on a High level period of external clock signal CLKe as internal clock signal CLKi, with the pulse width of internal clock signal CLKi being fixed.

In accordance with the operation mode specified by command CMD, timing control circuit 20 generates various internal control clock signals required for this operation mode based upon internal clock signal CLKi. In the case where the High level period of internal clock signal CLKi is fixed, when various internal operations are started in synchronization with both of the rising and falling edges of internal clock signal CLKi, it is possible to carry out the internal operations stably with predetermined timings, regardless of variations in the pulse width of external clock signal CLKi. Data reading clock signal CLKR from timing control circuit 20 includes both of the preamplifier activation signal and the shift clock signal.

Phase control circuit 22 is constituted of a phase locked loop (PLL) or delay locked loop (DLL), and generates output trigger clock signal TRGCK having a fixed phase difference that is not dependent on the frequency of the clock signal with respect to internal clock signal CLKi. This output trigger clock signal TRGCK has a fixed phase difference with respect to internal clock signal CLKi, and output trigger signal TRGCK synchronized in phase with internal clock signal CLKi is normally generated independently of data read trigger clock signal CLKR.

The delay time of output trigger signal TRGCK is a fixed delay time (leading in phase) with respect to clock signal CLKi, without depending on the frequency of clock signal CLKi. Although this delay time is a fixed delay time, it can be electrically switched by a mode setting command or aluminum interconnection line or the like. Thus, it has a delay time that is not dependent on the frequency of the clock signal, and is a fixed delay with respect to the clock signal. Hereinafter, this output trigger signal TRGCK is referred to as "fixed delay signal" relative to the clock signal.

The amount of phase adjustment in phase control circuit 22 is set independently from the frequency of external clock signal CLKe by taking into consideration the data propagation delay time in a data output circuit OKT. Thus, it is possible to take in internal read data RD read out on internal data bus 10 at an optimal timing, and also to sufficiently ensure the activation time period of reading circuit 5 even in a high speed operation.

Output control circuit 6 includes data output circuits OKT that are placed corresponding to respective bits of data of n bits on internal data bus 10. In FIG. 1, data output circuits OKT0–OKT3, placed corresponding to 4-bit output data DO<0>–DO<3>, are typically shown.

These data output circuits OKT0–OKT3 operate in parallel with each other, and transfer corresponding data bits on internal data bus 10. Each of data output circuits OKT0–OKT3 includes a data detector 16a for latching and amplifying corresponding read data bits on internal data bus 10 in synchronization with output trigger clock signal TRGCK from phase control circuit 22, and an output buffer 16a for buffering data amplified by data detector 16a in synchronization with output trigger clock signal TRGCK for external output.

Figure 2:
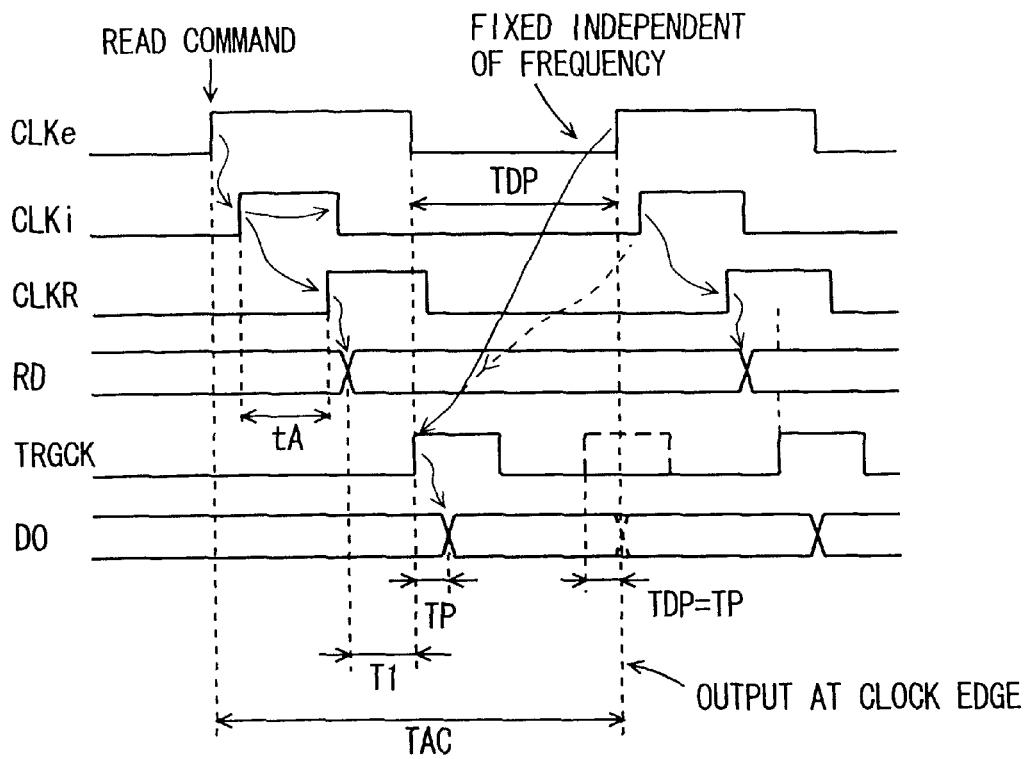
FIG. 2 is a timing chart representing the operation of the semiconductor memory device shown in FIG. 1.

Data detector 16a and output buffer 16b inside the data output circuit are operated in accordance with the same output trigger clock signal TRGCK, and therefore, it is possible to minimize the data latching, amplifying and transferring periods within data output circuit OKT, as will be described later. When data detector 16a and output buffer 16b are operated in synchronization with different clock signals, timing margins for these different clock signals need to be taken into consideration, which requires more period of time in transferring data within the data output circuit. However, as shown in FIG. 2, the application of the same output trigger clock signal TRGCK makes it possible to operate data detector 16a and output buffer 16b virtually at the same timing so that externally output data DO is generated in accordance with read data RD with only the signal propagation delay period within data output circuit OKT. Thus, it becomes possible to carry out an outputting operation at high speed.

FIG. 2 is a timing chart representing the operation of a data output circuit with a construction shown in FIG. 1. In FIG. 2, as an example, an internal clock signal CLKi having a predetermined time width is generated from external clock signal CLKe by clock input circuit 1. Upon receipt of a read command, read trigger clock signal CLKR is driven to the High level after a lapse of a predetermined period of time tA with this internal clock signal CLKi being a reference. Reading circuit 5 operates in accordance with this read trigger clock signal CLKR, and internal read data MQ is transmitted to internal data bus 10, and internal read data RD changes in accordance with data from reading circuit 5. This read trigger clock signal CKR is generated by using a delay circuit, and can have a fixed delay time, adjusted in accordance with the frequency of the clock signal, with respect to clock signal CLKi.

In contrast, output trigger clock signal TRGCK is activated with a predetermined phase difference (fixed delay) TDP relative to external clock signal CLKe (or internal clock signal CLKi). When this output trigger clock signal TRGCK goes high, data detector 16a is set to the latch state, and amplifies the latched data. Therefore, by setting this phase difference TDP independently from the frequency of external clock signal CLKe, data transfer time T1 in reading circuit 5 is sufficiently secured. Thus, when data read on internal data bus 10 is set to the definite state, the data latching and amplifying operations (data detecting operation) are reliably carried out by data detector 16a.

When this phase difference (time difference) TDP is made equal to signal propagation delay time TP in output circuit OTK, data can be outputted in synchronization with the edge of the external clock signal. In other words, by making phase difference TDP constant independent of the clock frequency, data output circuit OTK can always carry out a data transfer operation at the timing determined taking its inherent propagation delay time TP into account. Therefore, the rate of access time TAC is occupied by the data transfer time of data output circuit OTK is always made smaller. Consequently, the data transfer time tA+T1 required for data transfer from memory circuit 4 to internal data bus 10 through reading circuit 5 is set sufficiently longer, and therefore, even in the case of a high speed operation, it is possible to read and externally output data accurately.

In other words, output trigger signal TRGCK leading in phase external clock signal CLKe is generated by phase control circuit 22, and data output circuit OKT is operated with the signal propagation delay time TP in data output circuit OKT taken into account. Thus, the data can be externally outputted accurately in synchronization with the edge of the clock signal.

Data detector 16a and output buffer 16b are operated in accordance with the same output trigger clock signal TRGDK. Therefore, when this output trigger clock signal TRGDK goes high, after a lapse of signal propagation delay (gate delay and wiring delay) time TP in data output circuit OKT, output data DO is set to the definite state. Thus, output trigger clock signal TRGCK is generated with its phase adjusted in synchronization with external clock signal CLKe independently of read trigger clock signal CLKR. Consequently, output trigger clock signal TRGCK is activated at a optimal timing, and read trigger clock signal CLKR is also activated at optimal timing.

Therefore, it is possible to maximize the time tA of the period from the receipt of the read command to the activation of read trigger clock signal CLKR and also the time T1 of a period from the transfer of read data RD to read data bus 10 until the latch and amplifying operations are carried out by data detector 16a after output trigger clock signal TRGCK rises to the High level. In other words, even when time TAC required from the receipt of the read command to the external data output is minimized, it is possible to transfer the internal data accurately, and consequently to provide a high speed access. Moreover, even when the frequency of external clock signal CLKe is increased, it is possible to sufficiently secure the internal data transfer time, and consequently to output data stably at high speed.

As shown in FIG. 2, output trigger clock signal TRGCK has its phase adjusted with respect to external clock signal CLKe. Phase control circuit 22 carries out this phase adjustment in accordance with internal clock signal CLKi, and internal clock signal CLKi is generated in accordance with external clock signal CLKe. Therefore, output trigger clock signal TRGCK is adjusted in phase relative to internal clock signal CLKi, and the phase adjustment of the output trigger signal is carried out based upon external clock signal CLKe accordingly.

Moreover, different from the case in which a delay circuit is utilized, the clock signal having the phase adjusted with respect to clock signal CLKe or CLKi is used as the output trigger signal. Therefore, even when the frequency of the clock signal is changed, the phase difference is unchanged. Thus, it is possible to avoid a transferring of erroneous data caused by the activation of the output trigger signal prior to the output of the definite data, and consequently to read data in a stable manner.

In the case where a delay circuit is utilized, if data is outputted in synchronization with a high speed clock signal, it is necessary to adjust the delay time of this delay circuit in accordance with the frequency of the clock signal, and consequently to advance the activation timing of the output trigger signal. Therefore, there is a possibility that the data detector would perform the latching and amplifying operations prior to outputting of internal read data. By using, as an output trigger signal, the clock signal having the phase adjusted with respect to the clock signal, it is possible to generate an output trigger signal that always has a fixed, constant phase difference relative to the external clock signal (internal clock signal) independent of the frequency of the external clock signal (internal clock signal). Thus, it becomes possible to perform the data detecting operation at the time when the internal read data in the definite state is outputted, with the data detecting timing delayed as much as possible.

In the case of data reading timing indicated by a solid line in FIG. 2, it is shown that when the read command is applied, data DO is externally outputted within the current clock cycle. However, in practice, there is a column latency, and after a lapse of the column latency period, valid data is outputted. In FIG. 2, in order to indicate the timing of the clock signal, the timing indicated by the solid line is shown ignoring this column latency. The timing indicated by a broken line, which shows the output timing of data in the ideal state, corresponds to data output in the case where the column latency is set to 1. Normally, the column latency is adjusted by the column latency shifter within reading circuit 5. The construction of the reading circuit for adjusting the column latency is described later in detail.

Figure 3:
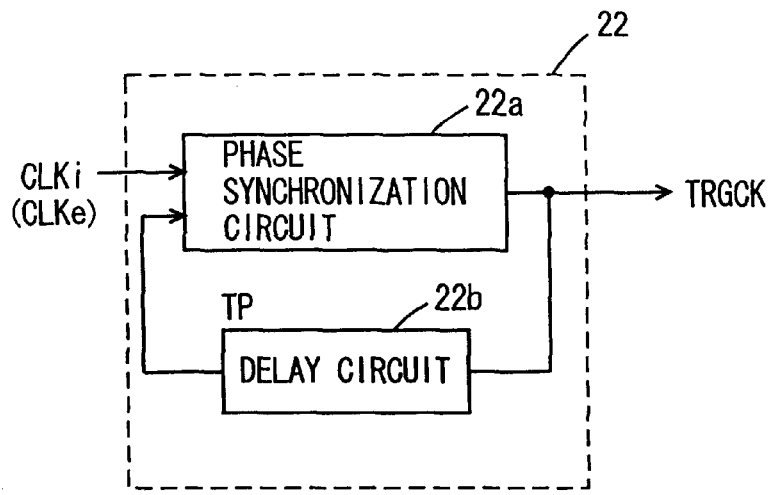
FIG. 3 is a schematic diagram showing a construction of a phase control circuit shown in FIG. 1.

FIG. 3 is a schematic diagram showing an example of the construction of phase control circuit 22 shown in FIG. 1. In FIG. 3, phase control circuit 22 includes a delay circuit 22b for delaying output trigger clock signal TRGCK by a predetermined period of time, and a phase synchronizing circuit 22a for locking in phase an output delay clock signal of delay circuit 22b to internal clock signal CLKi. Output trigger clock signal TRGCK is generated from this phase synchronizing circuit 22a. Delay circuit 22b has a delay time corresponding to phase difference TP shown in FIG. 2, and the delay time is made constant independently of the frequency (operation frequency) of the clock signal. This delay circuit 22b is merely required to have a fixed, constant delay time. A delay circuit of any construction could be used for delay circuit 22b, and this fixed delay time may be set by mask interconnection or may be trimmed by fusible link elements.

Phase synchronizing circuit 22a is constituted of PLL or DLL, and establishes a phase synchronization (phase locking) between internal clock signal CLKi and a feedback signal to generate output trigger clock signal TRGCK. In FIG. 3, internal clock signal CLKi is applied to phase synchronizing circuit 22a, however, a clock signal, obtained by buffering external clock signal CLKe, may be applied to phase synchronizing circuit 22a. By utilizing this delay circuit 22b, the activation (driving to H level) timing of output trigger clock signal TRGCK can be set in accordance with the signal propagation delay time of data output circuit OKT. Consequently, the definite timing of read data RD on internal data bus 10 can be delayed so that it is possible to sufficiently secure the internal data transfer time.

The delay time of delay circuit 22b may be set in accordance with a mode set command, or may be changed by mask interconnection or the like. It is merely required to set the delay time to a fixed delay time that is not dependent on the frequency of the clock signal.

Figure 4:
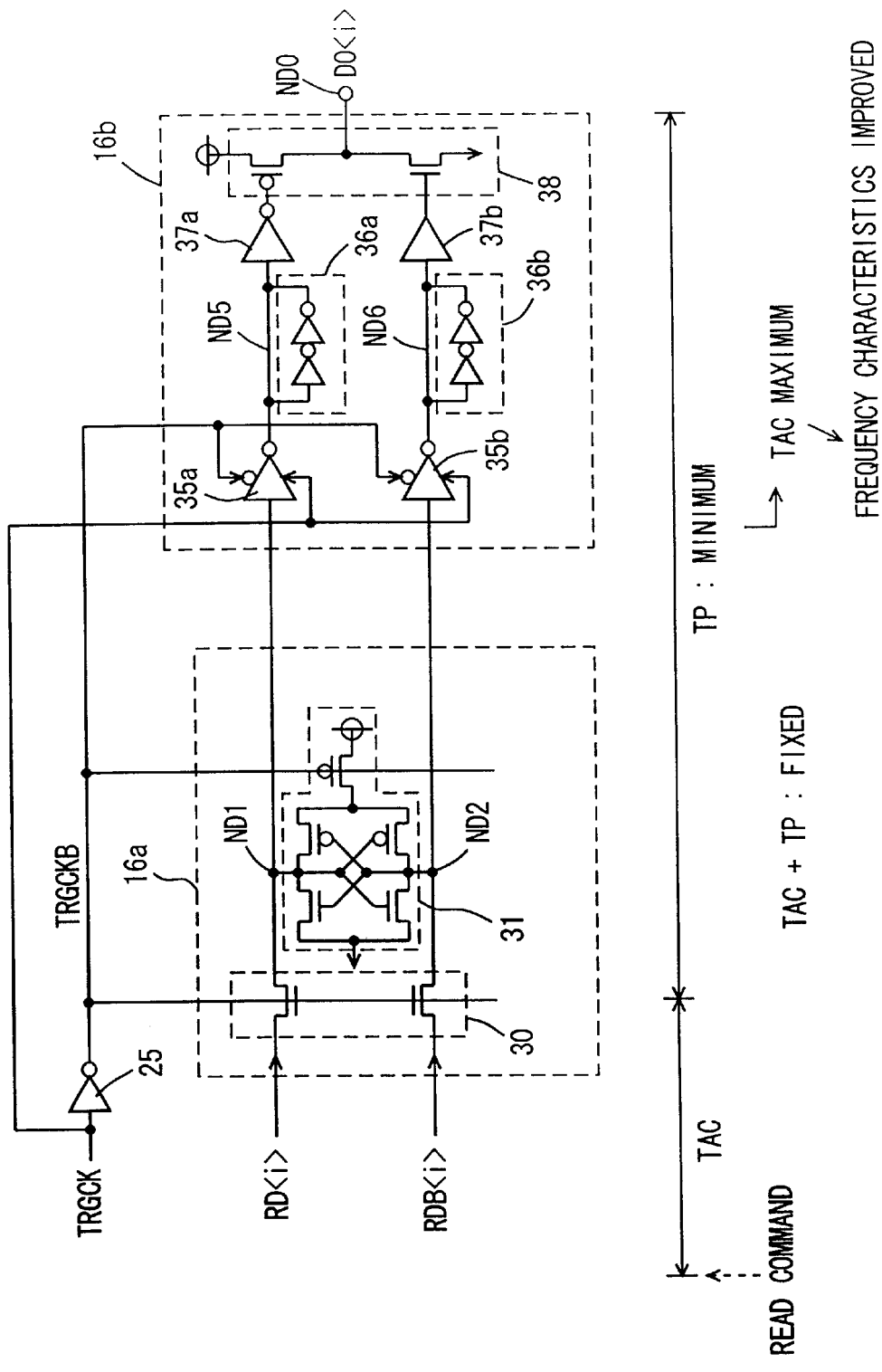
FIG. 4 is a diagram showing an example of a specific construction of a data detector and an output buffer shown in FIG. 1.

FIG. 4 is a diagram showing an example of the construction of data detector 16a and output buffer 16b shown in FIG. 1. FIG. 4 shows a construction in which complementary data bits RD<i> and ZRD<i> are transmitted to internal reading data bus 10.

In FIG. 4, data detector 16a includes an confining gate 30 that is selectively set to the non-conductive state in accordance with a complementary output trigger clock signal TRGCKB from inverter 25 to isolate internal nodes ND1 and ND2 from the internal read data bus, and a differential amplifier circuit 31 that is activated when complementary output trigger clock signal TRGCKB goes low, to differentially amplify the potentials of internal nodes ND1 and ND2. Prior to data transfer, the internal read data transmission lines of the internal read data bus are precharged and equalized to a ground voltage level by a bus precharging circuit not shown. This differential amplifier circuit 31 includes: cross-coupled P-channel MOS transistors (insulated gate type field effect transistors), cross-coupled N-channel MOS transistors, and a detector activating P-channel MOS transistor for connecting the cross-coupled P-channel MOS transistors to a power supply node in accordance with output trigger clock signal TRGCKB.

Output buffer 16b includes: tri-state inverter buffers 35a and 35b that are activated in response to complementary output trigger clock signals TRGCK and TRGCKB, and buffer the potentials of internal nodes ND1 and ND2 when activated for transmission to internal nodes ND5 and ND6, respectively; inverter latches 36a and 36b constituting a half latch for latching the signals on internal nodes ND5 and ND6; an inverter 37a for inverting a potential of node ND5; a buffer circuit 37b for buffering the signal on node ND6 for transmission; and an output driver 38 for driving an output node NDO in accordance with the output signals of inverter circuit 37a and buffer circuit 37b.

Each of inverter latches 36a and 36b includes, as an example, cascaded inverters of two stages. Inverter latches 36a and 36b latch the signals on internal nodes ND5 and ND6 with weak latch power, respectively.

Output driver 38 includes a P-channel MOS transistor for driving output node NDO to the High level in accordance with the output signal of inverter circuit 37a, and an N-channel MOS transistor for driving output node NDO to the ground voltage level in accordance with the output signal of buffer circuit 37b. Output data DO<i> is outputted from this output node NDO (i=0–(n−1)).

In the data output circuit shown in FIG. 4, complementary internal read data bits RDB<i> and RDB<i> are transmitted. When output trigger clock signal TRGCK goes high, complementary output trigger clock signal TRGCKB goes low, and confining gate 30 is set in the non-conductive state, to isolate internal nodes ND1 and ND2 from the internal data bus. In this state, differential amplifier circuit 31 is activated so that the signal potentials of internal nodes ND1 and ND2 are differentially amplified and driven to the CMOS level. Signals on nodes ND5 and ND6 are latched by inverter latches 36a and 36b, respectively. Therefore, in data detector 16a, when output trigger clock signal TRGCK goes low and the differential amplification operation is completed, confining gate 30 is allowed to be conductive again, to couple internal nodes ND1 and ND2 to the internal data bus.

In output buffer 16b, when the detecting operation is completed and differential amplifier circuit 31 is activated, tri-state inverter buffers 35a and 35b are set in the high impedance state so that differential amplifier circuit 31 latches the amplified data. Thus, data bit DO<i> of output node NDO is latched until new data is applied subsequently.

The amplifying operation of differential amplifier circuit 31 and the data taking-in operation of output buffer 16b are carried out in accordance with the same output trigger clock signal. Therefore, a period of time TP in which the signal is latched, the amplifying operation is carried out and the data is transmitted to the output node NDO in data detector 16a is set by taking into account only the signal propagation delay time in the data output circuit. Thus, since it is not necessary to take into account timing margins for the data detect operation and the data taking-in operation in output buffer 16b, the period of time consumed in the output buffer 16b is minimized.

After a lapse of time TA since the read command is applied, a data detecting operation is carried out in data detector 16a. In the case when the frequency of internal clock signal CLKi, that is, the frequency of external clock signal CLKe, is determined, the period of time TA+TP=TAC from the time at which the read command is applied to the time at which the valid data is outputted is set based upon specification values. Therefore, in the case where the time TP required for the signal transmission in the data output circuit is minimized, it is possible to maximize the time TA during which upon application of the read command, the memory cell data is read and transferred to the data detector. Consequently, even when the frequency of the clock signal becomes higher, time TA required for the internal data reading operation can be made longer, thereby making it possible to carry out a data reading operation stably in synchronization with the high speed clock signal.

Moreover, in FIG. 4, output buffer 16b and data detector 16a are in have their operations controlled based upon the same output trigger clock signal TRGCK. Therefore, the timing adjusting can be easily carried out by taking only the signal propagation delay in the closed area inside the data output circuit into consideration. The timing adjusting may be carried out such that the activation and inactivation of output buffer 16b are performed by taking the signal propagation delay in data detector 16a into consideration.

In the arrangement of data detector 16a shown in FIG. 4, internal nodes ND1 and ND2 are precharged to the Low level during the standby state. However, in accordance with the precharged potential of internal data bus 10, the precharge voltage level of the internal nodes of data detector 16a may be appropriately set, and the arrangement of differential amplifier circuit 31 may also be appropriately determined in accordance with the precharged voltage level. For example, in the case where the internal data bus is precharged to a power supply voltage level Vcc, in differential amplifier circuit 31, a detector activating transistor constituted of N-channel MOS transistor is placed for cross-coupled N-channel MOS transistors, and the cross-coupled P-channel MOS transistors are coupled to the power supply node without the activating P-channel MOS transistor.

As described above, in accordance with the first embodiment of the present invention, the data output circuit has the operation controlled in accordance with an output trigger clock signal that has a fixed delay and has a phase adjusted with respect to an external clock signal. Therefore, the data taking-in, amplifying and transferring operations are always carried out on internal read data at an optimal timing independent of the frequency of the external (internal) clock signal. Thus, it becomes possible to optimize the timing margin with respect to the data reading operation, and consequently to execute the data reading at high speed.

Moreover, in the data output circuit, the operations of the data detector and output buffer are controlled based upon the same output trigger clock signal. Therefore, it is not necessary to take any timing margin for signal transmission in these circuits into consideration so that it is possible to transfer the data in the shortest time. Consequently, it is possible to maximize the internal read data propagation time, to provide a sufficiently long time required for the memory cell data to be internally transmitted even in clock cycles of a high speed, and consequently to improve the frequency characteristics in reading data.

Second Embodiment

Figure 5:
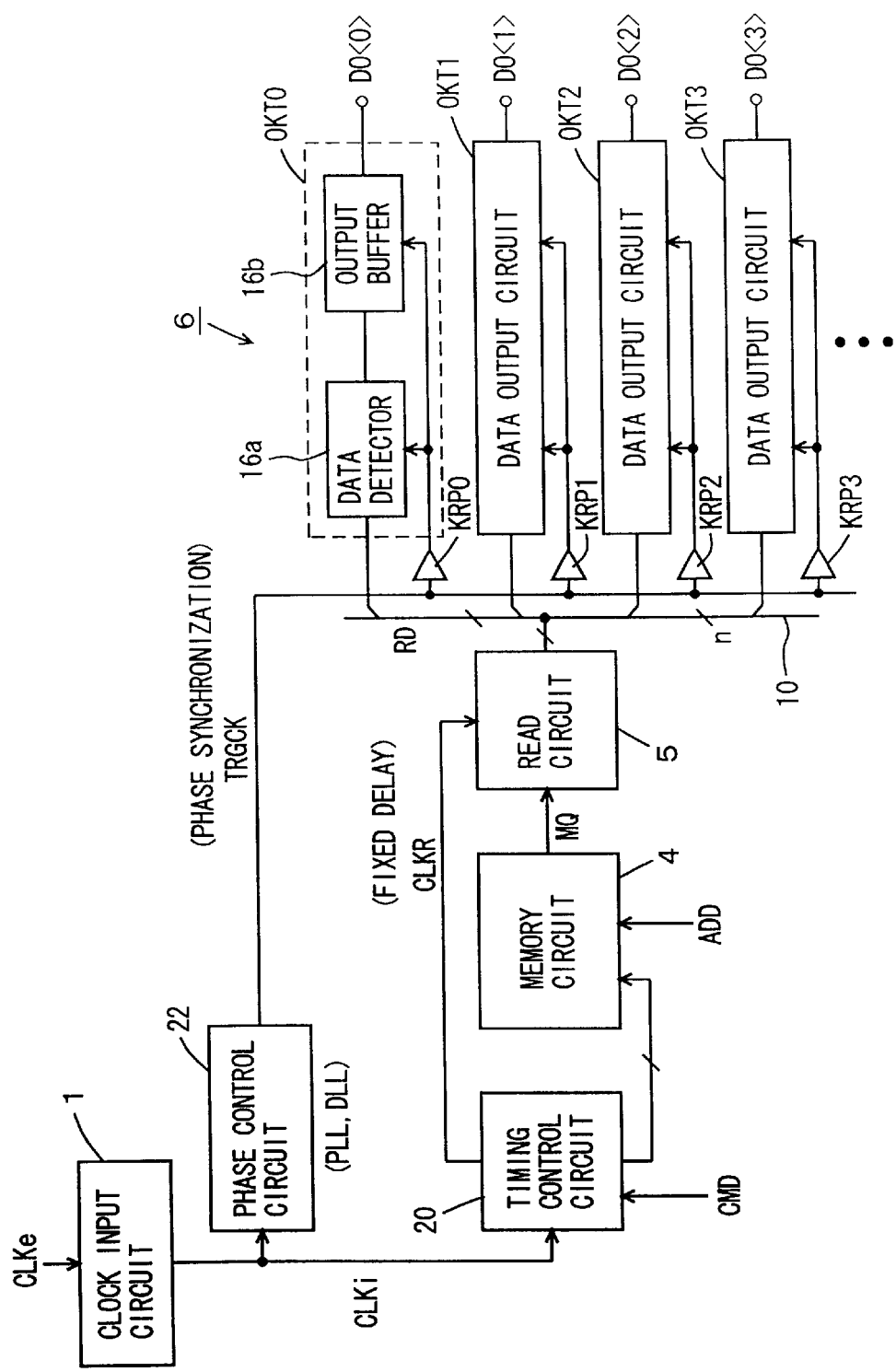
FIG. 5 is a schematic diagram showing the entire construction of a semiconductor memory device in accordance with a second embodiment of the present invention.

FIG. 5 is a schematic diagram showing the construction of a data output section in a synchronous type semiconductor memory device in accordance with the second embodiment of the present invention. In the construction shown in FIG. 5, clock repeaters KRP0 to KRP3 . . . for receiving output trigger clock signal TRGCK respectively from a phase control circuit 22 are provided in data output circuits OKT0 to OKT3 . . . , respectively. Each of the clock repeaters KRP0 to KRP3 . . . buffers (wave-form shapes) applied output trigger clock signal TRGCK, for transmission to the corresponding one of data output circuits OKT0 to OKT3 . . . The other arrangements are the same as those of FIG. 1, and the corresponding parts are indicated by the same reference numerals, and the description thereof is omitted.

As shown in FIG. 5, since clock repeaters KRP0 to KRP3 . . . are provided in correspondence to respective data output circuits OKT0 to OKT3 . . . and therefore phase control circuit 22 needs not to transmit output trigger clock signal TRGCK to respective data output circuits OKT0 to OKT3 . . . Thus, the output driving load of phase control circuit 22 is reduced, making it possible to transmit output trigger clock signal TRGCK at high speed. Moreover, clock repeaters KRP0 to KRP3 . . . transmit output trigger clock signals to corresponding data output circuits OKT0 to OKT3 . . . in accordance with output trigger signal TRGCK applied thereto. Thus, output trigger clock signals each sharply rising and falling at high speed can be transmitted to the corresponding data output circuits OKT0 to OKT3 . . . so that it is possible to operate data output circuits OKT0 to OKT3 . . . accurately at high speed.

In particular, for example, in an embedded memory that is integrated on the same semiconductor substrate with logic circuitry, the number of data output bits is as great as, for example, 128 bits. Moreover, in a normal synchronous type semiconductor memory, the width of the data output bits is as great as, for example, 32 bits. Therefore, in the case when such output data with a wide bid width is driven, even if the number of data output circuits OKT becomes greater, clock repeaters KRP are placed corresponding to the respective data output circuits so that output trigger clock signal TRGCK from phase control circuit 22 is transmitted to each of data output circuits OKT0 to OKT3 . . . at high speed.

In the arrangement shown in FIG. 5, clock repeaters KRP (KRP0 to KRP3 . . . ) are placed corresponding to the respective data output circuits. However, clock repeaters KRP may be placed for each predetermined number of output data circuits. In this arrangement, the clock repeaters may be connected in series with each other.

Additionally, with respect to the construction of each of clock repeaters KRP0 to KRP3 . . . , any construction may be used as long as it has function of shaping the waveform of a supplied signal and outputting the resultant signal, and therefore, buffer circuits, drive circuits or the like may be used as the clock repeaters.

As described above, in accordance with the second embodiment of the present invention, clock repeaters each buffering (waveform shaping) an output trigger clock signal are placed corresponding to data output circuits, so that it is possible to reduce the output load of the phase control circuit for generating the output trigger clock signal, to transmit the output trigger clock signal to the data output circuits at high speed, and consequently to carry out the taking-in, transferring and outputting of data at an accurate timing.

Third Embodiment

Figure 6:
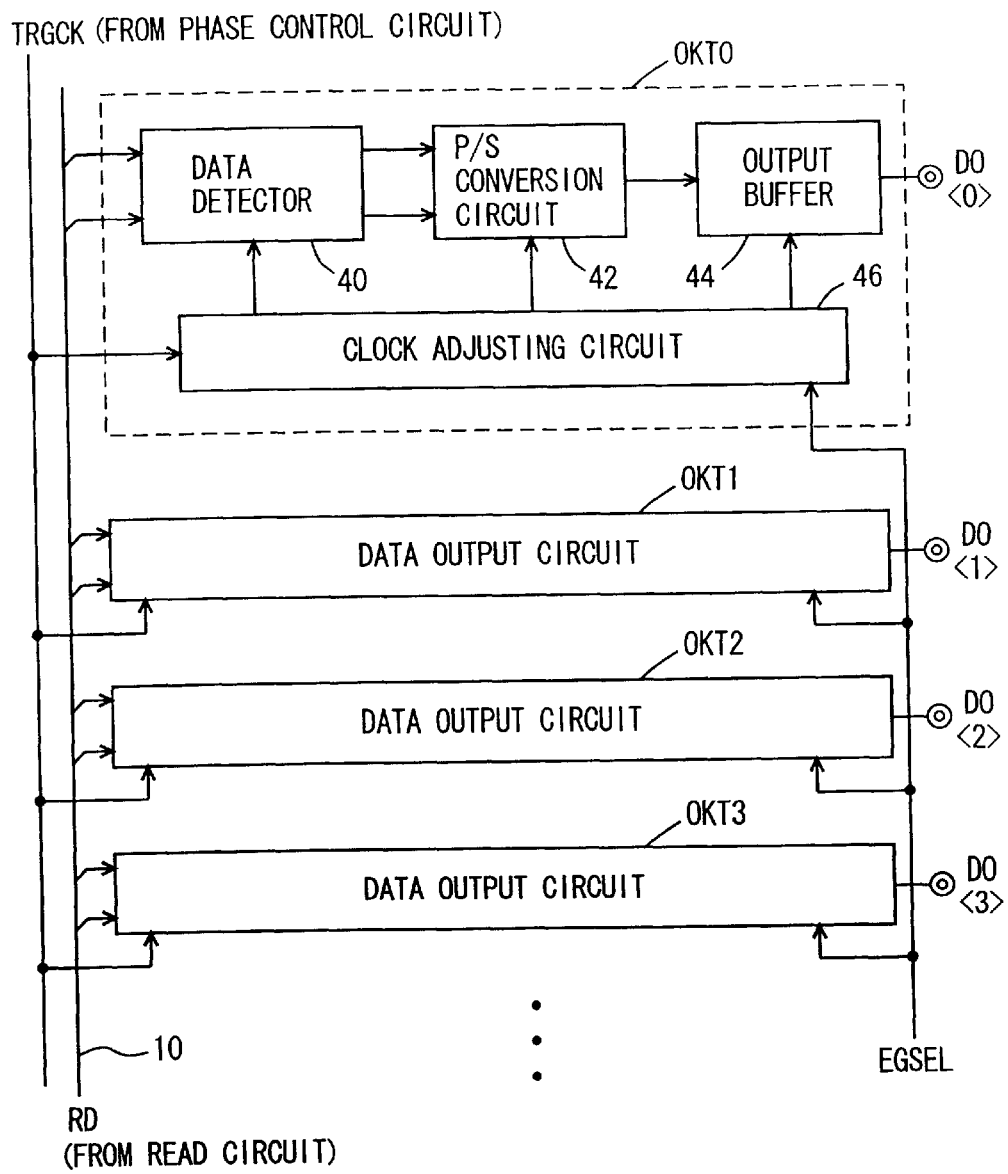
FIG. 6 is a schematic diagram showing a data output section of a semiconductor memory device in accordance with a third embodiment of the present invention.

FIG. 6 is a schematic diagram showing the construction of a data output section in a synchronous type semiconductor memory device in accordance with the third embodiment of the present invention. In FIG. 6, data output circuits OKT0 to OKT3, . . . are connected in parallel with each other to internal data bus 10. These data output circuits OKT0 to OKT3 . . . take in 2-bit data in accordance with output trigger clock signal TRGCK from phase control circuit 22 at the same time, and convert the data to serial data internally, and transfer the resultant serial data to the corresponding data output nodes. In other words, each of these data output circuits OKT0 to OKT3, . . . outputs data externally in synchronization with both of the rising edge and falling edge of output trigger clock signal TRGCK, and transfers data at a double data rate.

Each of data output circuits OKT0 to OKT3 . . . has the same construction, and FIG. 6 representatively shows the specific internal construction of data output circuit OKT0.

Data output circuit OKT0 includes a data detector 40 for taking in and amplifying 2-bit data on corresponding bus lines of internal data bus 10, a serial/parallel (P/S) conversion circuit 42 for converting the 2-bit data amplified by data detector 40 to serial data for outputting, an output buffer 44 for outputting the serial data bit from P/S conversion circuit 42 to a corresponding data output node, and a clock adjusting circuit 46 for generating control signals for controlling the operation timing of each of data detector 40, P/S conversion circuit 42 and output buffer 44, in accordance with output trigger clock signal TRGCK.

Moreover, an edge selection signal EGSEL is applied to clock adjusting circuit 46, for specifying whether the trigger edge of data taking in is the rising edge or the falling edge of output trigger clock signal TRGCK.

In the construction shown in FIG. 6, clock adjusting circuit 46 adjusts the operation timing of each of data detector 40, P/S conversion circuit 42 and output buffer 44 in accordance with output trigger clock signal TRGCK. Therefore, since the timing adjusting operation is carried out inside a single data output circuit OKT, each individual data output circuit can easily adjust the operation timing of each of these data detector 40, P/S conversion circuit 42 and output buffer 44. By utilizing this clock adjusting circuit 46, the timing at which data from data detector 40 arrives at output buffer 44 is easily adjusted while taking the signal propagation delay in P/S conversion circuit 42 into consideration. Thus, it becomes possible to set the signal propagation delay time in data output circuit OKT to a minimum time.

Moreover, since this timing adjustment is executed inside the individual data output circuit in which the signal propagation path is closed, the propagation delay is predictable so that it is possible to carry out an accurate timing adjustment.

Figure 7:
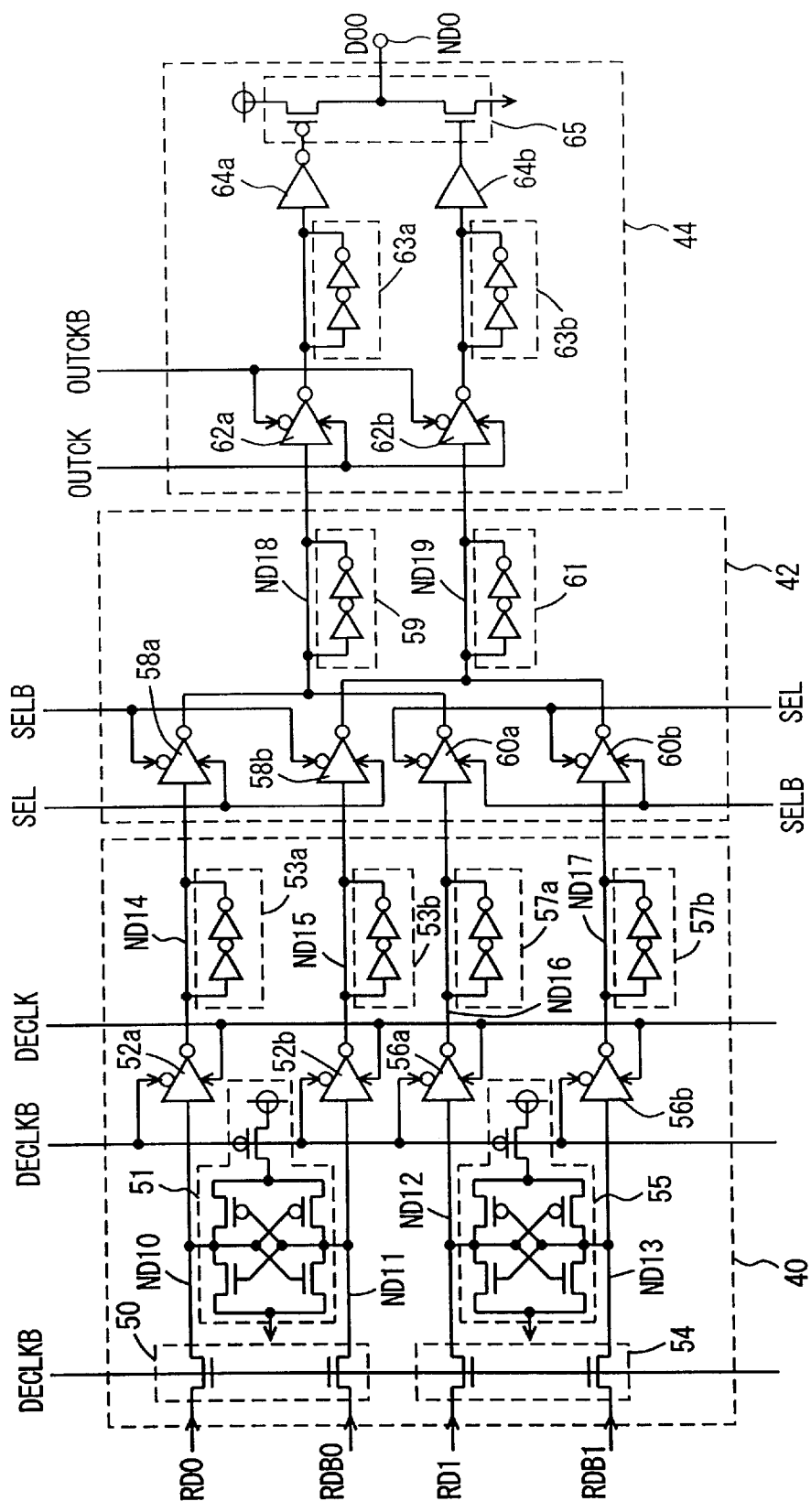
FIG. 7 is a diagram showing an example of a specific construction of the data output circuit shown in FIG. 6.

FIG. 7 is a diagram shows an example of a specific construction of the data output circuit shown in FIG. 6. In FIG. 7, data detector 40 includes: a confining gate 50 that is made conductive when detector activation clock signal DECLKB goes high, to pass the signals on internal data bus lines RD0 and RDB0, a differential amplifier circuit 51 that is activated upon activation of detector activation clock signal DECLKB and amplifies data transmitted to nodes ND10 and ND11 from confining gate 50, tri-state inverters 52a and 52b that are activated upon activation of complementary detector activation clock signals DECLKB and DECLK and invert respective signal potentials of node ND10 and node ND11 and transmit the resultant signals to node ND14 and node ND15, and inverter latches 53a and 53b for latching the signals of nodes ND14 and ND15, respectively. Data of 1-bit on internal data bus 10 is taken in and amplified (subjected to data detecting operation) by these circuit portions. Inverter latches 53a and 53b, each having a half-latch construction including cascaded inverters of two stages, latch signals of node ND14 and ND15.

The data output circuit further includes: a confining gate 54 that is selectively made conductive in accordance with detector activation clock signal DECLKB and transmits signals of internal data lines RD1 and RDB1 to nodes ND12 and ND13 when made active, a differential amplifier circuit 55 that is activated upon activation of complementary detector activation clock signals DECLKB and DECLK and differentially amplifies the potentials of nodes ND12 and ND13 when made active, tri-state inverter buffers 56a and 56b that are activated upon activation of complementary detector activation clock signals DECLKB and DECLK and invert the potentials of nodes ND12 and ND13 for transmission to nodes ND16 and ND17, respectively, and inverter latches 57a and 57b that latch the potentials of nodes ND16 and ND17, respectively. Inverter latches 57a and 57b, each including inverters cascaded in two stages, has a half-latch construction for latching signals of nodes ND16 and ND17.

In the construction of a data detector 40 shown in FIG. 7, 2-bit internal read data appearing on internal read data lines RD0 and RDB0 as well as on internal read data lines RD1 and RDB1 are taken in and amplified in parallel with each other in accordance with detector activation clock signals DECLKB and DECLK. These detector activation clock signals DECLKB and DECLK are signals that are adjusted in phase in accordance with internal clock signal CLKi, and further adjusted in activation timing by a clock adjusting circuit 46.

P/S conversion circuit 42 includes: tri-state inverter buffers 58a and 58b that are activated upon activation of complementary clock selection signals SEL and SELB and invert signals of nodes ND14 and ND15 to transmit the resultant signals to nodes ND18 and ND19 when made active, tri-state inverter buffers 60a and 60b that are selectively activated in accordance with complementary clock selection signals SEL and SELB and invert signals of nodes ND16 and ND17 to transmit the resultant signals to nodes ND18 and ND19 when made active, and inverter latches 59 and 61 that latch signals of nodes ND18 and ND19, respectively. Tri-state inverter buffers 58a and 58b are activated complementarily to tri-state inverter buffers 60a and 60b. Thus, 2-bit data detected in parallel by data detector 40 are converted to 1-bit serial data, and successively outputted from this P/S conversion circuit 42.

Clock selection signals SEL and SELB have the order of their generation determined in accordance with, for example, the least significant bit of a column address signal. These clock selection signals SEL and SELB are also generated based upon a clock signal having its phase adjusted with respect to internal clock signal CLKi (external clock signal CLKe), and further adjusted in timing by clock adjusting circuit 46. These clock selection signals SEL and SELB are generated by selecting triggering clock edges in accordance with an internal clock signal whose phase is adjusted by edge selection signal EGSEL shown in FIG. 6 in reading data.

By using this edge selection signal EGSEL, latency is adjusted in a unit of half a cycle of the external clock signal. In transferring data at a single data rate, it is determined whether the data is transferred in synchronization with the rising edge or the falling edge of the clock signal in accordance with this edge selection signal. In transferring data at a double data rate, it is determined whether the timing of the start of the data transfer is synchronized to the rise or the fall of clock signal CLK. Now, referring to a timing chart shown in FIG. 8, an explanation will be made of the operation of the data output circuit shown in FIG. 7.

In reading data, reading trigger clock signal CLKR is generated with a predetermined delay time with respect to internal clock signal CLKi in accordance with the frequency of the clock signal and the reading circuit is operated, in accordance with this reading trigger clock signal CLKR, to transmit read data RD of a plurality of bits onto the internal data bus. Since the internal data bus is precharged to the ground voltage level every data reading cycle, the potential of the internal data lines can rise from the ground voltage level in response to data from the selected memory cell.

Next, output trigger clock signal TRGCK having a fixed delay and a phase adjusted with respect to internal clock signal CLKi is generated, and in accordance with this output trigger clock signal TRGCK, detector activation clock signal DECLK (and DECLKB) is generated. During a period in which detector activation clock signal DECLK is set in the Low level, complementary detector activation clock signal DECLKB is set at HIGH level, and confining gates 50 and 54, shown in FIG. 7 are rendered conductive, and internal nodes ND10 to ND13 in data detector 40 change in accordance with the read data. The internal read data is complementary signals so that the electric of nodes ND10 and ND11 change complementarily to each other and the potentials of nodes ND12 and ND13 change complementarily to each other.

When data detector activation clock signal DECLK goes high, complementary data detector activation clock signal DECLKB goes low, and confining gates 50 and 54 enter the non-conductive state, and differential amplifier circuits 51 and 55 are activated to drive the voltage levels of nodes ND10 to ND13 to the CMOS level. Tri-state inverter buffers 52a, 52b, 56a and 56b are activated in parallel with the amplifying operations of differential amplifier circuits 51 and 55, and the signals on nodes ND10 to ND13 are inverted and transmitted to internal nodes ND14 and ND17, respectively.

When detector activation clock signal DECLK falls to the Low level, the data detecting operation (the operation of the differential amplifier circuit is activated) is completed in data detector 40, confining gates 50 and 54 are rendered conductive. Thus, nodes ND10 and ND13 are coupled to the respective internal read data lines to be precharged to the ground voltage level by a precharge circuit (not shown) provided for the internal data bus.

In this state, since tri-state inverter buffers 52a, 52b, 56a and 56b are set in the output high impedance state, the amplified data are latched on nodes ND14 to ND17 in data detector 40.

In P/S conversion circuit 42, tri-state inverter buffers 58a, 58b, 60a and 60b are selectively rendered conductive in accordance with clock selection signals SEL and SELB, in parallel with the data detecting operation of data detector 40, so that signals of nodes ND14 and ND15 or nodes ND16 and ND17 are inverted and transmitted to nodes ND18 and ND19. One of clock selection signals SEL and SELB is set to the High level and are driven to the selected state prior to the data detecting operation.

Tri-state inverter buffers 58a and 58b or 60a and 60b are set to the operative state prior to the data detecting operation so that the data of this P/S conversion circuit 42 is changed with the output signal of data detector 40 being a trigger. Thus, data can be transmitted to the output buffer circuit only within the signal propagation delay time of data detector 40, and P/S conversion circuit 42 can be operated at a faster timing. Consequently, it is possible to parallel-to-serial convert the output data of the data detector 40 with a sufficient margin, and also to allow P/S conversion circuit 42 to take in data detected by data detector 40 at high speed. Moreover, it becomes possible to further shorten the signal propagation time of the data output circuit.

Output buffer 44 drives output node NDO in response to the data latched by P/S conversion circuit 42 in accordance with output clock signals OUTCK and OUTCKB. Therefore, in this case also, output clock signals OUTCK and OUTCKB are changed with the signal propagation delay in data detector 40 and the signal propagation delay in P/S conversion circuit 42 taken into consideration so that data DQ is transmitted at high speed with a minimum delay time. Moreover, output trigger signal TRGCK is a signal having a fixed delay set while taking into consideration the signal propagation time of the data output circuit so that data can be externally outputted in synchronization with the edge of the external clock signal.

As will be explained later in detail, output clock signals OUTCK and OUTCKB are generated (driven to the High and Low levels, respectively) with predetermined delay times with respect to output trigger clock signal TRGCK and complementary output trigger clock signal TRGCKB, respectively. By utilizing these complementary output trigger clock signals, data DO can be outputted in synchronization with the clock edge every half cycle of external clock signal CLKe.

In clock adjusting circuit 46, the activation timing of detector activation clock signal DECLK with respect to output trigger clock signal TRGCK, the timing relationship between detector activation clock signal DECLK and clock selection signal SEL and the phase of output clock signal OUTCK with respect to output trigger clock signal TRGCK (time adjustment) are properly adjusted so that it becomes possible to carry out a data transfer at high speed due to no necessity of providing a great timing margin.

In particular, with respect to the delay adjustment of output clock signal OUTCK, the individual data output circuit is constituted of elements placed in a limited area, such as detector 40, P/S conversion circuit 42 and output buffer 44, and its signal propagation path is also closed in each individual data output circuit. Therefore, it is possible to easily measure the propagation delay inside these circuits. In accordance with the signal propagation delay inside the data output circuit, the delay time of output clock signal OUTCK relative to output trigger clock signals TRGCK and TRGCKB is adjusted by using gate delays. Moreover, clock selection signal SEL is activated at a timing earlier than the activation (High level) of detector activation clock signal DECLK so that data taken-in in P/S conversion circuit 42 is generated with the output data of data detector 40 being a trigger. Thus, it becomes possible to easily adjust the relationship of these data transferring timings. Moreover, it is also possible to shorten the data transfer time from data detector 40 to P/S conversion circuit.

Figure 9:
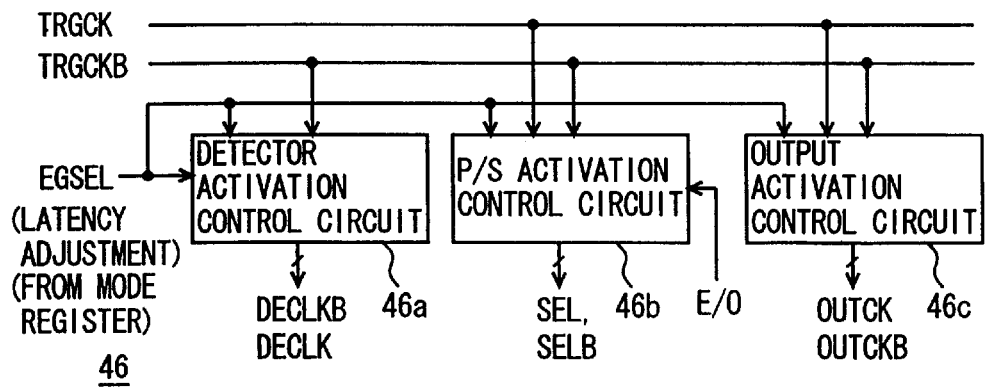
FIG. 9 is a schematic diagram showing the construction of a clock adjusting circuit shown in FIG. 6.

FIG. 9 is a schematic diagram showing the construction of clock adjusting circuit 46 shown in FIG. 6. In FIG. 9, clock adjusting circuit 46 includes: a detector activation control circuit 46a for generating detector activation clock signals DECLK and DECLKB, a P/S activation control circuit 46b for generating clock selection signals SEL and SELB in accordance with complementary output trigger clock signals TRGCK and TRGCKB and an even/odd clock selection signal E/O, and an output activation control circuit 46c for generating output clock signals OUTCK and OUTCKB in accordance with complementary output clock signals TRGCK and TRGCKB.

An edge selection signal ESEL is also applied to each of these activation control circuits 46a to 46c so as to adjust the latency. Even/odd clock selection signal E/O for determining the generation sequence of clock selection signals SEL and SELB is applied to P/S activation control circuit 46b. This even/odd clock selection signal E/O is generated by, for example, the least significant bit of the column address signal.

In accordance with edge selection signal EGSEL, it is determined whether the trigger timing of the data output is the rising edge or the falling edge of output trigger clock signal TRGCK. In accordance with this edge selection signal EGSEL, the latency adjustment is carried out in a unit of half a clock cycle of external clock signal CLKe. In accordance with edge selection signal EGSEL, it is determined whether output trigger clock signal TRGCK is generated based upon the rising edge or the falling edge of external clock signal CLKe as a reference.

In accordance with even/odd clock selection signal E/O, it is determined which should be selected earlier between bits of 2-bit data in data detector 40. In this case, complementary output trigger signals TRGCK and TRGCKB that have fixed delays relative to complementary inside clock signals CLKi and CLKiB respectively may be generated as output trigger signals, and these trigger signals may be selected in accordance with the edge selection signals.

Figure 10:
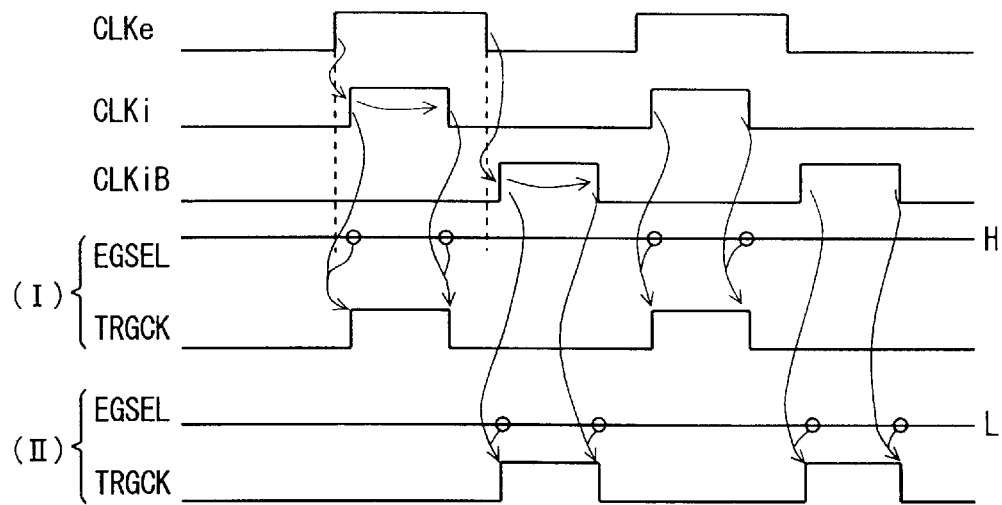
FIG. 10 is a timing chart schematically representing the correlation between an edge selection signal and a selection output trigger clock signal of the clock adjusting circuit shown in FIG. 9.

FIG. 10 shows a waveform diagram illustrating the relationship between edge selection signal EGSEL and output trigger clock signal TRGCK. In FIG. 10, internal clock signal CLKi is generated in synchronization with the rise of external clock signal CLKe, and internal clock signal CLKiB is generated in synchronization with the fall of external clock signal CLKi. In the case when edge selection signal EGSEL is set in the High level, for example, as shown in FIG. 10(I), internal clock signal CLKi is selected as output trigger clock signal TRGCK. In contrast, in the case when edge selection signal EGSEL is set in the Low level, for example, as shown in FIG. 10(II) complementary internal clock signal CLKiB is selected as output trigger clock signal TRGCK. Therefore, output trigger signal TRGCK can be changed in synchronization with either of the rising edge and falling edge of external clock signal CLKe so that the column latency required in reading data is adjusted in a unit of 0.5 cycle of external clock signal CLKe.

Figure 11:
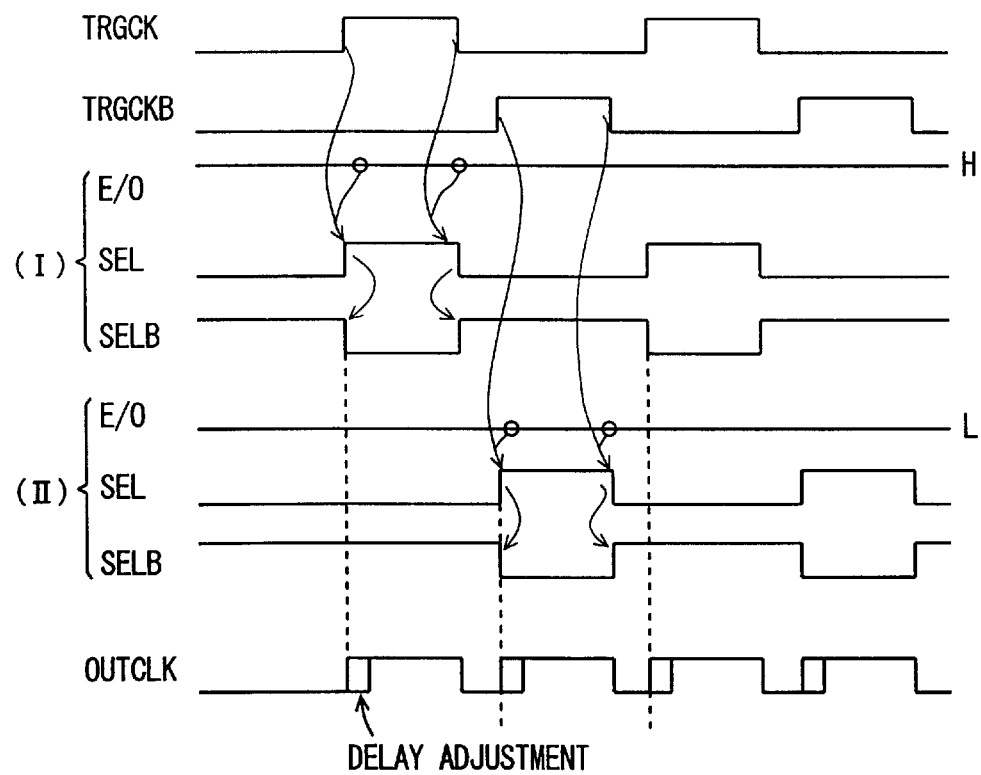
FIG. 11 is a timing chart representing the operation of the circuit shown in FIG. 9.

FIG. 11 is a diagram showing the correspondence relationship between even/odd clock selection signal E/O and clock selection signal SEL. As shown in FIG. 11(I), in the case when even/odd clock selection signal E/O is set in the High level, for example, clock selection signal SEL is generated in accordance with output trigger clock signal TRGCK. In contrast, in the case when even/odd clock selection signal E/O is set in the Low level, as shown in FIG. 11(II), clock selection signal SEL is generated in accordance with complementary output trigger clock signal TRGCKB.

Output clock signal OUTCK is generated as a synthesized clock signal of output trigger clock signals TRGCK and TRGCKB by output activation control circuit 46c, and has its delay time adjusted relative to the rising edge of these output trigger clock signals TRGCK and TRGCKB to be generated. Moreover, complementary output trigger clock signal TRGCKB is generated with its phase adjusted with respect to complementary internal clock signal CLKiB (with a fixed delay).

This even/odd clock selection signal E/O, which is generated, for example, based upon the least significant bit of the column address, determines which should be selected earlier, the odd data bus line or the even data bus line of the internal data bus. Even when data detector 40 is operated in accordance with output trigger clock signal TRGCK, and when bits of 2-bit data are alternately selected in accordance with clock selection signal SEL in P/S conversion circuit 42, output buffer 44 can output data in synchronization with the rising edge and the falling edge of external clock signal CLKe, in accordance with this output clock signal OUTCK having its delay adjusted.

In FIGS. 10 and 11, the correspondence relationship between the H/L level of edge selection signal EGSEL and generated output trigger clock signal TRGCK and the correspondence relationship between the H/L level of even/odd clock selection signal E/O and generated clock selection signal SEL are shown. However, these are only shown by way of example, and with respect to these edge selection signal EGSEL and even/odd clock selection signal E/O and selected output trigger clock signal TRGCK and clock selection signal SEL, and the correspondence relationship may be reversed.

As shown in FIG. 9, in clock adjusting circuit 46, based upon the same output trigger clock signal TRGCK and TRGCKB, detector activation clock signal DECLK for the data detector, clock selection signal SEL for P/S conversion circuit SEL and output clock signal OUTCK for the output buffer are generated with their timings determined based upon the same clock signal. Thus, it is possible to carry out the timing adjustment easily. Moreover, in the case when the data detector is in the latch state, the clock selection signal SEL is activated for P/S conversion circuit to start the selecting operation is started. Thus, since the latch data of P/S conversion circuit is changed with the detected data of the data detector being a trigger, it is possible to minimize the signal propagation delay from the data detector to P/S conversion circuit, and therefore, to minimize the data propagation delay time from the data detector to the output buffer. Accordingly, it is possible to minimize the signal propagation delay time in the data output circuit, and also to improve the frequency characteristics (to shorten the fixed delay).

Moreover, with respect to the activation of output clock signal OUTCK, it is only necessary to take the signal propagation delay within the data output circuit into consideration, and the propagation delay is determined in each of the data output circuits. Thus, since this delay time is predictable, it is possible to accurately adjust the delay time of output clock signal OUTCK.

Fourth Embodiment

Figure 12:
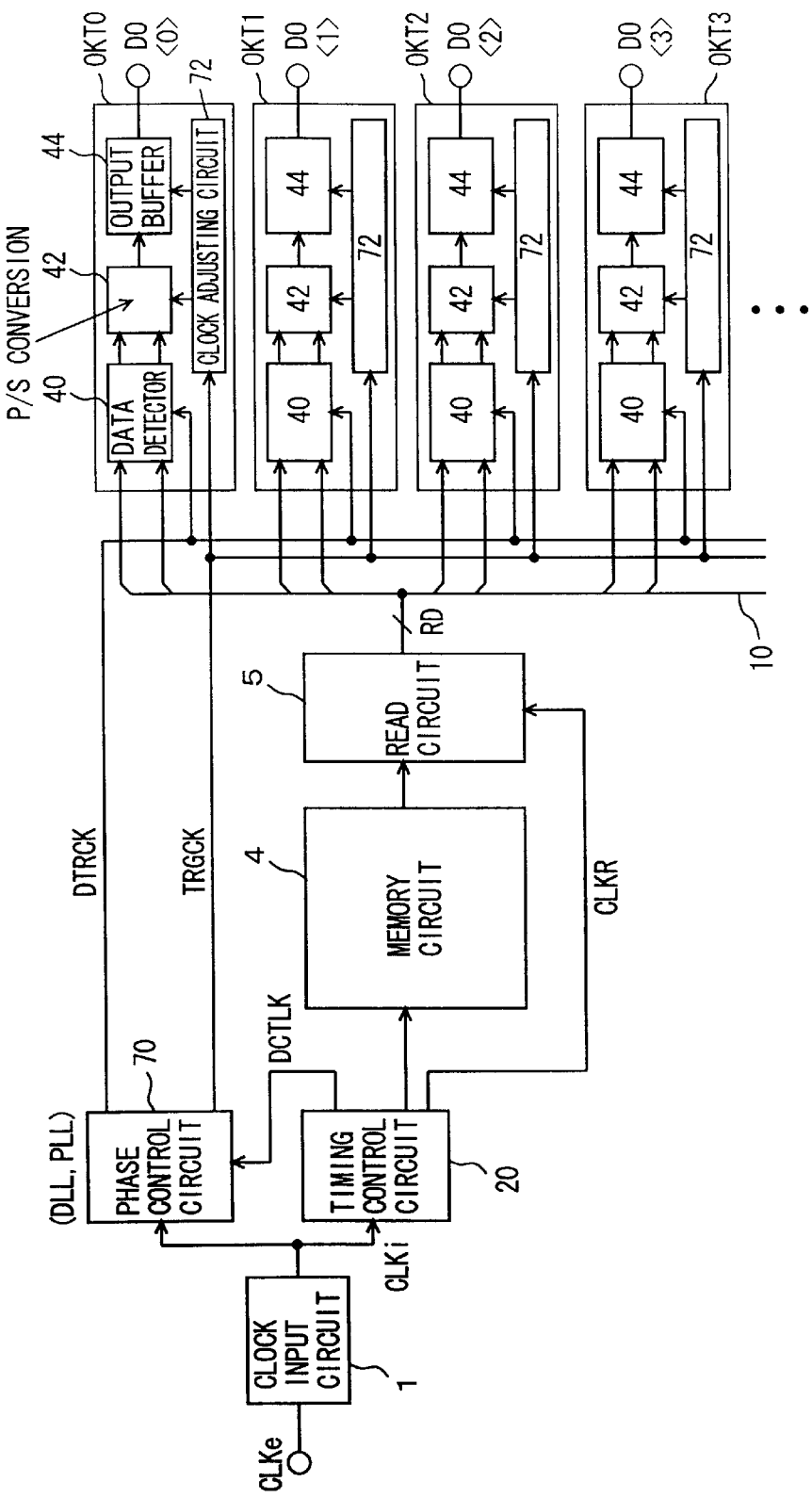
FIG. 12 is a schematic diagram showing the construction of a main part of a semiconductor memory device in accordance with a fourth embodiment of the present invention.

FIG. 12 is a schematic diagram showing the construction of a main part of a synchronous type semiconductor memory device in accordance with the fourth embodiment of the present invention. In the construction shown in FIG. 12, in accordance with an internal clock signal CLKi, a timing control circuit 20 generates a read clock signal CLKR and a detect control clock signal DCTLK that have predetermined delay times, respectively. This detect control clock signal DCTLK is a clock signal having a fixed delay time with a phase thereof non-adjusted and follows external clock signal CLKe or internal clock signal CLKi, and its delay time is changed in accordance with the frequency of the clock signal.

A phase control circuit 70 generates a detect trigger clock signal DTRCK and an output trigger clock signal TRGCK in accordance with internal clock signal CLKi from clock input circuit 1 and detect control clock signal DCTLK.

Output trigger clock signal TRGCK is a clock signal having a phase adjusted in response to internal clock signal CLKi, and detect trigger clock signal DTRCK is generated by using, as a trigger, the clock edge of either of detect control signal DCTLK and output trigger clock signal TRGCK that is generated earlier than the other. In other words, when read data RD is transmitted to internal data bus 10 in reading data, a data detecting is preformed at a timing as fast as possible.

In the same manner as the aforementioned third embodiment, each of data output circuits OKT0 to OKT3 includes a data detector 40 for detecting 2-bit data in parallel with each other, a P/S conversion circuit 42 for converting the 2-bit parallel data of data detector 40 to serial data, an output buffer 44 for buffering the output data from P/S conversion circuit 42 and for externally outputting the resultant data. Detect trigger clock signal DTRCK is supplied to data detector 40, and output trigger clock signal TRGCK is supplied to a clock adjusting circuit 72. This clock adjusting circuit 72 adjusts the timing of output trigger clock signal TRGCK so as to set the operation timing of each of P/S conversion circuit 42 and output buffer 44. The setting of operation timings of P/S conversion circuit 42 and output buffer 44 by clock adjusting circuit 72 is done in the same manner as the aforementioned third embodiment. By causing data detector 40 to carry out data detecting as early as possible in accordance with detect trigger clock signal DTRCK, it is possible to minimize the rate at which the data transfer time in each data output circuit OKT (OKT0 to OKT3, . . . ) occupies the entire access time in reading data, and consequently to improve the frequency characteristics in reading data.

Figure 13:
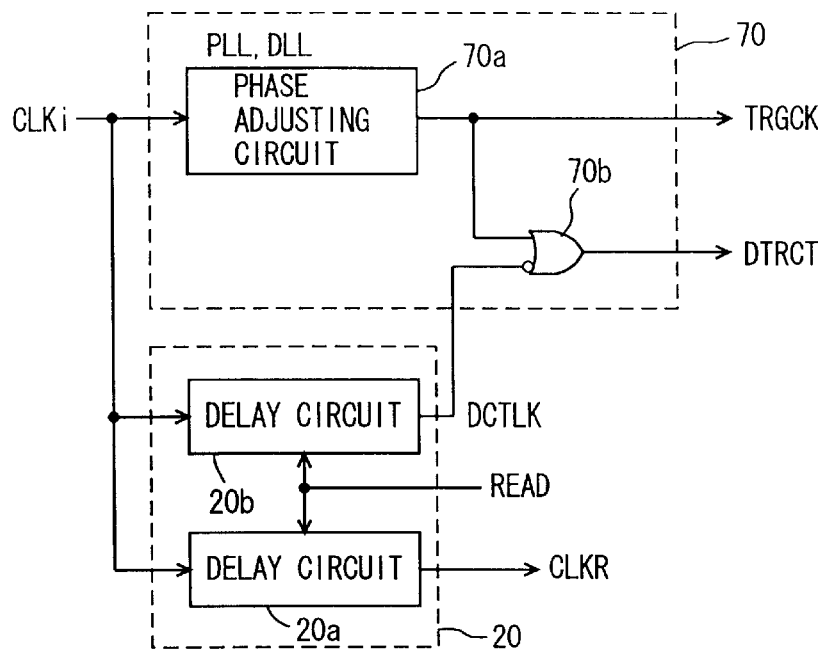
FIG. 13 is a schematic diagram showing the construction of a phase control circuit shown in FIG. 12.

FIG. 13 is a schematic diagram showing the constructions of a phase control circuit 70 and the timing control circuit 20 shown in FIG. 12. In FIG. 13, timing control circuit 20 includes a delay circuit 20a which, upon activation of a read command or a read instruction signal READ (upon activation of read activation signal RP), delays internal clock signal CLKi by a predetermined time to generate a reading trigger clock signal CLKR, and a delay circuit 20b which, upon application of the read command or read instruction signal READ, delays internal clock signal CLKi by a predetermined time to generate a detect control clock signal DCTLK. The delay time that delay circuit 20a has is set to be shorter than the delay time that delay circuit 20b has. Therefore, after the generation of reading trigger clock signal CLKR, detect control clock signal DCTLK is generated.

Phase control circuit 70 includes a phase adjusting circuit 70a which receives internal clock signal CLKi to generate output trigger clock signal TRGCK having a phase adjusted with respect to this internal clock signal CLKi, and a gate circuit 70b which generates detect trigger clock signal DTRCK in accordance with output trigger clock signal TRGCK from phase adjusting circuit 70a and detect control clock signal DCTLK from timing control circuit 20. Phase adjusting circuit 70a, constituted of a PLL or DLL, generates output trigger clock signal TRGCK having a fixed phase difference that is not dependent on the frequency of internal clock signal CLKi.

Gate circuit 70b outputs a signal of the Low level, when output trigger clock signal TRGCK goes high or detect control clock signal DCTLK goes low. Gate circuit 70b detects the rising edge of output trigger clock signal TRGCK and the falling edge of detect control clock signal DCTLK, whichever is generated earlier, and drives detect trigger clock signal DTRCK to the High level based upon the detected earlier edge. The termination of the High level period of this detect trigger clock signal DTRCK is determined by detect trigger clock signal DCTLK. Referring to a timing chart shown in FIG. 14, the operation of the construction shown in FIGS. 12 and 13 will be described.

Upon application of read command (read instruction signal) READ, reading trigger clock signal CLKR is driven to the High level in accordance with internal clock signal CLKi, and successively, after a lapse of a period of time Tb, detect control clock signal DCTLK is driven to the High level. These clock signals CLKR and DCTLK are generated by delay circuits 20a and 20b and have fixed delay times with respect to internal clock signal CLKi, respectively.

Phase adjusting circuit 70a generates output trigger clock signal TRGCK leading in phase internal clock signal CLKi. It is assumed that the time difference between the output trigger clock signal TRGCK and the detect control clock signal DCTLK is Ta. In accordance with reading trigger clock signal CLKR, a memory cell is selected in memory circuit 4 shown in FIG. 12, and read data RD is transmitted through reading circuit 5, and the data signal levels on the internal data bus 10 change in accordance with the transmitted memory cell data. Now, it is assumed that the internal data bus is precharged to the ground voltage level.

Figure 14:
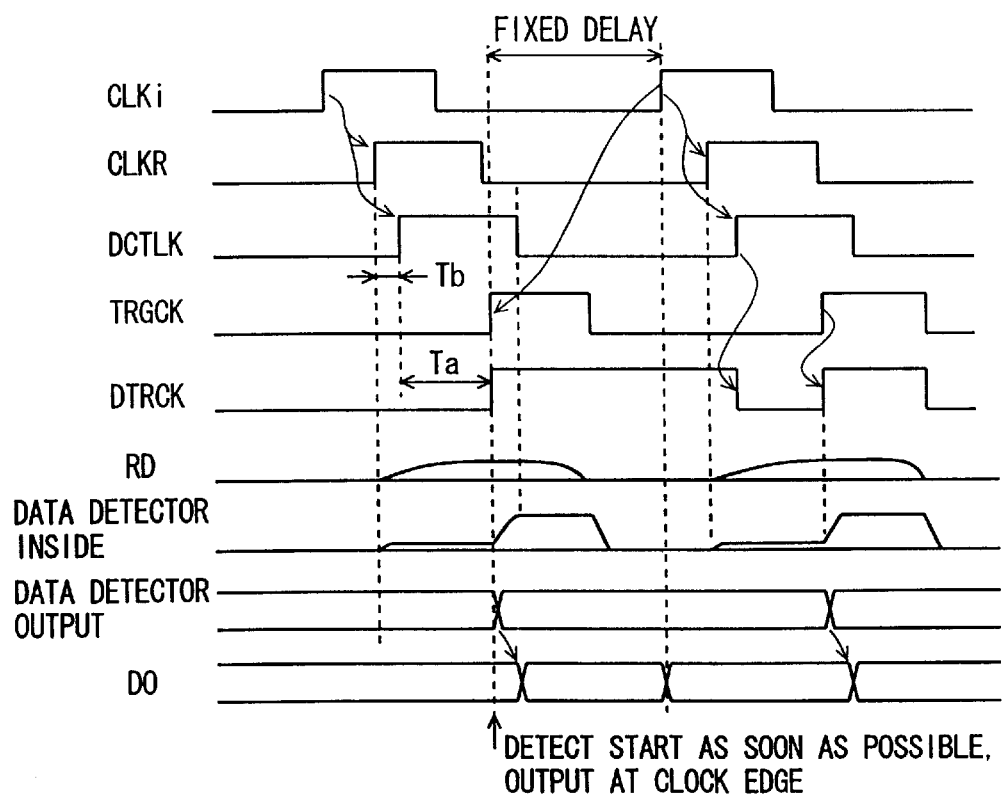
FIG. 14 is a timing chart representing the operation of the phase control circuit shown in FIG. 12.

Then, detect trigger clock signal DTRCK goes high in accordance with the timing of the earlier of the rise of output trigger clock signal TRGCK and the fall of detect control clock signal DCTLK. FIG. 14 shows a state in which output trigger clock signal TRGCK goes high earlier than the falling of detect control clock signal DCTLK. Therefore, in this case, detect trigger clock signal DTRCK is activated in accordance with output trigger clock signal TRGCK, and data detector 40 shown in FIG. 12 starts a detecting operation. When this detecting operation is carried out, a data transfer operation is carried out by output buffer 44 so that data is successively transferred under the control of clock adjusting circuit 72.

As shown in FIG. 14, when read data RD is transmitted to internal data bus 10, detect control clock signal DTRCK is activated as soon as possible. The timing at which read data RD is transmitted to internal reading data bus 10 is determined by detect control clock signal DCTLK. Even when the phase adjusting time (fixed delay) in phase adjusting circuit 70a is short, output trigger clock signal TRGCK rises later than the fall of detect control clock signal DCTLK, the detecting operation is carried out in accordance with the fall of detect control clock signal DCTLK, and the detect starting timing is optimized. Thus, time TP required for the signal propagation from the data taking-in to the external output in data output circuit OKT can be shortened. In contrast, the time required for the internal memory data to be transferred to the internal read data bus can be lengthened. Thus, even at the time of a high speed operation, it is possible to internally read data of the memory cell stably and to output the data in synchronization with the edge of the external clock signal. Thus, it becomes possible to improve the frequency characteristics in the data reading operation.

Modification

Figure 15:
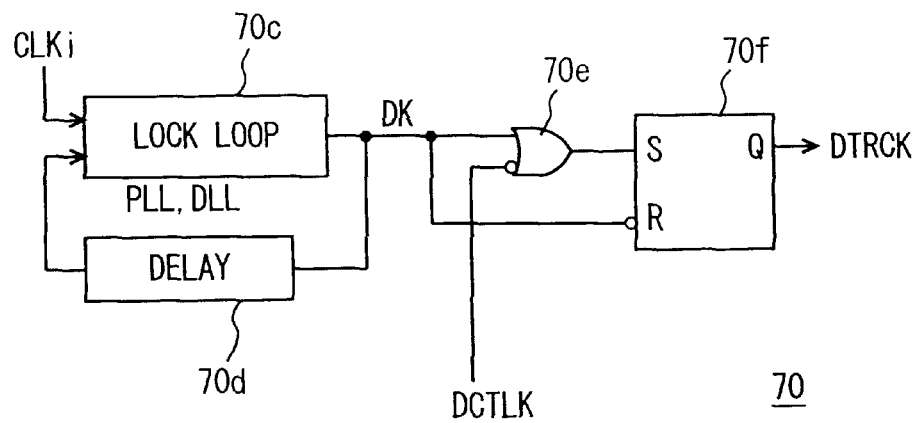
FIG. 15 is a diagram showing a modification of the phase control circuit shown in FIG. 12.

FIG. 15 is a schematic diagram showing a construction of a modification for the fourth embodiment in the present invention. FIG. 15 shows the construction of phase control circuit 70 shown in FIG. 12. In FIG. 15, phase control circuit 70 includes a lock loop 70c for locking in phase a supplied clock signal to internal clock signal CLKi, a delay circuit 70d for delaying output clock signal DK of lock loop 70c by a predetermined time to apply the resultant signal to lock loop 70c, a gate circuit 70e receiving output clock signal DK of lock loop 70c and detect control clock signal DCTLK, and a set/reset flip-flop 70f set when the output signal of gate circuit 70e goes high and reset when output clock signal DK of lock loop 70c goes low, to generate detect trigger clock signal DTRCK.

Delay circuit 70d sets a fixed delay for output clock signal DK with respect to internal clock signal CLKi. Lock loop 70c, constituted of a PLL or DLL, establishes phase synchronization (phase locking) between internal clock signal CLKi and the clock signal from delay circuit 70d.

Gate circuit 70e outputs a signal of the High level when clock signal DK goes high or detect control clock signal DCTLK goes low.

Figure 16A:
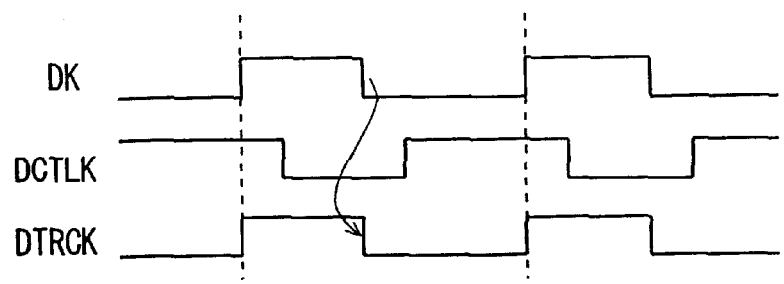
FIGS. 16A and 16B are timing charts representing the operation of a phase control circuit shown in FIG. 15.

In the construction of phase control circuit 70 shown in FIG. 15, as shown in FIG. 16A, in the case when the falling edge of detect control clock signal DCTLK is later than the rising edge of output clock signal DK, gate circuit 70e generates the signal of the High level in accordance with the rise of output clock signal DK of lock loop 70c. Since set/reset flip-flop 70f is set and reset in synchronization with the rise and fall of clock signal DK, detect trigger clock signal DTRCK is a clock signal that is synchronous to output clock signal DK from lock loop 70c.

Figure 16B:
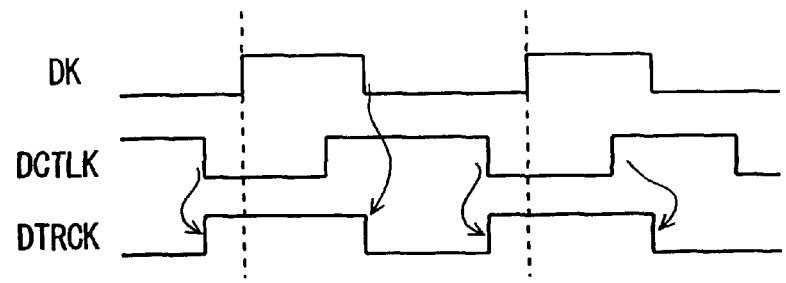

As shown in FIG. 16B, in the case when the falling edge of detect control clock signal DCTLK is earlier than the rising edge of output clock signal DK of lock loop 70c, the output signal of gate circuit 70e goes high in response to the fall of detect control clock signal DCTLK. Therefore, set/reset flip-flop 70f is set in response to the fall of detect control clock signal DCTLK, and also reset in response to the fall of output clock signal DK from lock loop 70c.

Clock signal DK has a predetermined phase difference that is not dependent on the frequency of internal clock signal CLKi, by lock loop (PLL or DLL), and the leading edge of detect trigger clock signal DTRCK is adjusted in accordance with the fall of detect control clock signal DCTLK.

Therefore, in this case, detect trigger clock signal DTRCK is a clock signal that has a phase adjusted basically with respect to internal clock signal CLKi, and has its edge leading edge) further adjusted finely by detect control clock signal DCTLK. Thus, the clock signal that is adjusted in phase is further finely adjusted in timing by using a clock signal with a non-adjusted phase. Thus, it is possible to carry out an accurate data detecting in accordance with the state of data read and transmitted onto the internal data bus, at a timing as fast as possible.

Here, output clock signal DK from lock loop 70c, shown in FIG. 15, may be an output trigger clock signal TRGCK, or another clock signal.

Fifth Embodiment

FIG. 17 is a schematic diagram showing the construction of a main part of a synchronous type semiconductor memory device in accordance with the fifth embodiment of the present invention. In the construction shown in FIG. 17, detect trigger clock signal DTRCK for data detector 40 contained in data output circuit OKT (OKT0 to OKT3, . . . ), is generated by a trigger clock generation circuit 75 that receives output trigger clock signal TRGCK from phase control circuit 22 and detect control clock signal DCTLK from timing control circuit 20. The other construction is the same as those shown in the aforementioned FIG. 12, and the corresponding components are indicated by the same reference numerals, and the description thereof is omitted.

In the construction shown in FIG. 17, trigger clock generation circuit 75 adjusts the phase of output trigger clock signal TRGCK in response to the falling edge of detect control clock signal DCTLK to generate detect trigger clock signal DTRCK. The construction of this trigger clock generation circuit 75 is the same as the construction shown in FIG. 13 or FIG. 15. Output trigger clock signal TRGCK having a fixed delay and a phase adjusted by phase control circuit 22 has a leading edge further adjusted in accordance with detect control clock signal DCTLK having a delay time in accordance with the frequency from timing control circuit 20. Thus, it becomes possible to provide the same effects as those of the fourth embodiment.

Moreover, this trigger clock generation circuit 75 is provided separately from phase control circuit 22, and thus, trigger clock generation circuit 75 can be placed in the vicinity of the data output circuit OKT. Therefore, the interconnection for detect trigger clock signal DCTLK is shortened so that the detect trigger clock signal DTRCK can be driven at high speed.

Here, clock adjusting circuit 72 adjusts the operation timing of P/S conversion circuit 42 and output buffer 44 in accordance with output trigger clock signal TRGCK from phase control circuit 22.

Sixth Embodiment

Figure 18:
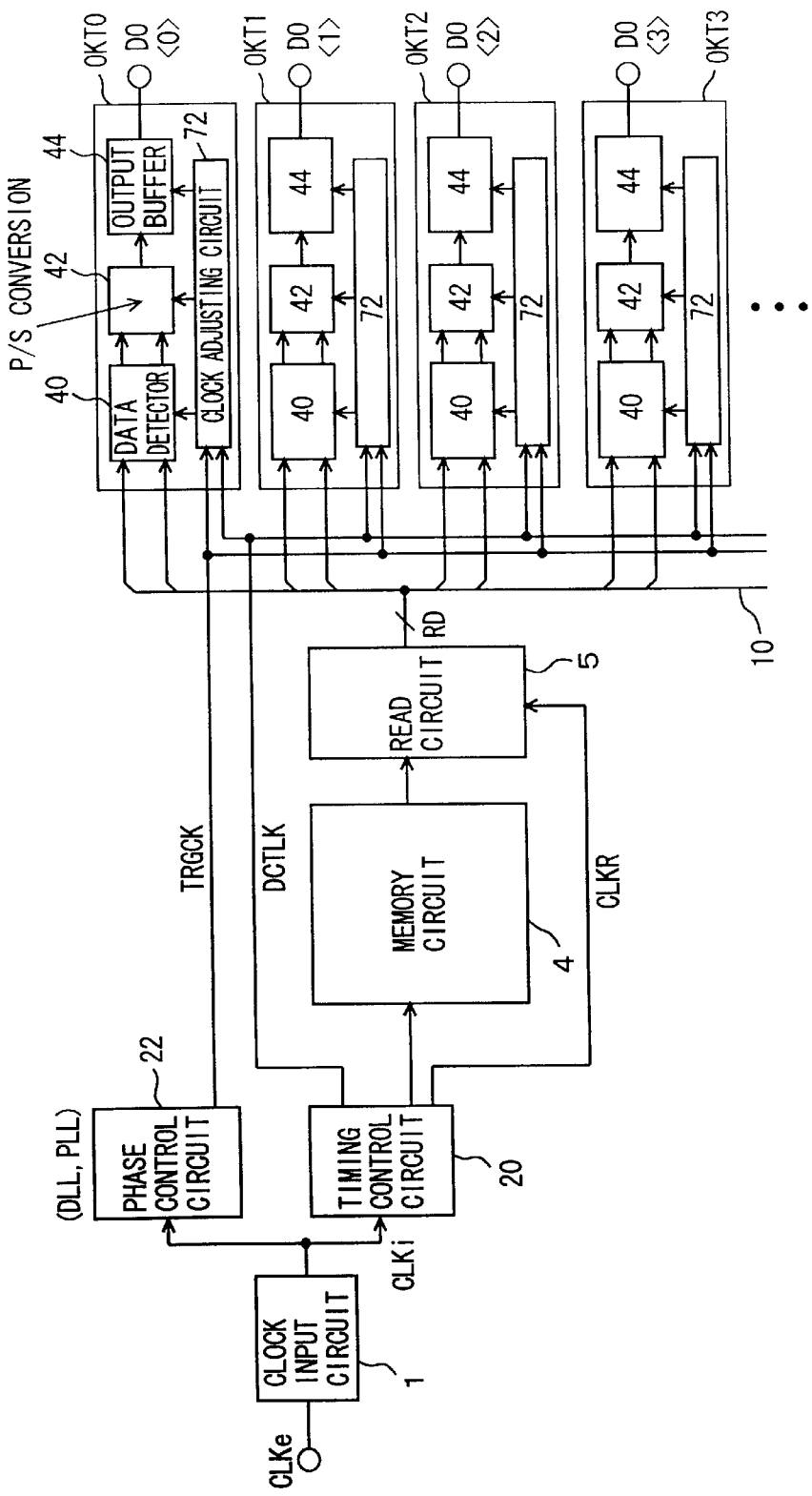
FIG. 18 is a schematic diagram showing the construction of a main part of a semiconductor memory device in accordance with a sixth embodiment of the present invention.

FIG. 18 is a schematic diagram showing the construction of a main part of a synchronous type semiconductor memory device in accordance with the sixth embodiment of the present invention. In the construction shown in FIG. 18, to clock adjusting circuit 72 contained in data output circuit OKT0 to OKT3, . . . , output trigger clock signal TRGCK having a phase adjusted from phase control circuit 22 and detect control clock signal DCTLK from timing control circuit 20 are supplied. In accordance with supplied output trigger clock signal TRGCK and detect control clock signal DCTLK, various control (clock) signals for determining the operation timings of the corresponding data detector 40, P/S conversion circuit and output buffer 44 are generated. Therefore, the timing adjustments for the data detecting, P/S converting and outputting operations are carried out within the individual data output circuits, and therefore, it becomes possible to carry out accurate timing adjustments, and also to transfer data at optimal timing in accordance with the characteristics of the data output circuit.

Seventh Embodiment

Figure 19:
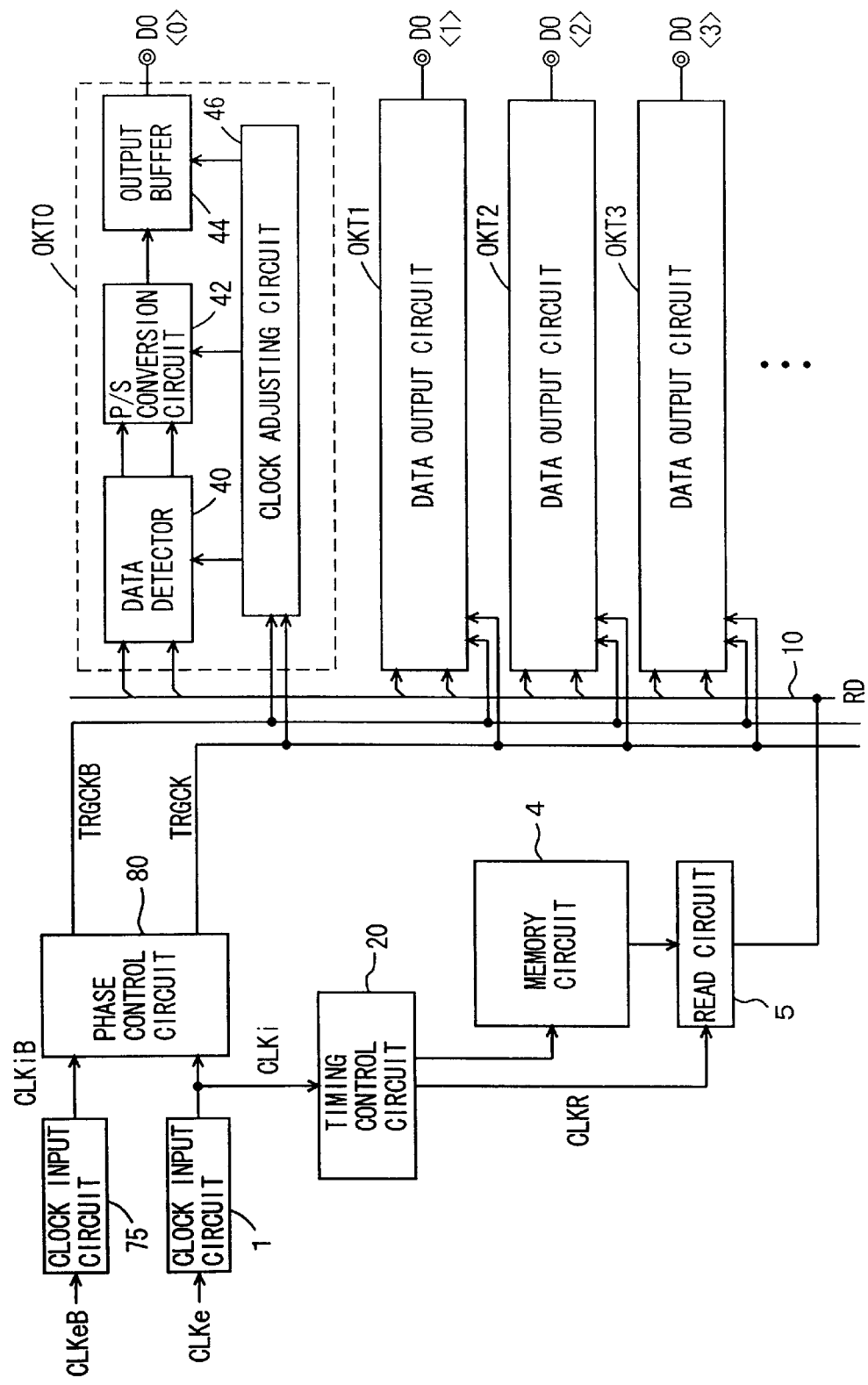
FIG. 19 is a schematic diagram showing the construction of an essential portion of a semiconductor memory device in accordance with a seventh embodiment of the present invention.

FIG. 19 is a schematic diagram showing the construction of a main part of a semiconductor memory device in accordance with the seventh embodiment of the present invention. In the construction shown in FIG. 19, complementary clock signals CLKe and CLKeB are externally supplied to clock input circuits 1 and 75 respectively. Internal clock signal CLKi is generated from clock input circuit 1 and complementary internal clock signal CLKiB is generated from clock input circuit 75. Timing control circuit 20 includes a delay circuit having a delay time adjusted in accordance with the clock frequency, generates a reading trigger clock signal CLKR having a delay time corresponding to the frequency in accordance with internal clock signal CLKi for application to reading circuit 5.

Here, in accordance with complementary internal clock signals CLKi and CLKiB from clock input circuits 1 and 75, a phase control circuit 80 generates complementary output trigger clock signals TRGCK and TRGCKB each having a fixed delay and each having a phase adjusted. These complementary trigger clock signals TRGCK and TRGCKB from phase control circuit 80 are supplied to a clock adjusting circuit 46 contained in each of data output circuits OKT0 to OKT3. Clock adjusting circuit 46 generates control signals for determining the operation timings of the corresponding data detector 40, P/S conversion circuit 42 and output buffer 44, in accordance with complementary output trigger clock signals TRGCK and TRGCKB.

Figure 8:
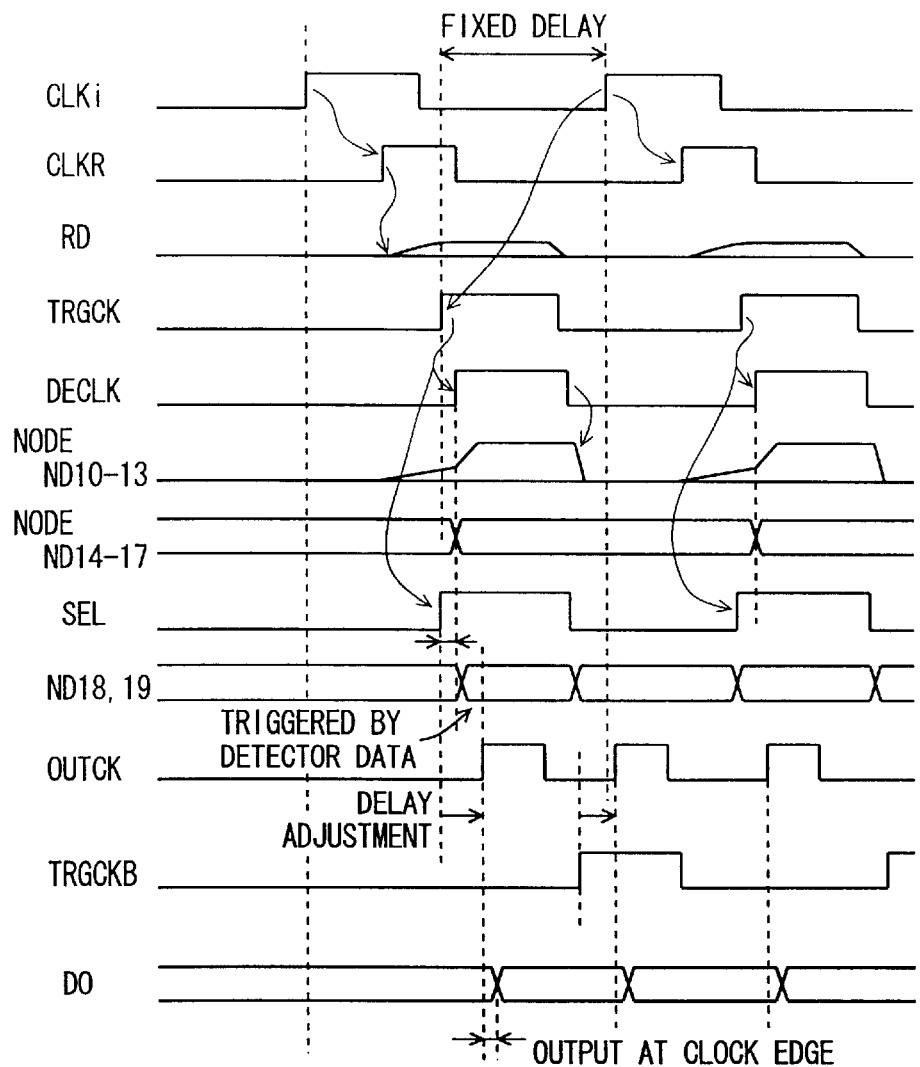
FIG. 8 is a timing chart representing an operation of the data output circuit shown in FIG. 7.

In the case when the operation timing is determined in the individual data output circuits independently by utilizing complementary output trigger clock signals TRGCK and TRGCKB, upon carrying out a data output at a double data rate, the data output timing is easily adjusted in a unit of a half-clock cycle of the external clock signal (see FIGS. 8 and 11). Thus, even when output trigger clock signals TRGCK and TRGCKB are generated as internal signals, each having a fixed pulse width different from that of a signal of duty 50, it is possible to carry out data detecting, P/S converting and externally data-outputting accurately.

The construction shown in FIG. 19 is distinct from that of FIG. 6 in that, instead of the construction for generating complementary output trigger clock signal TRGCKB from one trigger clock signal TRGCK, complementary clock signals CLKe and CLKeB are generated externally, and based upon these, complementary output trigger clock signals TRGCK and TRGCKB that are phase-adjusted respectively are generated. The contents of the operation are the same as those explained with reference to timing charts in FIGS. 8 and 11. In this case, in response to the respective external clock signals CLKe and CLKeB, complementary output trigger clock signals TRGCK and TRGCKB that are phase-adjusted respectively are generated. Thus, clock adjusting circuit 46 can accurately adjust the data detect timing and others, resulting in more precise timing adjustments.

Eighth Embodiment

Figure 20:
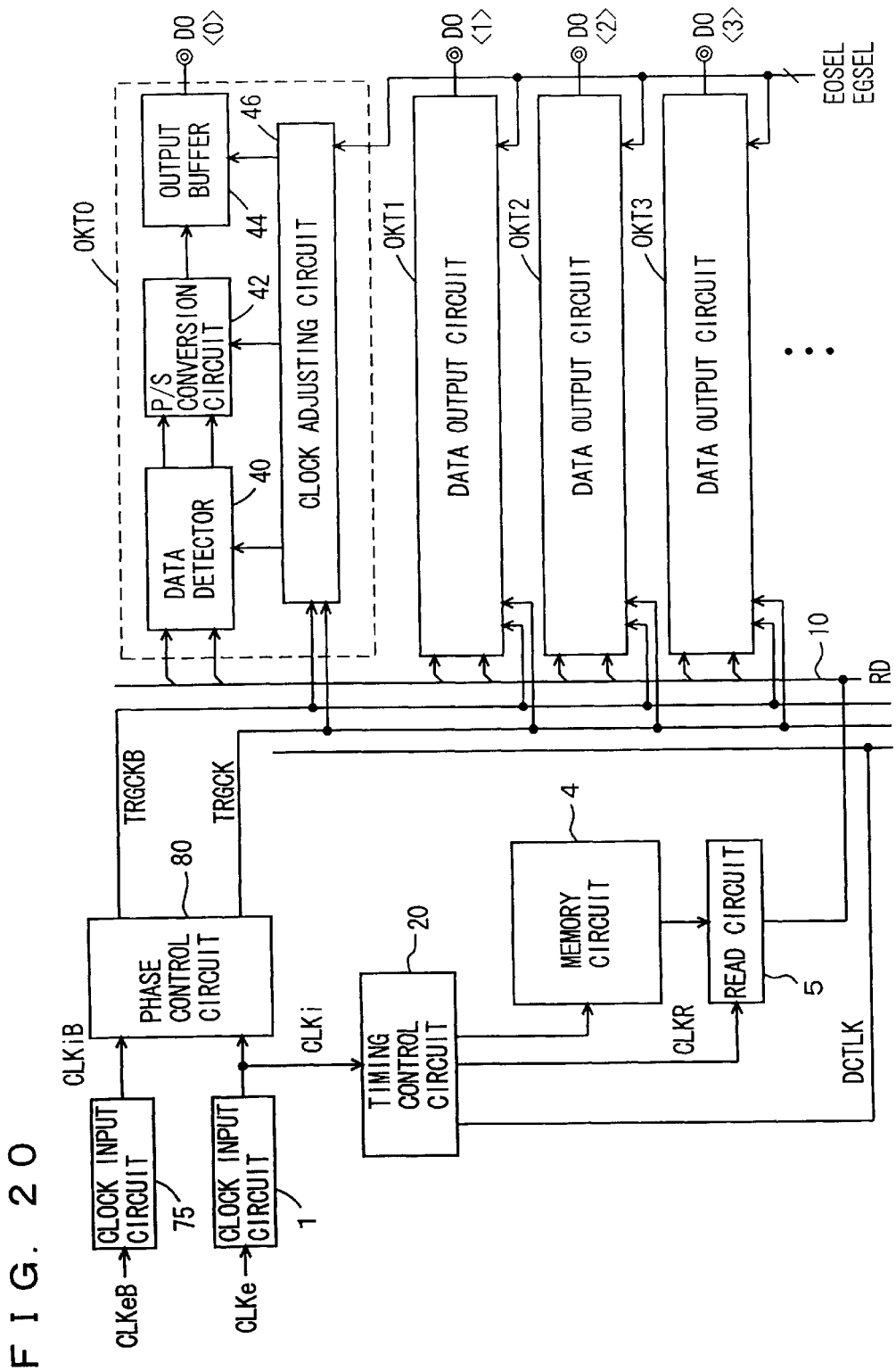
FIG. 20 is a schematic diagram showing the construction of a main part of a semiconductor memory device in accordance with an eighth embodiment of the present invention.

FIG. 20 is a schematic diagram showing the construction of a main part of a clock synchronous type semiconductor memory device in accordance with the eighth embodiment of the present invention. In the construction shown in FIG. 20, phase control circuit 80 generates complementary output trigger clock signals TRGCK and TRGCKB, and commonly supplies these clock signals to clock adjusting circuit 46 contained in data output circuits OKT0 to OKT3, . . . Moreover, timing control circuit 20 generates detect control clock signal DCTLK having a non-adjusted phase based upon internal clock signal CLKi for application to clock adjusting circuit 46 contained in data output circuits OKT0 to OKT3.

In each of data output circuits OKT0 to OKT3, . . . , clock adjusting circuit 46 adjusts the operation timings of corresponding data detector 40, P/S conversion circuit 42 and output buffer 44 in accordance with complementary output trigger clock signals TRGCK and TRGCKB and detect control clock signal DCTLK.

The construction shown in FIG. 20 corresponds to a construction in which the constructions shown in FIGS. 18 and 19 are combined. Therefore, the timing adjustments of the data taking-in, data detecting, P/S converting and data outputting are carried out in the individual data output circuits OKT0 to OKT3, . . . individually. Thus, it is possible to eliminate the necessity of transmitting the adjusted control signals after the timing adjustments over a long distance, and consequently to implement accurate timing adjustments.

Here, in the construction shown in FIG. 20, clock selection signals EOSEL and EGSEL are commonly supplied to clock adjusting circuit 46 of each of data output circuits OKT0 to OKT3, . . . Even/odd clock selection signal EOSEL is used for indicating which of bits of 2-bit data transferred to each of the data output circuits should be selected earlier, in the case when the data output is performed at a double data rate. Edge selection signal EGSEL specifies which of the rise and fall of clock signal CLKi is used for triggering the operation start.

As described above, in accordance with the eighth embodiment of the present invention, the clock signal having an adjusted phase and the clock signal having a non-adjusted phase are used in each of the data output circuits so as to adjust the operation timing. Therefore, it is possible to optimize the operation timing of the data output circuit.

Ninth Embodiment

Figure 21:
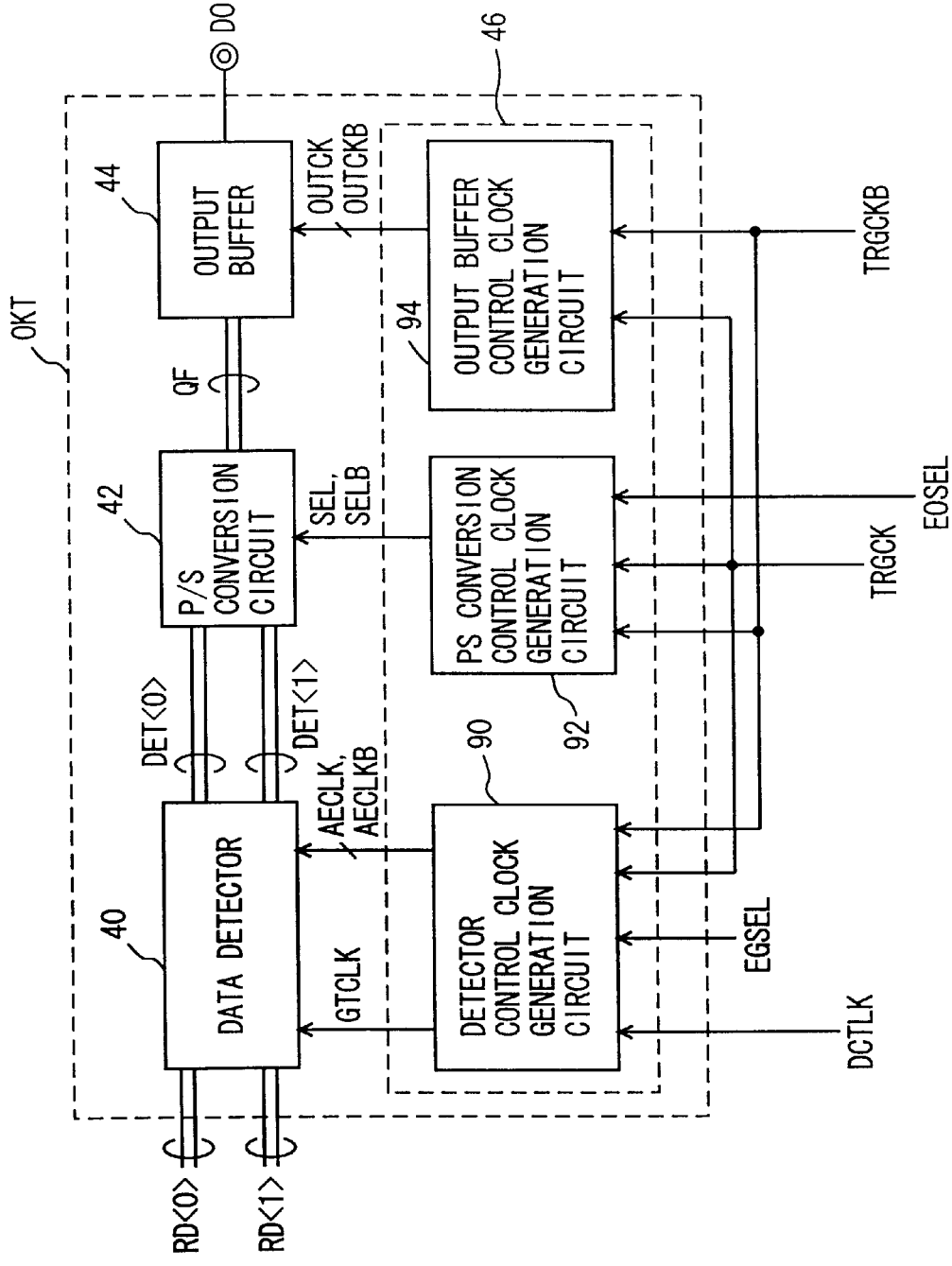
FIG. 21 is a schematic diagram showing a data output section in accordance with a ninth embodiment of the present invention.

FIG. 21 is a schematic diagram showing the construction of a data output circuit OKT in accordance with the ninth embodiment of the present invention. This data output circuit OKT, shown in FIG. 21 receives internal read data RD<0> and RD<1> in parallel, converts these to 1-bit internal output data QF, and outputs this serial data QF externally through an output buffer.

With respect to data output circuit OKT, as shown in the aforementioned first to eighth embodiments, a plurality of data output circuits are provided, and 2-bit data are supplied to each of the data output circuits in parallel with each other. Data bits are respectively represented by complementary signals.

In FIG. 21, each data output circuit OKT includes a data detector 40 for confining applied data in accordance with confining clock signal (detect trigger clock signal) DTCLK, and for amplifying the confined data in accordance with amplifier activation clock signals AECLK and AECLKB, a P/S conversion circuit 42 for successively selecting, bit by bit, the 2 bits outputted from data detector 40 in parallel with each other in accordance with PS conversion control clock signals (clock selection signals) SEL and SELB to generate serial data QF, and an output buffer 44 for buffering internal output data QF from P/S conversion circuit 42 in accordance with output clock signals OUTCK and OUTCKB to externally output the buffered serial data as output data DO. Respective clock signals, supplied to these data detector 40, P/S conversion circuit 42 and output buffer 44, are generated from a clock adjusting circuit 46.

Clock adjusting circuit 46 includes a detect control clock generation circuit 90 for generating confining signal DTCLK and amplifier activation clock signals AECLK and AECLKB in accordance with detect control clock signal DCTLK and clock (edge) selection signal EGSEL as well as complementary output trigger clock signals TRGCK and TRGCKB, a PS conversion control clock generation circuit 92 for generating PS conversion control clock signals SEL and SELB in accordance with even/odd clock selection signal EOSEL and complementary output trigger clock signals TRGCK and TRGCKB, and an output buffer control clock generation circuit 94 for generating output timing clock signals OUTCK and OUTCKB in accordance with signals TRGCKB and TRGCK. Consequently, clock adjusting circuit 46 receives complementary output trigger clock signals TRGCKB and TRGCK having a phase adjusted from phase control circuit 80 shown in FIG. 20, detect control clock signal DCTLK having a non-adjusted phase received from timing control circuit 20, and even/odd clock selection signal EOSEL.

Figure 22:
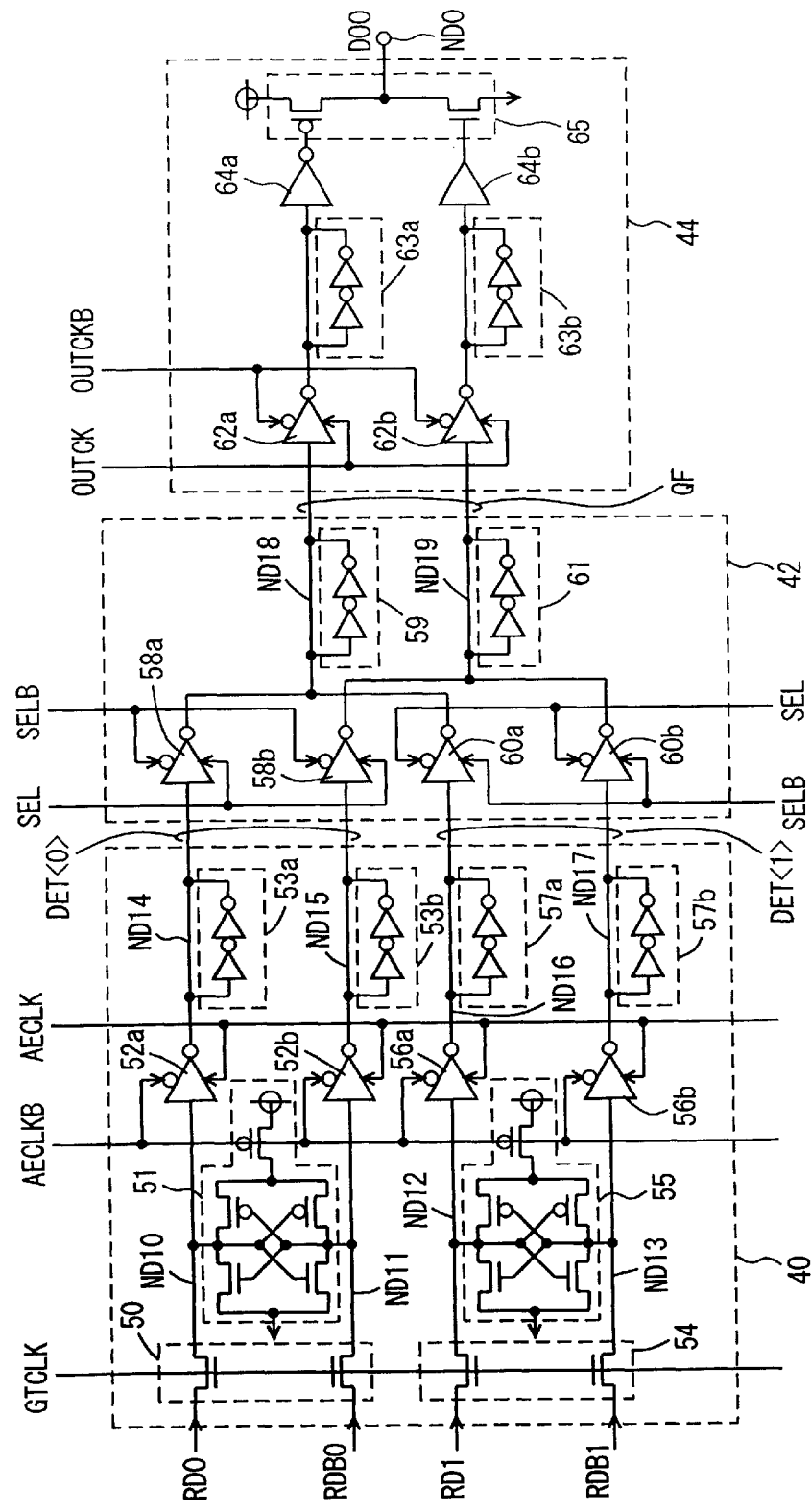
FIG. 22 is a diagram showing an example of a specific construction of a data transfer section in the data output circuit shown in FIG. 21.

FIG. 22 specifically shows an example of the construction of data detector 40, P/S conversion circuit 42 and output buffer 44. The construction, shown in FIG. 22, is only distinct from the construction of the data output circuit shown in FIG. 7 in that clock signals applied to data detector 40 are different, and the other constituent elements are the same. Therefore, the corresponding parts are indicated by the same reference numerals, and the description thereof is omitted.

In this data detector 40, confining clock signal DTCLK is applied to confining gates 50 and 54. Amplifier activation signal AECLKB is applied to differential amplifier circuit 51, and complementary amplifier activation signals AECLK and AECLKB are applied to tri-state inverter buffers 52a, 52b, 56a and 56b. In the same manner as in the construction shown in FIG. 7, PS conversion control clock signals SEL and SELB are applied to P/S conversion circuit 42, and output clock signals OUTCK and OUTCKB are applied to output buffer 44. The data confining operation and data detecting operation of data detector 40 are carried out at mutually different timings.

Figure 23:
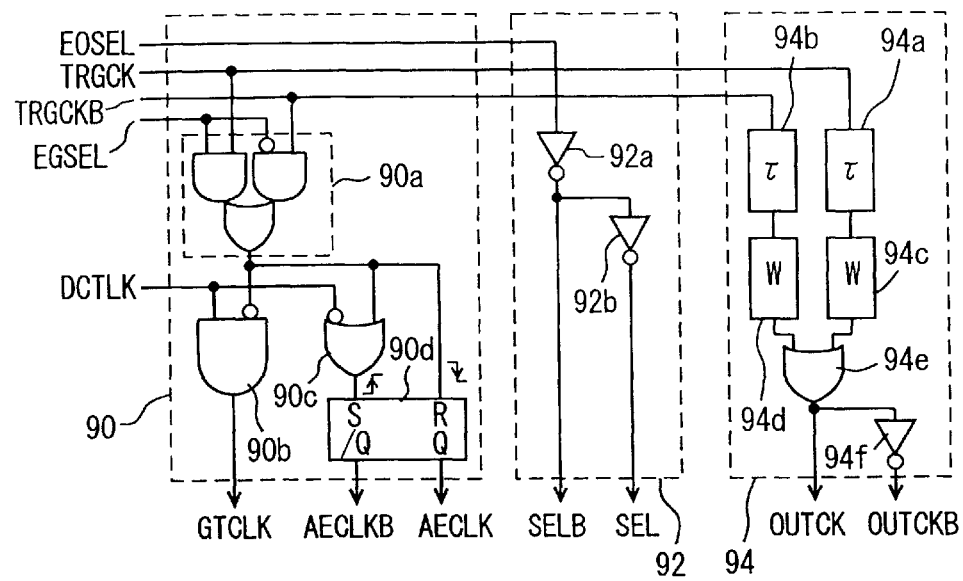
FIG. 23 is a diagram showing an example of a specific construction of a clock adjusting circuit shown in FIG. 21.

FIG. 23 is a diagram specifically showing an example of the construction of clock adjusting circuit 46 shown in FIG. 21. In FIG. 23, detect control clock generation circuit 90 includes a composite gate 90a for selecting one of output trigger clock signals TRGCK and TRGCKB in accordance with clock edge selection signal EGSEL, a gate circuit 90b for receiving the output signal of composite gate 90a and detect control clock signal DCTLK to generate confining clock signal DTCLK, a gate circuit 90c for receiving the output signal of composite gate 90a and detect control clock signal DCTLK, a set/reset flip-flop 90d that is set and reset in accordance with the output signal of gate circuit 90c and the output signal of composite gate 90a to generate amplifier activation clock signals AECLK and AECLKB.

Composite gate 90a equivalently includes an AND circuit for receiving clock edge selection signal EGSEL and output trigger clock signal TRGCK, a gate circuit for receiving complementary output trigger clock signal TRGCKB and clock edge selection signal EGSEL, and an OR circuit for receiving the outputs of the AND circuit and the gate circuit. This gate circuit outputs a signal of the High level when complementary output trigger clock signal TRGCKB goes low and clock edge selection signal EGSEL goes high.

When clock edge selection signal EGSEL is set to HIGH level, composite gate 90a generates its output signal in accordance with output trigger clock signal TRGCK. In contrast, when clock edge selection signal EGSEL is set to LOW level, composite gate 90a generates its output signal in accordance with complementary output trigger clock signal TRGCKB.

Gate circuit 90b generates a signal of the High level when detect control clock signal DCTLK goes high and the output signal of composite gate 90a goes low. Gate circuit 90c outputs a signal of the High level when detect control clock signal DCTLK goes low or the output signal of composite gate 90a goes high.

Set/reset flip-flop 90d is set, when the output signal of gate circuit 90c rises, to raise amplifier activation signal AECLK to HIGH level and to lower complementary amplifier activation signal AECLKB to LOW level, and is reset when the output signal of composite gate 90a falls to the Low level, to render amplifier activation signals AECLK and AECLKB inactive. Amplifier activation signals AECLK and AECLKB are complementary signals that are respectively outputted from outputs Q and /Q of set/reset flip-flop 90d.

PS conversion control clock generation circuit 92 includes an inverter circuit 92a for inverting even/odd clock selection signal EOSEL to generate complementary PS conversion control clock signal SELB, and an inverter circuit 92b for inverting the output signal of inverter circuit 92a to generate PS conversion control clock signal SEL. As described previously, even/odd clock selection signal EOSEL is generated in accordance with internal clock signal CLKi depending on even/odd column addresses. Even/odd clock selection signal EOSEL may be a clock signal that has a phase adjusted with respect to internal clock signal CLKi, or may be a clock signal that has a delay depending on the clock frequency and has a non-adjusted phase and that is simply generated by a delay circuit. Here, it is only necessary for this P/S conversion circuit to be set to the conductive state upon detecting operation of the data detector. During the detecting operation, clock selection signal SEL is set to the High level prior to the detected data development, and upon data detection, the output data of P/S conversion circuit change with the detected data being a trigger.

Output buffer control clock generation circuit 94 includes delay elements 94a and 94b for a delay adjustment each for delaying output trigger clock signals TRGCK and TRGCKB by a predetermined time τ, pulse-width adjusting elements 94c and 94d for adjusting the pulse widths of the output signals of delay elements 94a and 94b, an OR circuit 94e for receiving output signals from pulse-width adjusting elements 94c and 94d to generate output clock signal OUTCK, and an inverter 94f for inverting the output signal of OR circuit 94e to generate complementary output clock signal OUTCKB.

Figure 24:
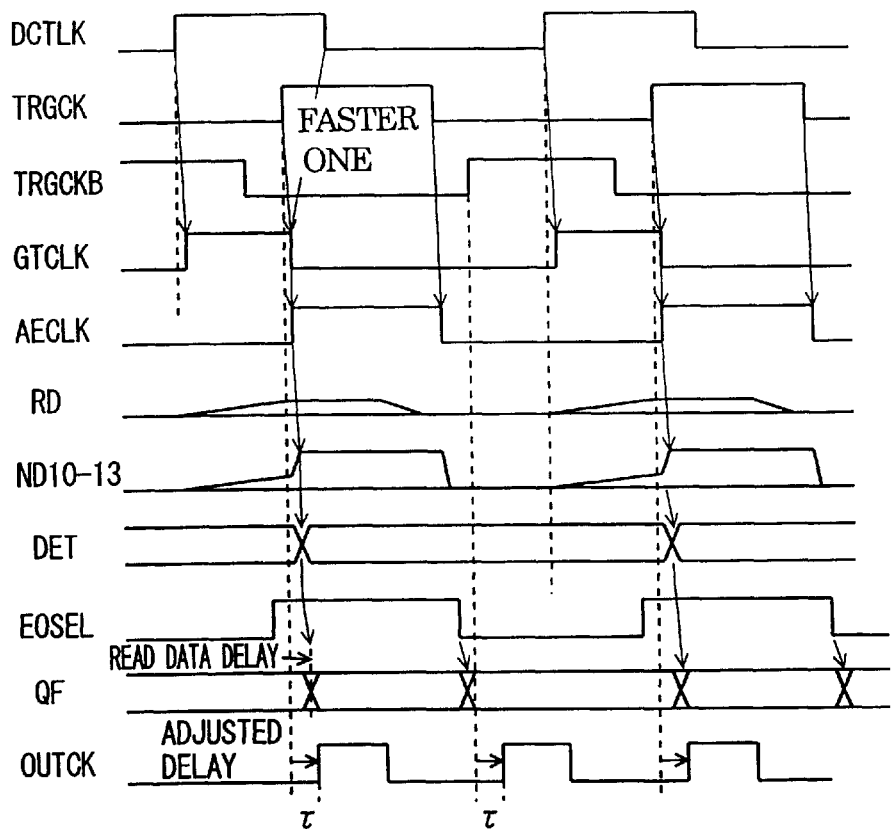
FIG. 24 is a diagram showing the operation of the data output circuit shown in FIGS. 22 and 23.

Delay elements 94a and 94b are constituted of variable delay elements having delay time settable with mask interconnection, or programmable, and each delay time τ is adjusted such that the delay to a propagation delay of data that reaches from the data detector to the output buffer within the data output circuit is optimized. Each of pulse-width adjusting elements 94c and 94d includes a one-shot pulse generation circuit, for example, and by adjusting its pulse-width, it becomes possible to output data at high speed in outputting data in the DDR (double data rate) mode. The use of delay elements 94a and 94b makes it possible to minimize the data waiting time in the output buffer 44, and consequently to externally output data at high speed. Now, referring to a timing chart shown in FIG. 24, description is made of the operation of the data output circuit shown in FIGS. 21 to 23.

First, clock edge selection signal (clock selection signal) EGSEL is set to the High level so that composite gate 90a, shown in FIG. 23, passes output trigger clock signal TRGCK. After a lapse of a predetermined period of time since the receipt of a read command, detect control clock signal DCTLK goes high. Since the output signal of composite gate 90a is currently set in the Low level, confining clock signal GTCLK outputted by gate circuit 90b goes high to render confining gates 50 and 54 shown in FIG. 22 conductive and data read on internal read data bus lines RD (RD0, RDB0, RD1, RDB1) are respectively transmitted to internal nodes ND10 to ND13 inside data detector 40. When confining clock signal GTCLK goes high, amplifier activation clock signal AECLK is kept at the Low level, and data detector 40 is still not allowed to carry out the amplifying operation.

When output trigger clock signal TRGCK rises to the High level, confining clock signal GTCLK from gate circuit 90b falls to the Low level, setting confining gates 50 and 54 shown in FIG. 22 to the non-conductive state. Further, when output trigger clock signal TRGCK rises to the High level, complementary amplifier activation clock signal AECLKB, outputted from gate circuit 90, goes low responsively, and amplifier activation signal AECLK, on the other hand, rises to the High level so that data detector 40 starts the detecting operation.

At this time, in P/S conversion circuit 42, clock selection signal SEL is changed to the High level in accordance with even/odd clock selection signal EOSEL from PS conversion control clock generation circuit 92 shown in FIG. 23, and accordingly tri-state inverter buffers 58a and 58b shown in FIG. 22 are enabled. Thus, when data DET of nodes ND14 and ND15 are changed by the detecting operation of data detector 40, output data QF of P/S conversion circuit 42 is changed in accordance with output data DET of data detector 40. If output data QF of P/S conversion circuit 42 is changed, output timing clock signal OUTCK from output buffer control clock generation circuit 44 shown in FIG. 23 goes high, and responsively, output node NDO is driven in accordance with output data QF from P/S conversion circuit 42 to generate output data DQ0.

When detect control clock signal DCTLK goes low while output trigger clock signal TRGCK subsequently goes low, set/reset flip-flop 90d is reset so that amplifier activation clock signal AECLK goes low, and data detector 40 is made inactive. In this state, tri-state inverter buffers 52a, 152b, 56a and 56b, shown in FIG. 22, are set to the output high-impedance state, and latch circuits 53a, 53b, 57a and 57b latch output data DET received from data detector 40.

Here, since detect control clock signal GCTLK is in the Low level, confining clock signal GTCLK is maintained at the Low level so that confining gates 50 and 55 are maintained in the non-conductive state.

At the time of the detecting operation by data detector 40, in P/S conversion circuit 42, PS conversion control clock signal SEL is set in the High level in accordance with even/odd clock selection signal EOSEL so that output data QF of P/S conversion circuit 42 is changed in accordance with the output signal of data detector 40. Therefore, it becomes possible to superimpose the activation timing of P/S conversion circuit 42 on the data detecting operation period, and consequently to shorten the data transfer time down to the signal propagation delay time.

As for the output control clock signal OUTCK, output control clock signal OUTCK goes high with its delay time adjusted with respect to the rising edge of output trigger clock signal TRGCK by delay adjusting elements 94a and 94b shown in FIG. 23, and output buffer 44 is enabled to drive output node NDO in accordance with internal output data QF from P/S conversion circuit 42.

When even/odd clock selection signal EOSEL goes low, PS conversion control clock signal SEL from PS conversion control clock generation circuit 92 goes low so that tri-state inverter buffers 60a and 60b are enabled inside P/S conversion circuit 42. Thus, data, latched at nodes ND16 and ND17 of data detector 40, are transmitted to data output buffer 44, and latched therein. Output control clock signal OUTCK is again generated by complementary output trigger clock signal TRGCKB so that output buffer 44 executes a data outputting operation in accordance with data QF newly applied from P/S conversion circuit 42.

In the next clock cycle, the data reading operation is again carried out (burst operation), and the data reading operation is executed in the same manner. Here, in data reading operation, the data reading operation may be carried out in accordance with the burst mode, or the read command may be applied every clock cycle.

Figure 25:
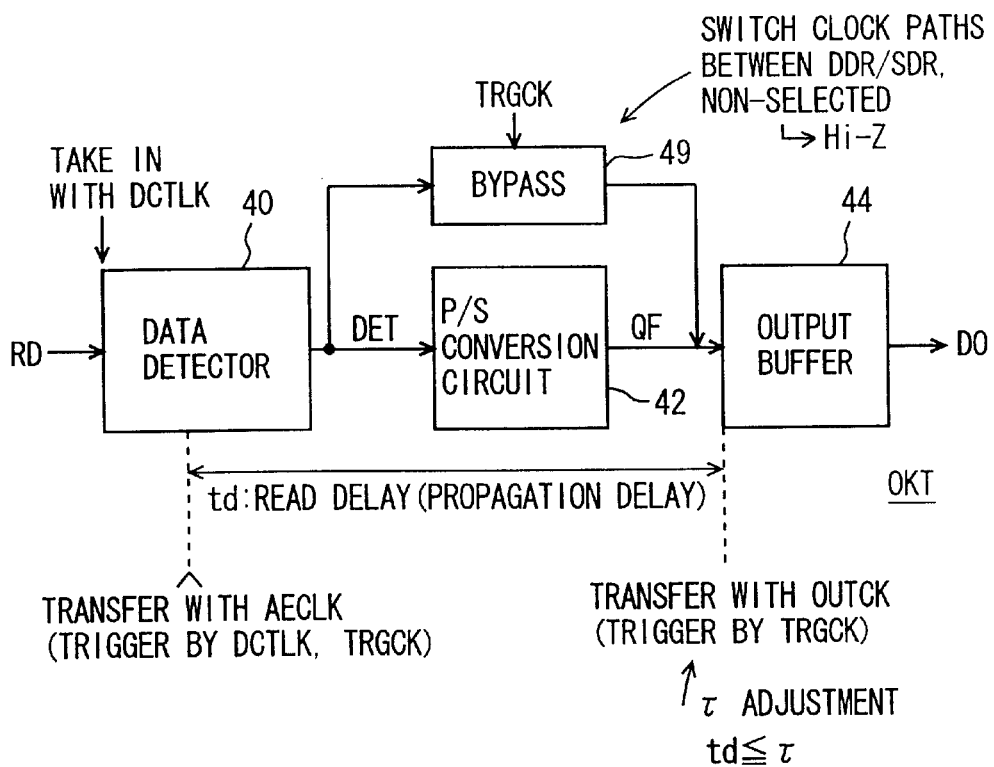
FIG. 25 is a schematic diagram showing the operation of a semiconductor memory device in accordance with the ninth embodiment.

FIG. 25 is a schematic diagram showing signal propagation time in data output circuit OKT. In FIG. 25, in accordance with detector control clock signal DCTLK, internal read data RD is taken in by data detector 40. The taken in data by data detector 40 is amplified and transferred in accordance with amplifier activation clock signal AECLK, and detector output data DET is set to the definite state. This amplifier activation clock signal AECLK is triggered by detector control clock signal DCTLK or output trigger clock signal TRGCK. Output data DET of data detector 40 is transmitted to output buffer 44 through P/S conversion circuit 42. Here, it is assumed that the propagation delay (read delay) of internal read data RD in a path from data detector 40 to output buffer 44 is time td.

Output buffer 44 transfers data externally in accordance with output clock signal OUTCK. Output clock signal OUTCK has its activation triggered by output trigger clock signal TRGCK. Output clock signal OUTCK has its delay time adjusted with respect to output trigger clock signal TRGCK by delay adjusting elements (see FIG. 23). Therefore, the delay time τ of this output clock signal OUTCK is set to be a value not less than the read delay time td. Thus, immediately after data detected by data detector 40 is transmitted to output buffer 44, output buffer 44 is activated to output the data externally.

Therefore, in a high speed clock operation, immediately before activation of output clock signal OUTCK for determining the operation start of output buffer 44, the data detecting operation can be started in accordance with output trigger clock signal TRGCK. Thus, it becomes possible to set the time difference between the start of the detecting operation in data detector 40 and the start of the data transfer in output buffer 44 to a minimum value, and consequently to implement a high speed operation.

Moreover, by setting the read delay time td and the delay adjusting time τ of output control clock signal OUTCK to the time of the same order, it is possible to activate output buffer 44 when data DET from data detector 40 arrives at output buffer 44 so that these data detector 40 and output buffer 44 can be activated with the same output trigger clock signal TRGCK. Moreover, the waiting time for data in output buffer 44 can be minimized.

With respect to the timing adjustment in data output circuit, individual activation timings are set by using the same clock signal so that it is not necessary to provide a great timing margin and it is possible to easily set the timings.

Moreover, as shown in FIG. 22, with respect to data output circuit OKT, the gate delay caused inside thereof is a gate delay caused by the tri-state inverter buffers. Therefore, the number of delay stages is fewer, data output circuits OKT are placed at individual data output nodes so as to only occupy small areas, the circuit scale is small, and each of the internal reading data transfer paths is closed in the corresponding data output circuit. Consequently, with these advantages, the read delay is predictable in advance in each of the data output circuits so that the delay time in output buffer 44 can be adjusted to an optimal value (td=τ). Thus, it is not necessary to provide an excessive waiting time to the data propagation delay time in output buffer 44, the propagation time in the data output circuit can be minimized, so that it becomes possible to set the transfer time of the internal read data to a maximum available time, and it is possible to improve the frequency characteristics in reading data, and consequently to implement a high speed operation frequency.

Here, in the construction shown in FIG. 25, a bypass circuit 49 for bypassing P/S conversion circuit 42 is placed. This bypass circuit 49 is selectively activated depending on whether the data output mode is the DDR mode or the SDR (single data rate) mode, and transfers detected data of data detector 40 in accordance with the activated output trigger clock signal. Bypass circuit 49 is operated in accordance with P/S conversion control clock signal for driving P/S conversion circuit 42 when activated. When not selected, bypass circuit 49 is set to the output high impedance state. In this case, 2-bit data of data detector 40 is bypassed by bypass circuit 49, and transmitted to output buffer 44 so that output buffer 44 includes two output buffer circuits for outputting the bits of 2-bit data to two data output nodes in parallel with each other.

Tenth Embodiment

Figure 26:
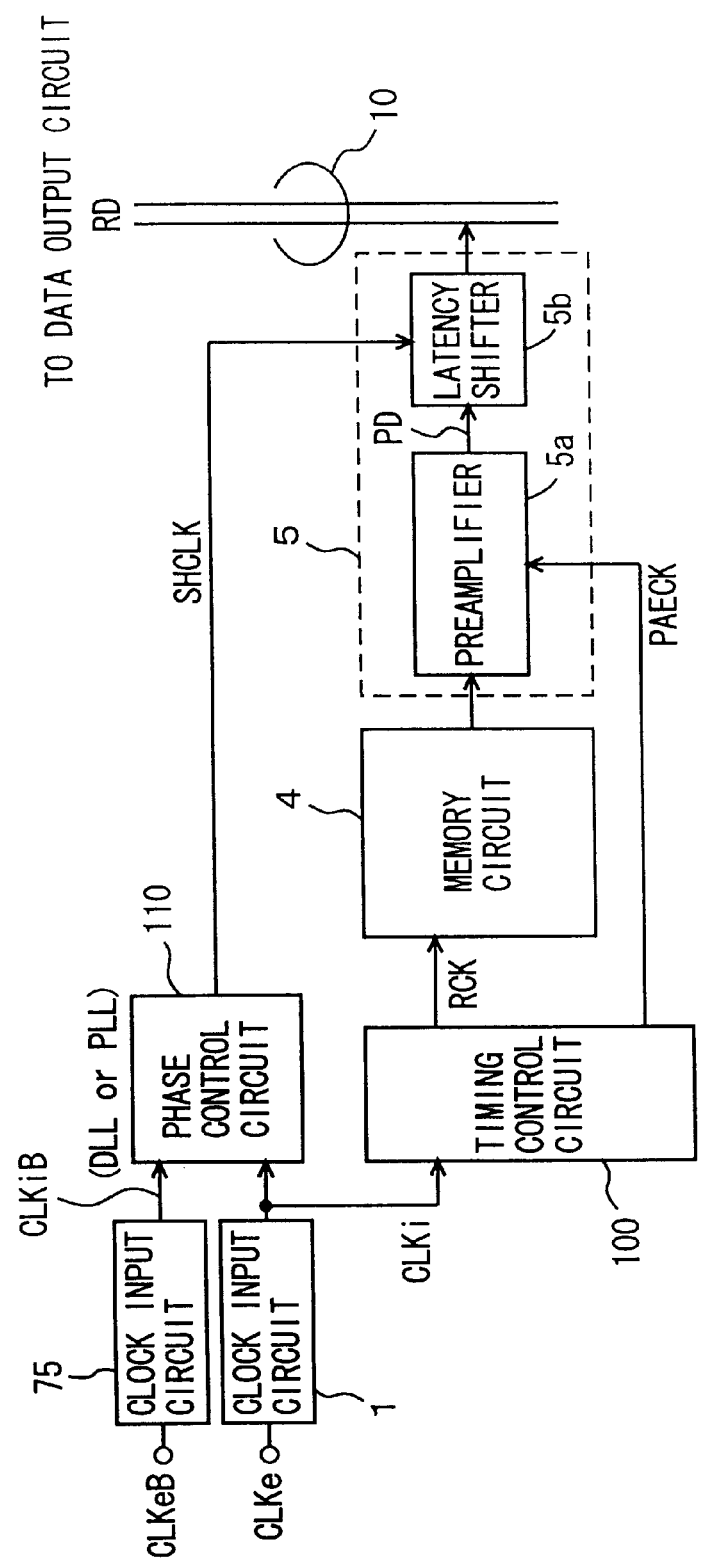
FIG. 26 is a schematic diagram showing the construction of a main part of a semiconductor memory device in accordance with a tenth embodiment of the present invention.

FIG. 26 is a schematic diagram showing the construction of a main part of a synchronous type semiconductor memory device in accordance with the tenth embodiment of the present invention. In the construction shown in FIG. 26, a reading circuit 5 includes a preamplifier 5a for amplifying data read from memory circuit 4, and a latency sifter 5b for shifting output data of preamplifier 5a for a predetermined period of time. The output data of latency shifter 5b is transferred to internal data bus 10. Data on internal data bus 10 may be transmitted to the data output circuit described in the aforementioned first to ninth embodiments, or it may be coupled to a conventional data output circuit responsive to an output control clock signal having a non-adjusted phase.

A preamplifier activation clock signal PAECK from a timing control circuit 100 is supplied to preamplifier 5a, and a shift clock signal SHCLK from a phase control circuit 110 is supplied to latency shifter 5b. Timing control circuit 100 delays internal clock signal CLKi from clock input circuit 1 by a predetermined time in the data reading mode to generate preamplifier activation clock signal PAECK. Phase control circuit 110 carries out a phase adjustment in accordance with complementary internal clock signals CLKi and CLKiB from clock input circuits 1 and 75 to generate shift clock SHCLK.

The internal construction of this phase control circuit 110 is the same as the construction shown in the aforementioned third embodiment, except for that, in place of output trigger clock signal TRGCK, shift clock signal SHCLK is generated as a clock signal to be generated. Therefore, shift clock signal SHCLK has a fixed delay that is not dependent on the clock frequency with respect to the external (internal) clock signal. Preamplifier activation clock signal PAECK is generated by using a delay circuit or the like, and has a delay time depending on the frequency of the clock signal and the latency.

Timing control circuit 100 also applies to memory circuit 4 a read activation control signal RCK used for activating/inactivating a circuit related to the data reading such as column decoder and equalizing circuit for internal data lines IO in the data reading operation.

In the construction shown in FIG. 26, preamplifier 5a and latency shifter 5b have their operations controlled in accordance with clock signals that are generated different paths, respectively. Latency shifter 5b carries out a shifting operation for a clock cycle period of a column latency CL-2, in accordance with shift clock signal SHCLK. Now, referring to a timing chart shown in FIG. 27, description will be made of the operation of reading circuit 5 shown in FIG. 26.

Figure 27:
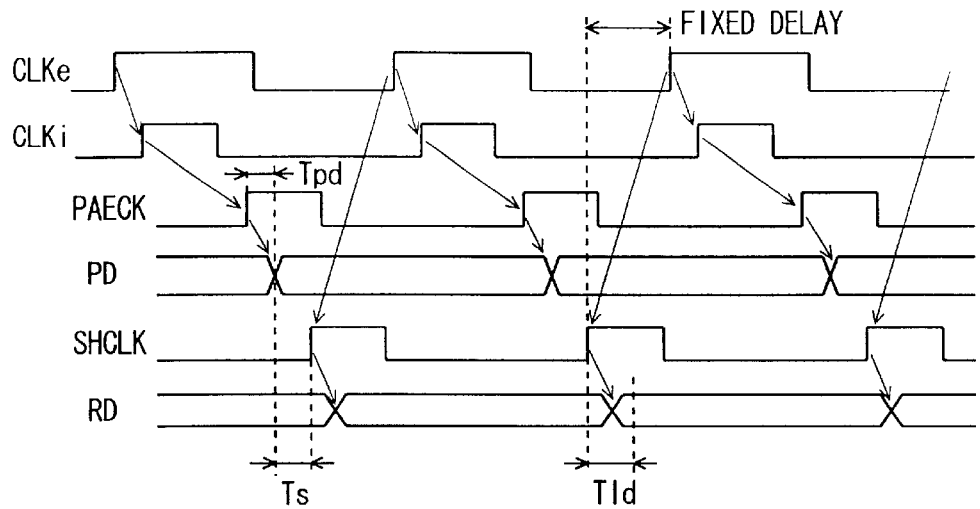
FIG. 27 is a timing chart representing the operation of a data reading circuit shown in FIG. 26.

In clock input circuit 1, internal clock signal CLKi is generated in accordance with external clock signal CLKe. In the data reading operation, timing control circuit 100 activates preamplifier activation clock signal PAECK after a lapse of a predetermined time from the rise or the fall of internal clock signal CLKi, in accordance with a read command, not shown. FIG. 27 shows a state in which preamplifier activation clock signal PAECK is activated after a lapse of a predetermined time from the rise of internal clock signal CLKi.

Preamplifier 5a carries out an amplifying operation in accordance with activation of preamplifier activation clock signal PAECK, to amplify data read onto internal data line I/O from memory circuit 4 for generating output data PD. Then, shift clock signal SHCLK from phase control circuit 110 is generated with a phase adjusted relative to external clock signal CLKe or internal clock signal CLKi. When this shift clock signal SHCLK goes high, data read from preamplifier 5a is shifted for a predetermined clock cycle period in accordance with shift clock signal SHCLK. FIG. 27 shows an operation waveform in the case in which output data of preamplifier 5a is outputted onto internal data bus 10 as read data RD at a cycle in which the read command is applied.

After shift clock signal SHCLK is set to the High level, read data RD is transmitted onto internal reading data bus 10 after a lapse of a predetermined delay time in latency shifter 5b.

Figure 28:
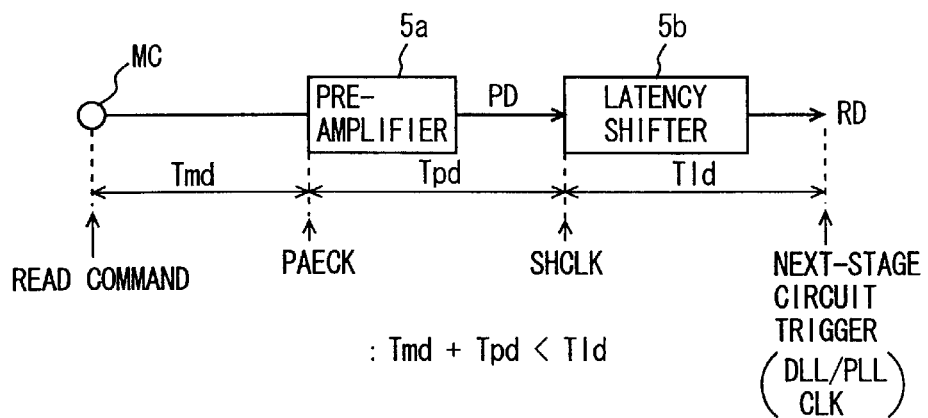
FIG. 28 is a schematic diagram showing a data propagation delay time of the reading circuit shown FIG. 26.

Here, as shown in FIG. 28, it is assumed that the time required for stored data in memory cell MC to reach preamplifier 5a since the application of the read command is Tmd. Preamplifier 5a carries out an amplifying operation in accordance with activation of preamplifier activation clock signal PAECK. It is assumed that, after the amplifying operation of this preamplifier 5a, the time required for output data PD to be transmitted to latency shifter 5b and made definite therein as the transmitted data is Tpd. When shift clock signal SHCLK goes high, latency shifter 5b takes in supplied data for outputting as read data RD. Here, it is assumed that in latency shifter 5b, the time required for the taking-in operation of output data PD of preamplifier 5a and the subsequent transfer operation of shift data RD to a subsequent circuit is Tld.

Here, description is made of a case in which the subsequent stage circuit is triggered by a clock signal (DLL/PLLCLK) from phase control circuit 110 (or 22). In the case when the equivalent delay time (the time required for the taking-in of output data PD received from preamplifier 5a and the time required for the transfer of read data RD to the subsequent stage circuit in synchronization with shift clock signal SHCLK) Tld in latency shifter 5b is longer than the sum of the propagation delay time Tpd of preamplifier 5a and the time Tmd required for the transferring of the memory cell data to preamplifier 5a, latency shifter 5b is operated at a timing as fast as possible in accordance with shift clock signal SHCLK. Thus, it is possible to shorten the time Ts required from the definition of preamplifier output data PD shown in FIG. 27 to the rise of shift clock signal SHCLK, and consequently to secure a sufficient delay time Tld in latency shifter 5b even in a high speed operation.

Moreover, in the case when shift clock signal SHCLK is generated with a phase thereof adjusted relative to external clock signal CLKe (or internal clock signal CLKi), it is possible to sufficiently secure the time Tpd+Ts shown in FIG. 27. In the case when internal clock signal CLKi is applied as a high speed clock signal, if shift clock signal SHCLK is generated with a delay time depending on the frequency of internal clock signal CLKi, the operation frequency of internal clock signal CLKi is determined by the delay time of shift clock signal SHCLK. In this case, when the delay time of shift clock signal SHCLK is shortened, it becomes impossible to take in and transfer output data PD of preamplifier 5a at an accurate timing.

Therefore, as shown in FIG. 27, by using a clock signal having a phase adjusted relative to external clock signal CLKe (or internal clock signal CLKi) as shift clock signal SHCLK, it is possible to provide a fixed delay time that is not dependent on the frequency of the clock signal to shift clock signal SHCLK. In the case when this fixed delay time of shift clock signal SHCLK is set to the propagation delay time Tld shown in FIG. 28, it becomes possible to minimize the propagation delay time in latency shifter 5b, and it is also possible to maximize the time Tmd+Tpd required for the memory cell data to reach latency shifter 5b. The activation of preamplifier activation clock signal PAECK can be set to the point of time at which the memory cell data is transferred even in a high speed operation, thereby allowing latency shifter 5b to take in data amplified by preamplifier 5a more accurately. Even when the activation of preamplifier activation signal PAECK is adjusted in accordance with the operation frequency, it is possible to secure a sufficient time as the time required for transmission of the memory cell data. Thus, it becomes possible to improve the frequency characteristics of the internal data reading operation, and also to read the internal data stably at high speed for transmitting to the subsequent stage circuit. Consequently, the internal data can be transferred in synchronization with a high speed clock signal in a pipelined manner.

Here, the phase adjusting time of shift clock SHCLK is adjusted by taking the signal propagation delay time Tld into consideration independently from the frequency of clock signal CLKe. Therefore, it is possible to always operate latency shifter 5b at an optimal timing without exerting any adverse effect on the frequency of external clock signal CLKe.

Figure 29:
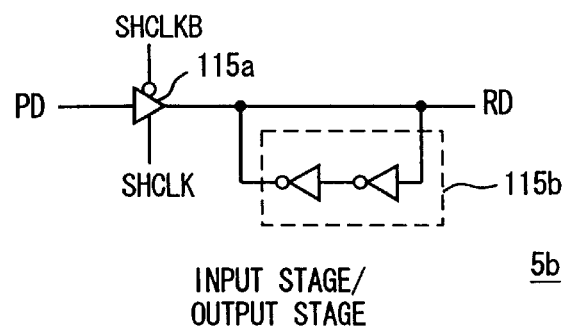
FIG. 29 is a diagram showing an example of the construction of a latency shifter shown in FIG. 26.

FIG. 29 is a schematic diagram showing the construction of one stage of latency shifter 5b. In FIG. 29, latency shifter 5b includes a tri-state buffer 115a for transmitting output data PD of preamplifier 5a in accordance with complementary shift clock signals SHCLK and SHCLKB, and an inverter latch 115b for latching the output signal of this tri-state buffer 115a. The construction shown in FIG. 29 is placed in each of the input stage and output stage. The number of shift stages (construction shown in FIG. 29) placed in latency shifter 5b is appropriately determined by column latency CL.

In this latency shifter 5b, output data PD of preamplifier 5a is incorporated and transmitted in response to the rise of shift clock signal SHCLK, and read data RD is transferred to internal reading data bus 10 in synchronization with the rise of shift clock signal SHCLK.

As described above, in accordance with the tenth embodiment of the present invention, inside the reading circuit, the preamplifier is activated in a data reading operation with a delay time according to the frequency of the internal clock signal, and the data of the preamplifier is then transferred by utilizing a clock signal having a fixed delay and adjusted in phase with respect to the external clock signal (or the internal clock signal) as a shift clock signal. Thus, even in a high speed operation, the output data of the preamplifier is transferred accurately in accordance with the shift clock signal SHCLK to generate the internal read data. Moreover, even in the case when the pipeline stages are operated at high speed, the latency shifter is operated by taking into consideration the operation start timing of the subsequent stage circuit and the signal propagation delay of the pipeline stage such that the activation timing of the preamplifier is always delayed as much as possible. Thus, it becomes possible to transfer data accurately in accordance with the high speed clock in a pipelined manner.

Eleventh Embodiment

Figure 30:
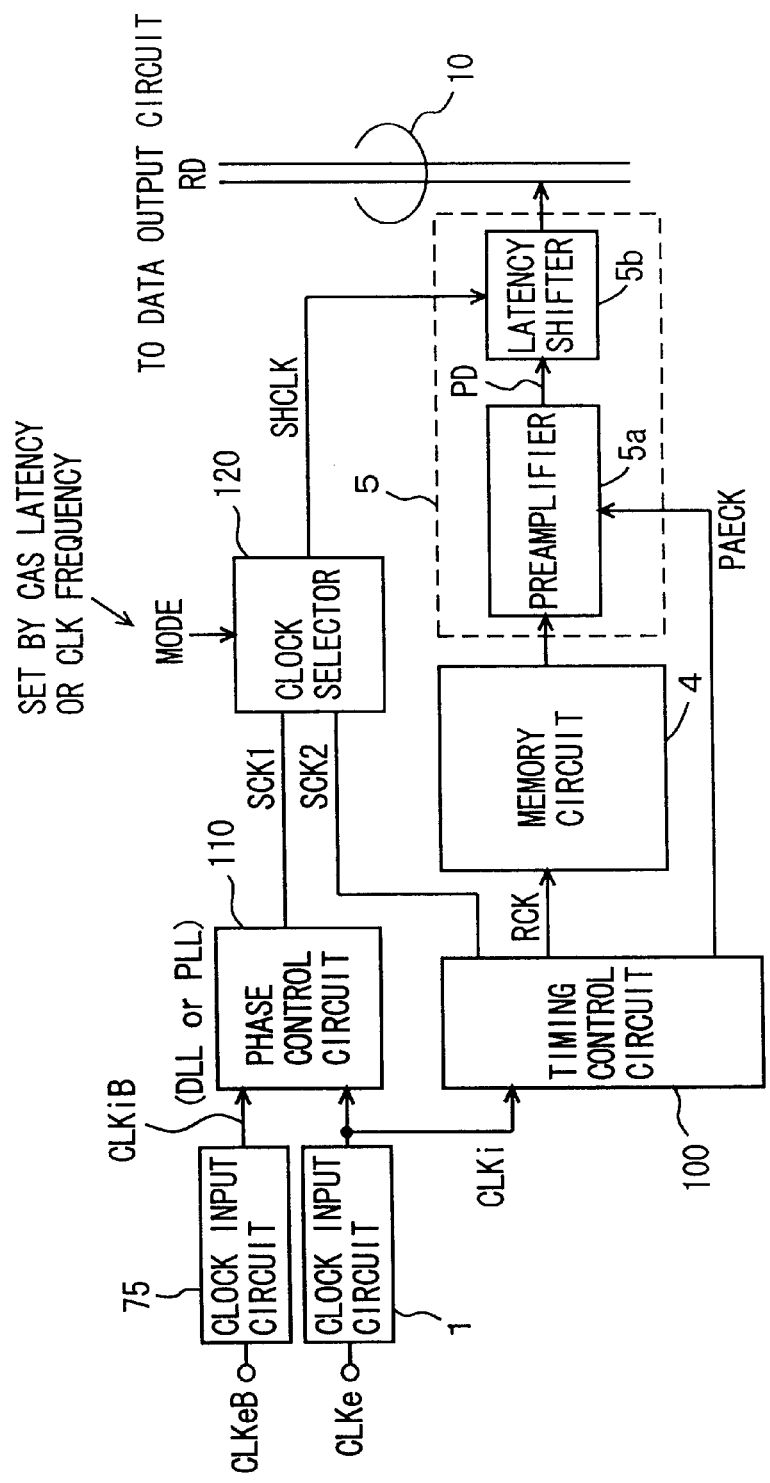
FIG. 30 is a schematic diagram showing the construction of a main part of a semiconductor memory device in accordance with an eleventh embodiment of the present invention.

FIG. 30 is a schematic diagram showing the construction of a main part of a synchronous type semiconductor memory device in accordance with the eleventh embodiment of the present invention. In the construction shown in FIG. 30, a clock selector 120 is arranged to alter the timing of shift clock signal SHCLK in accordance with a mode selection signal MODE. This clock selector 120 selects either of a clock signal SCK1 applied from phase control circuit 110 and having a phase adjusted with respect to the external clock signal (or the internal clock signal) and a clock signal SCK2 generated from timing control circuit 100 and having a delay time according to the operation frequency of internal clock signal CLKi.

This mode selection signal MODE is set depending on CAS latency, the frequency of the clock signal and on whether the data output mode is DDR or SDR mode. Mode selection signal MODE may be set in a mode register, or may be set in a fixed manner by metal interconnection line or bonding wiring or the like. In the case of a high speed operation, clock selector 120 selects phase-adjusted clock signal SCK1 from phase control circuit 110, in accordance with mode selection signal MODE, to generate shift clock signal SHCLK. In the case of a relatively low speed operation or in the case when there is a sufficient margin in the shift operation timing, clock selector 120 selects clock signal SCK2 having a non-adjusted phase and changing following internal clock signal CLKi from timing control circuit 100, in accordance with mode selection signal MODE, to generate shift clock signal SHCLK.

By using mode selection signal MODE, shift clock signal SHCLK is generated in accordance with either the phase-adjusted clock signal or the phase-non-adjusted clock signal having a delay according to the clock frequency so that it is possible to set the operation timing of latency shifter 5b at an optimal timing depending on the operation environment of the semiconductor memory device. For example, in the case of a relatively low speed operation or in the case when there is a sufficient time margin for the internal data transfer operation, shift clock signal SHCLK is generated in accordance with clock signal SCK2 having a non-adjusted phase and a delay according to the clock frequency. Therefore, latency shifter 5b can be operated to generate read date RD after output data PD of preamplifier 5a is sufficiently stabilized. Thus, by switching the generation mode of clock signal SHCLK in accordance with the operation conditions, it is possible to implement a semiconductor memory device that is reliably operated in a stable manner in accordance with the operation conditions.

Modification

Figure 31:
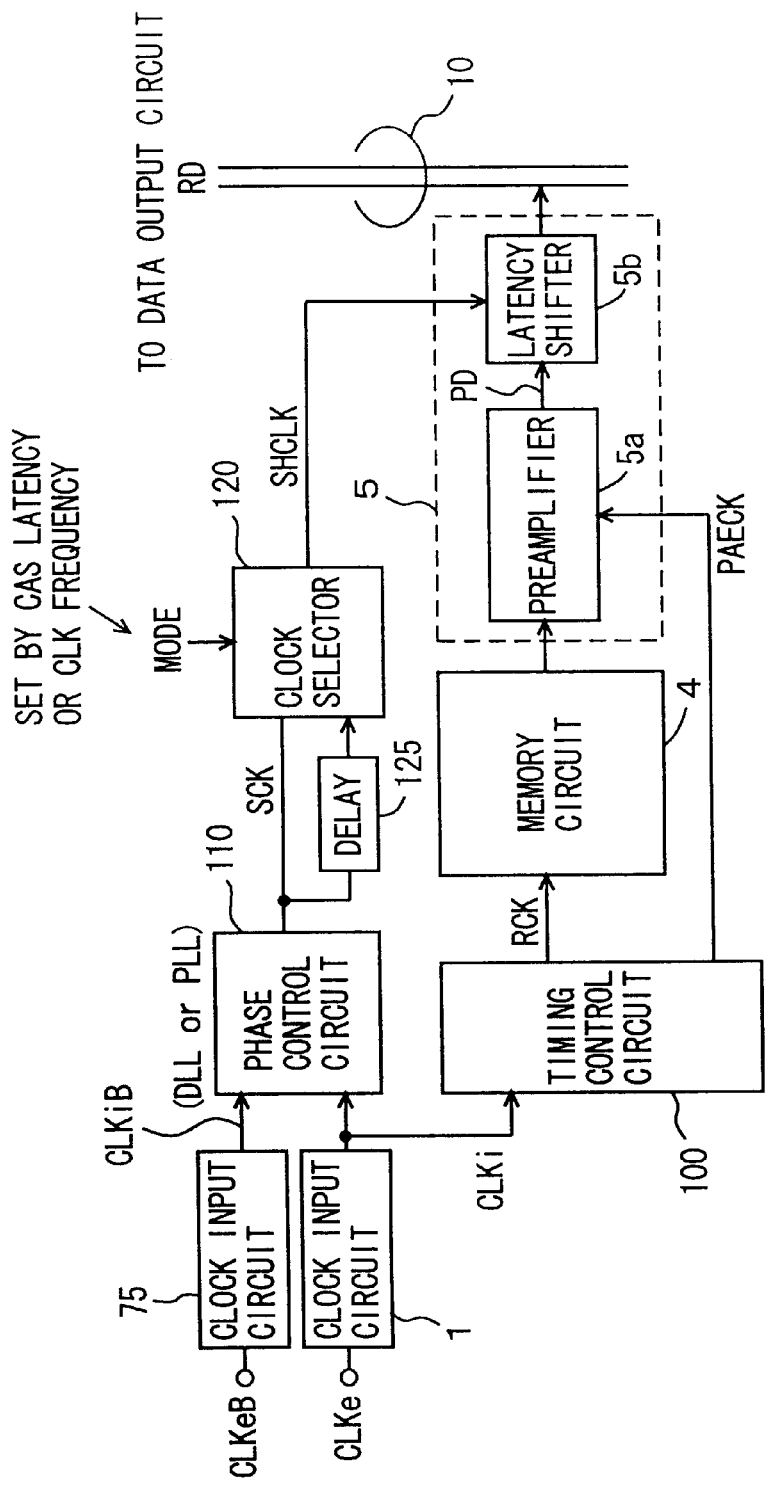
FIG. 31 is a schematic diagram showing a modification of the eleventh embodiment of the present invention.

FIG. 31 is a schematic diagram showing a construction of a modification of the eleventh embodiment of the present invention. In FIG. 31, phase-adjusted clock signal SCK from phase control circuit 110 and an output signal of a delay circuit 125 for delaying phase-adjusted clock signal SCK by a predetermined time are supplied to clock selector 120. In accordance with selection signal MODE, clock selector 120 generates shift clock signal SHCLK by selecting either the delayed clock signal outputted from delay circuit 125 or phase-adjusted clock signal SCK from phase control circuit 110.

In this case, in place of clock signal SCK2 having a predetermined delay time according to the clock frequency of internal clock signal CLKi in the construction shown in FIG. 30, a delayed clock signal from the delay circuit 125 is used. Since the delayed clock signal is generated by delaying, by a predetermined time, clock signal SCK having a fixed delay and having a phase adjusted by using delay circuit 125, the delayed clock signal also has a fixed delay relative to the internal clock signal. In this case, since phase-adjusted clock signal SCK is a signal leading in phase the external clock signal, and since delay circuit 125 delays clock signal SCK having a fixed delay and having a phase adjusted, this delayed clock signal has a smaller phase difference with respect to external clock signal CLKe. Therefore, in the case of a high speed operation, the activation timing of preamplifier 5a is delayed as much as possible by the delayed clock signal. Here, the delay time of the delay circuit 125 is set to a value that ensures the signal propagation time to the subsequent stage circuit.

In the construction shown in FIG. 31 also, depending on the cases in which a high peed operation is required and in which there is a sufficient margin for the internal data transmission, the activation timing of shift clock signal SHCLK can be switched in accordance with mode selection signal MODE.

Here, in the construction shown in FIGS. 30 and 31, clock selector 120 may not be formed of a gate circuit responsive to mode selection signal MODE, but may simply have a selection path made in accordance with the operation environments in a fixed manner by, for example, mask interconnection.

As described above, in accordance with the eleventh embodiment of the present invention, the shift clock signal is switched depending on the operation environments so that the internal read data can be reliably transferred accurately at an optimal timing in accordance with the operation environments.

Twelfth Embodiment

Figure 32:
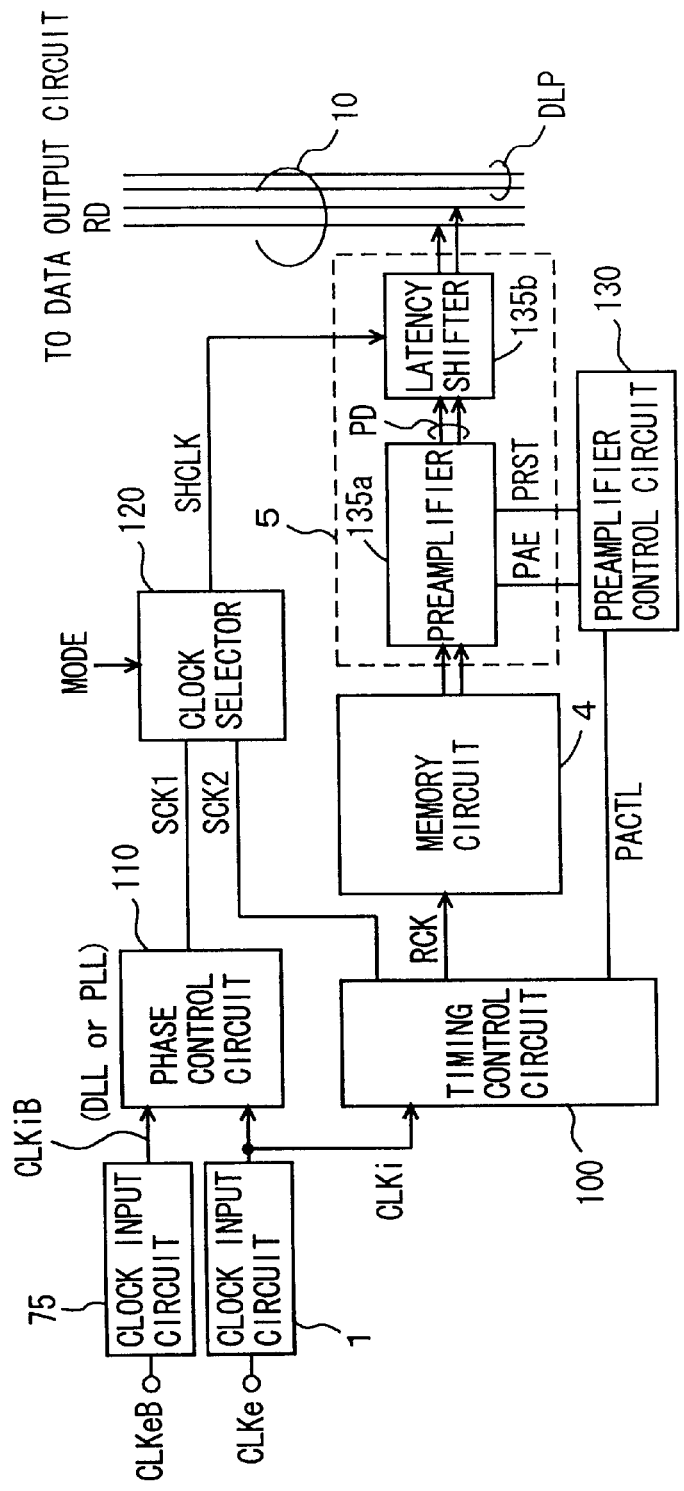
FIG. 32 is a schematic diagram showing the construction of a main part of a synchronous type semiconductor memory device in accordance with a twelfth embodiment of the present invention.

FIG. 32 is a schematic diagram showing the construction of a main part of a synchronous type semiconductor memory device in accordance with the twelfth embodiment of the present invention. In the construction shown in FIG. 32, a preamplifier 135a included in a reading circuit 5 generates complementary amplified data in accordance with complementary internal data from memory circuit 4. Moreover, latency shifter 135b also transfers complementary data from this preamplifier 135a as complementary data to the corresponding pair of read data lines DLP of internal read data bus 10.

Selection clock signal SHCLK from clock selector 120 is applied to latency shifter 135b. This clock selector 120 selects either phase-adjusted clock signal SCK1 from phase control circuit 110 or clock signal SCK2 with a non-adjusted phase from timing control circuit 100, in accordance with mode selection signal MODE.

Complementary data transmitted by preamplifier 135a and latency shifter 135b forms a ternary signal having "H", "L" and "Z" states. "Z" represents a state having "no data", and these complementary data are both set in the Low level, data "Z" is set. This state is a state having no data, and even when this data "Z" is applied to a data output circuit at a subsequent stage and the data taking-in operation is carried out, no data detecting operation is executed. This is because the data lines of internal data bus 10 are maintained in the precharged state. Depending on the precharged voltage of the data lines of the internal data bus, this "Z" state may be set by setting both of the complementary data signals to the High level.

Moreover, a preamplifier control circuit 130, which generates preamplifier activation clock signal PAE and preamplifier reset signal PRST in accordance with preamplifier control clock signal PACTL from timing control circuit 100, is arranged in preamplifier 135a. Preamplifier 135a performs an amplifying operation after temporarily set to a reset state (precharged state of internal nodes) in accordance with preamplifier reset signal PRST. Preamplifier 135a generates data "Z" when set to the reset state by preamplifier reset signal PRST. Now, referring to a timing chart shown in FIG. 33, description will be made of the operation of data reading circuit 5 shown in FIG. 32. In the operation waveform diagram shown in FIG. 33, as shift clock signal SHCLK, the phase-adjusted clock signal SCK1 from phase control circuit 110 is selected by clock selector 102.

Figure 33:
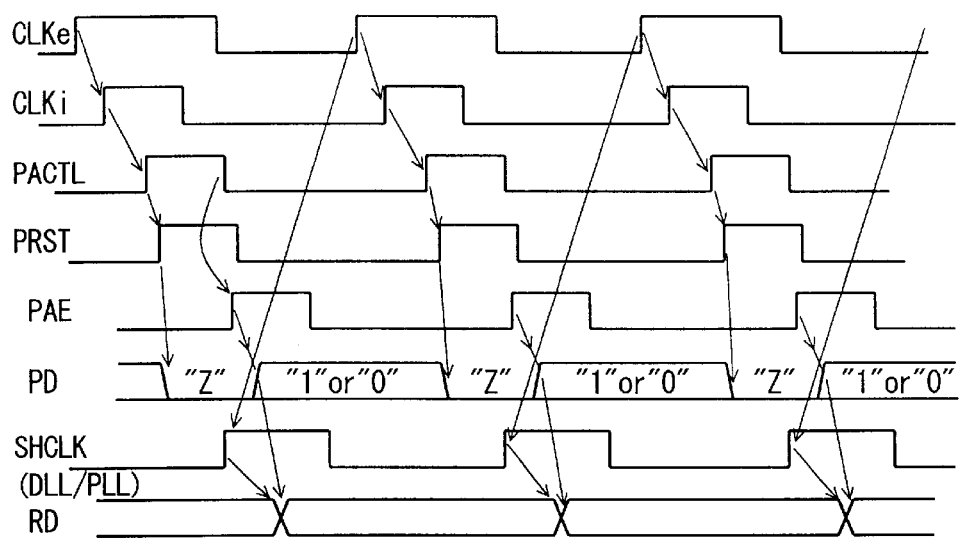
FIG. 33 is a timing chart representing the operation of the synchronous type semiconductor memory device shown in FIG. 32.

Internal clock signal CLKi is generated in accordance with external clock signal CLKe. Upon receipt of a data reading instruction, timing control circuit 100 generates preamplifier control clock signal PACTL in accordance with this internal clock signal CLKi. In response to the rise of this preamplifier control clock signal PACTL, preamplifier control circuit 130 first generates preamplifier reset signal PRST in preamplifier 135a, and sets output data PD of preamplifier 135a to the state of data "Z". After this resetting, preamplifier activation clock signal PAE is activated. In FIG. 33, this preamplifier activation clock signal PAE is indicated as a signal that is generated in the form of a one-shot pulse in response to the fall of preamplifier control clock signal PACTL. However, this preamplifier activation clock signal PAE may be activated in response to the fall of preamplifier reset signal PRST, or this preamplifier reset signal PRST may be delayed by its pulse width to generate preamplifier activation clock signal PAE.

When preamplifier activation clock signal PAE is activated, preamplifier 135a is activated so that the output data PD is set to "1" (H) or "0" (L) in accordance with data applied from memory circuit 4.

Shift clock signal SHCLK is set to the High level at a timing earlier than activation of preamplifier activation clock signal PAE, and responsively, latency shifter 135b executes the taking-in and shifting operations. In this case, latency shifter 135b takes in the invalid data "Z" that is the same as the data in the precharged state as its input data, and its output data RD is changed with data PD outputted by preamplifier 135a being a trigger. Therefore, even when the definite timing of output data PD of preamplifier 135a is later than the rise of shift clock signal SHCLK, read data RD, outputted by latency shifter 135b, is changed with output data PD of preamplifier 130a being a trigger. Thus, the start timing of the transfer operation of latency shifter 135b is made faster than the activation timing of preamplifier 135a so that it is possible to transmit data from the reading circuit to the internal data bus with only the gate propagation delay of the signal Consequently a high speed operation is achieved.

Figure 34A:
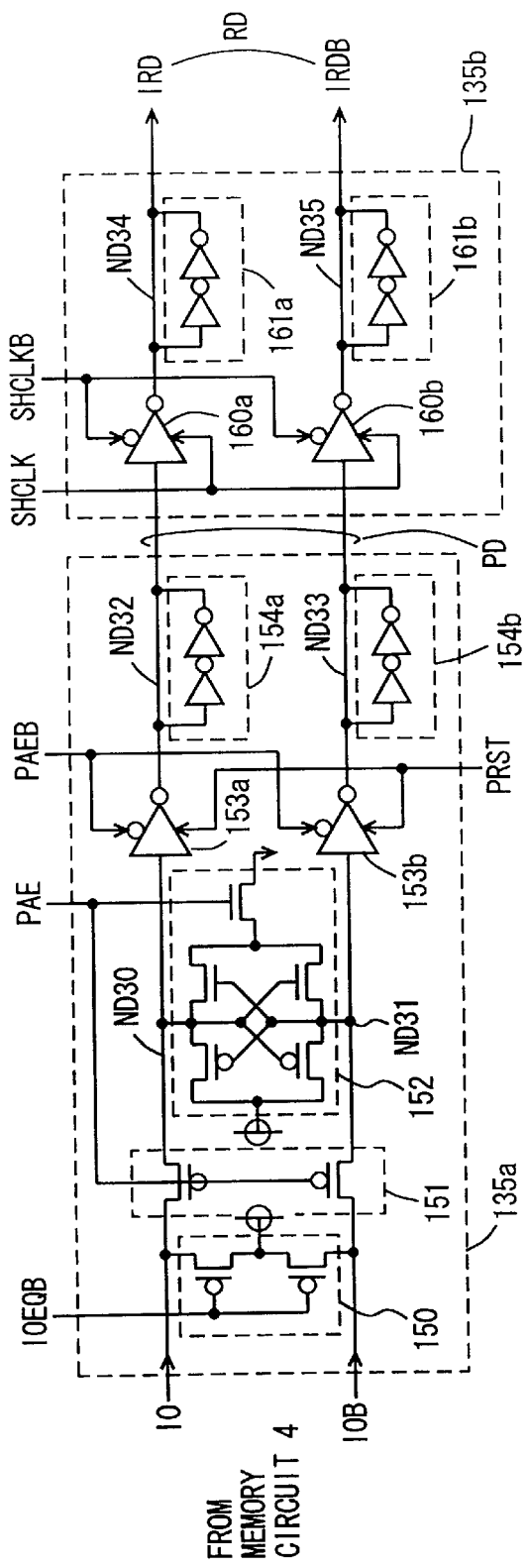
FIG. 34A is a diagram showing examples of a specific construction of a preamplifier and a latency shifter shown in FIG. 32.

FIG. 34A is a diagram showing an example of specific constructions of preamplifier 135a and latency shifter 135b shown in FIG. 32. In FIG. 34A, preamplifier 135a includes an internal data line precharging circuit 150 that is rendered conductive upon activation (Low level) of an internal data line equalization instructing signal IOEQB to precharge internal data lines IO and IOB to power supply voltage level Vcc, an confining gate 151 that is set to the non-conductive state upon activation of preamplifier activation clock signal PAE to isolate preamplifier internal nodes ND30 and ND31 from internal data lines IO and IOB, a differential amplification circuit 152 that is activated upon activation preamplifier activation clock signal PAE to differentially amplify data on internal nodes ND30 and ND31, tri-state inverter buffers with a resetting function 153a and 153b that are activated upon activation (Low level) of complementary preamplifier activation clock signal PAEB to invert data of internal nodes ND30 and ND31 and to transmit the resultant data to nodes ND32 and ND33, and is also activated upon activation (High level) of preamplifier reset signal PRST to reset nodes ND32 and ND33 to the ground voltage level, and inverter latches 154a and 154b for latching signals of nodes ND32 and ND33.

Differential amplification circuit 152 includes cross-coupled N-channel MOS transistors, cross-coupled P-channel MOS transistors, and a preamplifier activating N-channel MOS transistor that couples the common source of cross-coupled N-channel MOS transistors to the ground node upon activation of preamplifier activation clock signal PAE. Internal data line precharging circuit 150 is constituted of MOS transistors, and precharges internal data lines IO and IOB for transmitting internal read data from the memory array, to the power supply voltage VCC level in the stand-by state.

Figure 34B:
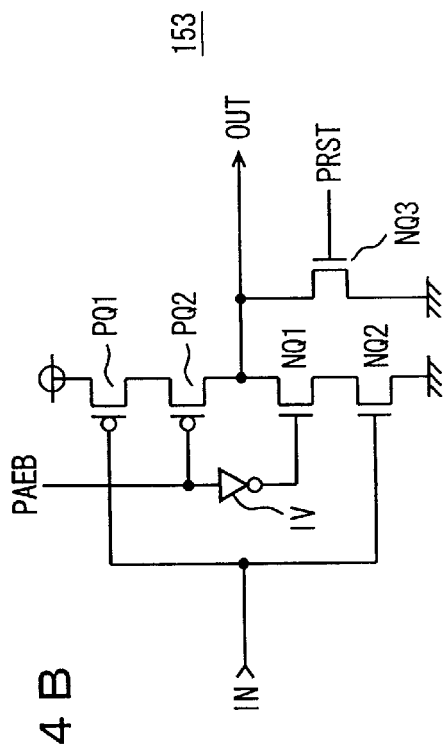
FIG. 34B is a diagram showing an example of a specific construction of a tri-state inverter buffer with a resetting function shown in FIG. 34A.

FIG. 34B is a diagram shows an example of a specific construction of tri-state inverter buffers 153a and 153b with a resetting function shown in FIG. 34A. Since these tri-state inverter buffers 153a and 153b having a resetting function have the same construction, FIG. 34B representatively shows the construction of one tri-state inverter buffer 153. In FIG. 34B, tri-state inverter buffer 153 with a resetting function includes P-channel MOS transistors PQ1 and PQ2 that are connected in series between the power supply node and an output node, N-channel MOS transistors NQ1 and NQ2 that are connected in series between the output node and the ground node, and a resetting N-channel MOS transistor NQ3 that is rendered conductive upon activation of preamplifier resetting signal PRST to discharge the output node to the ground voltage level. The gates of MOS transistors PQ1 and NQ2 are connected to an input node thereof. Complementary preamplifier activation clock signal PAEB is supplied to the gate of P-channel MOS transistor PQ2, and complementary preamplifier activation clock signal PAEB is supplied to the gate of N-channel MOS transistor NQ1 through inverter IV.

In the construction shown in FIG. 34B, since nodes ND32 and ND33 are internal nodes and have small load capacitances, the driving capability of resetting N-channel MOS transistor NQ3 is made sufficiently small. When preamplifier reset signal PRST goes high, output signal OUT from the output node is discharged to the ground voltage level by resetting MOS transistor NQ3. In this state, complementary preamplifier activation clock signal PAEB is kept at H level, and MOS transistors PQ2 and NQ1 are in the non-conductive state.

When preamplifier activation clock signal PAEB goes low, MOS transistors PQ2 and NQ1 are rendered conductive so that the output node is driven by MOS transistor PQ1 or NQ2 in accordance with input signal IN to invert the input signal IN for generating an output signal OUT. Each of the driving powers of MOS transistors PQ1, PQ2, NQ1 and NQ2 is set greater than the driving capability of resetting MOS transistor NQ3. Therefore, even when complementary preamplifier activation signal PAEB is driven to the activate state of L level, while preamplifier reset signal PRST is at H level, output signal OUT is allowed to change in accordance with input signal IN.

Referring back again to FIG. 34A, latency shifter 135b includes tri-state inverter buffers 160a and 160b for transmitting signals of nodes ND32 and ND33 to nodes ND34 and ND35 in accordance with complementary shift clock signals SHCLK and SHCLKB, and inverter latches 161a and 161b for latching signals of nodes ND34 and ND35. Data IRD and IRDB are outputted to a corresponding pair of internal data bus lines from nodes ND34 and ND35. An internal read data RD is generated by these complementary data IRD and IRDB. Now, referring to a timing chart shown in FIG. 35, an explanation will be made of the operations of preamplifier 135a and latency shifter 135b shown in FIGS. 34A and 34B.

Upon receipt of a read command, equalization instructing signal IOEQB for internal data lines IO and IOB through which data is transmitted from a selected memory cell is first shifted from L level to H level, and the precharging operation to the internal data lines IO and IOB is completed.

Figure 35:
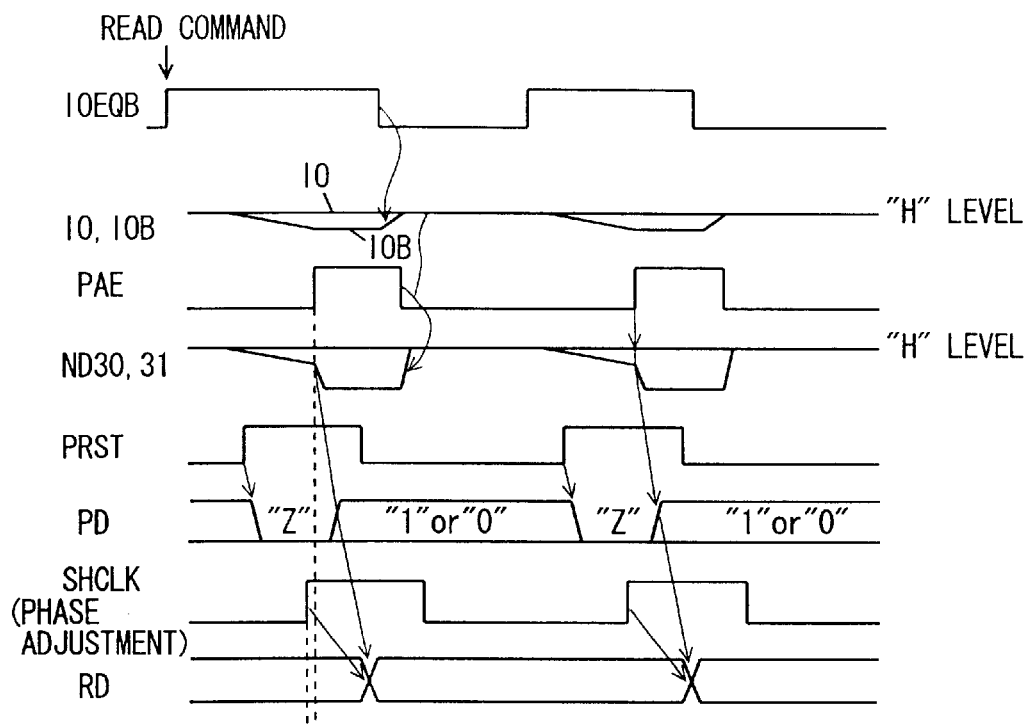
FIG. 35 is a timing chart representing the operation of a reading circuit shown in FIGS. 34A and 34B.

A memory cell is selected, and in accordance with the selected memory cell data, the potential levels of internal data lines IO and IOB are changed. FIG. 35 shows a signal waveform in the case when L level data is transmitted to internal data line IOB. Since preamplifier activation clock signal PAE is in L level and therefore confining gate 150 is in the conductive state. Thus, voltage levels on internal nodes ND30 and ND31 in the preamplifier are changed in accordance with the memory cell data. In parallel with the internal data transfer to preamplifier 135a, preamplifier reset signal PRST is raised to H level at a predetermined timing, tri-state inverter buffers 153a and 153b with a resetting function are set in the reset state, both of nodes ND32 and ND33 are set to L level, and output data PD of preamplifier 135a is set to the state "Z".

When this preamplifier reset signal PRST is in H level, shift clock signal SHCLK goes high and tri-state inverter buffers 160a and 160b in latency shifter 135b are made operative. In this case, nodes ND34 and ND35 of latency shifter 135b are both set to H level. This state corresponds to the state where both of the internal data lines are precharged to the power supply voltage level. In the case where each data line of the internal data bus is precharged to the ground voltage as shown in the aforementioned embodiment, the state "Z" is designated by resetting both of internal nodes ND32 and ND33 to H level. Alternatively, an additional inverter of one stage for inverting output data may be provided in latency shifter 135b.

When preamplifier activation clock signal PAE goes high, differential amplification circuit 152 is activated so that the potentials of nodes ND30 and ND31 are differentially amplified. At this time, confining gate 150 is rendered non-conductive upon activation of preamplifier activation clock signal PAE, and nodes ND30 and ND31 are isolated from internal data lines IO and IOB. When preamplifier activation clock signal PAE is activated, complementary preamplifier activation clock signal PAEB is also activated so that tri-state inverter buffers 153a and 153b with a resetting function transmit memory cell data to nodes ND32 and ND33 set at the reset states in accordance with signals of the CMOS level generated by differential amplification circuit 152. Accordingly, output data RD of latency shifter 135b changes in accordance with voltage levels of nodes ND32 and ND33. When shift clock signal SHCLK goes low, latency shifter 135b is set to the latching state.

After preamplifier reset signal PRST is set to L level, one data reading operation is completed and internal data line equalization instructing signal IOEQB is again set to the L level so that internal data lines IO and IOB are precharged to the power supply voltage Vcc level. After the completion of this precharging operation, preamplifier activation clock signal PAE is temporarily activated to L level so that nodes ND30 and ND31 are precharged to the power supply voltage Vcc level through confining gate 150 set into the conductive state. At this time, tri-state inverter buffers 153a and 153b are set to the output high impedance state, and therefore, even when internal nodes ND30 and ND31 are precharged to the power supply voltage Vcc level in preamplifier 135a, output data PD of preamplifier 135a is maintained in the state corresponding to the previously read data.

When a data reading operation is again started, preamplifier reset signal PRST is first activated so that internal nodes ND32 and ND33 are reset and the held data in preamplifier 130a is reset to the state "Z". Preamplifier activation signal PAE is activated, and thereafter, the same operations as described above are performed to read data.

Therefore, as shown in FIG. 35, by setting latency shifter 135b to the through state when preamplifier 135a is outputting data "Z", data amplified in accordance with preamplifier activation clock signal PAE is transmitted onto internal data bus 10, with only signal propagation delays in preamplifier 135a and latency shifter 135b. Therefore, it is possible to transmit output data of preamplifier 135a to internal data bus 10 within the shortest period of time, without the necessity of taking into consideration the timing margins in preamplifier 135a and latency shifter 135b. Thus, the activation timing of preamplifier 135a can be delayed as late as possible so that it is possible to activate preamplifier 135a by taking into consideration the memory cell data transfer time to the preamplifier even in a high speed operation. Consequently, data can be stably read to be transferred to a next-stage circuit.

As described above, the latency shifter is enabled prior to activation of the preamplifier so that it is possible to set the time difference between the activation of the preamplifier and the enabling operation of the latency shifter to a negative time difference. With the assumption that the time required for memory cell data to arrive at the preamplifier circuit is a fixed delay time inherent to the semiconductor device, the time required for data from the selected memory cell to be transferred to the data output circuit on the next stage is represented by only the sum of the fixed delay time and the propagation delay times of the preamplifier, latency shifter and internal reading data lines. Thus, it is not necessary to take into consideration a margin for the time difference between the activation of the preamplifier and the enabling operation of the latency shifter, and it becomes possible to transfer data at high speed.

Here, in the above described construction, the latency shifter is provided on the circuit stage immediately following the preamplifier. However, the latency shifter only needs to be placed between the preamplifier and the data output circuit, and it is not necessary to provide this latency shifter on the circuit stage immediately following the preamplifier.

Moreover, the preamplifier and the latency shifter are placed corresponding to each of the internal data bits, and in the above-mentioned construction, the construction for transferring 1-bit data is representatively shown.

In addition, a plurality of pairs of the preamplifier and the latency shifter may be coupled to one pair of read data lines in parallel with each other, and in accordance with the preamplifier selection signal, one pair of the preamplifier and latency shifter may be coupled to the corresponding pair of read data lines. Alternatively, in the case where the number of internal data lines IO is great, like an embedded DRAM (Dynamic Random Access Memory), preamplifiers and latency shifters, placed on the respective pairs of internal data lines (IO, IOB), may be activated at the same time in parallel with each other so that the corresponding data bits may be transferred to the corresponding pairs of read data lines of the data bus.

As described above, in accordance with the twelfth embodiment of the present invention, the preamplifier and the latency shifter are configured to transmit complementary data signals, and the latency shifter is enabled prior to activation of the preamplifier. Therefore, it is not necessary to take the timing margin for the activation of the latency shifter into consideration, and the transfer time of the preamplifier output data can be determined by using only the signal propagation delay time, thereby making it possible to implement a high speed data transfer. Moreover, by transmitting complementary signals, it is possible to transmit signals of small amplitudes, and consequently it is possible to transfer internal data at high speed.

Thirteenth Embodiment

Figure 36:
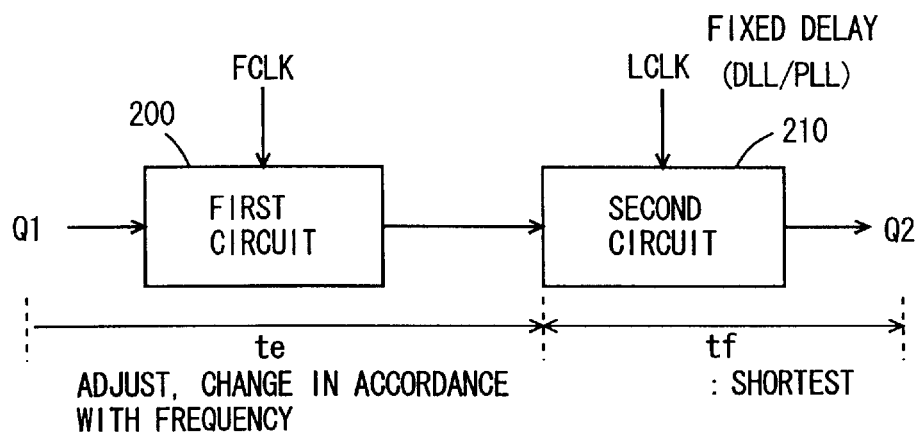
FIG. 36 is a schematic diagram showing the construction of a main part of a semiconductor memory device in accordance with a thirteenth embodiment of the present invention.
Figure 37:
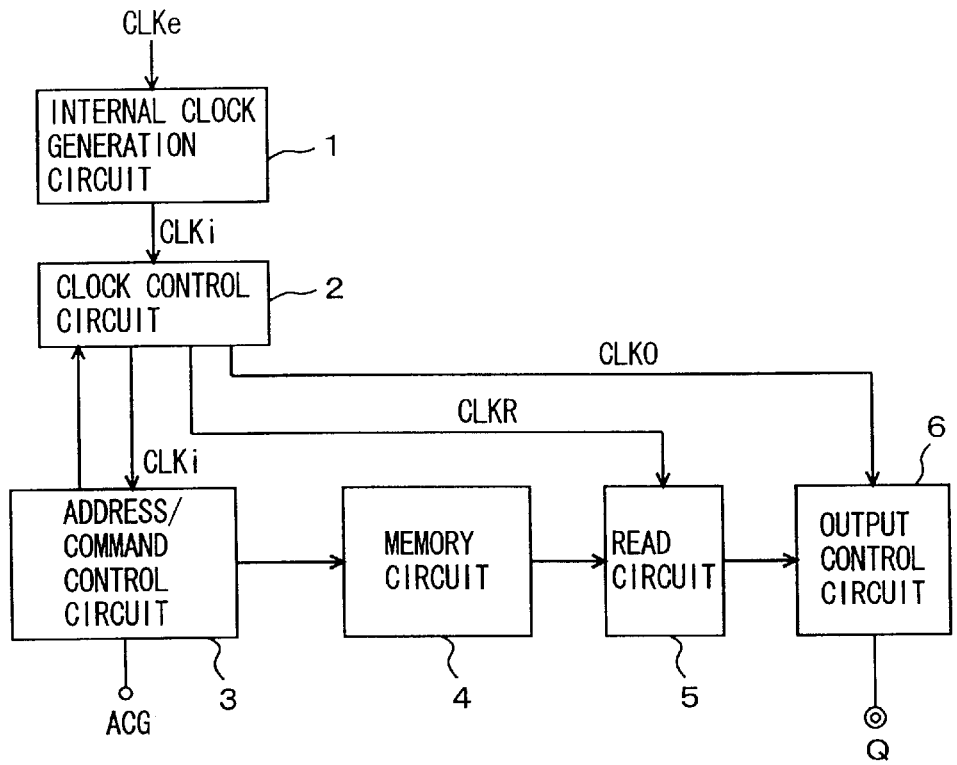
FIG. 37 is a schematic diagram showing the construction of a main part of a conventional synchronous type semiconductor memory device.
Figure 38:
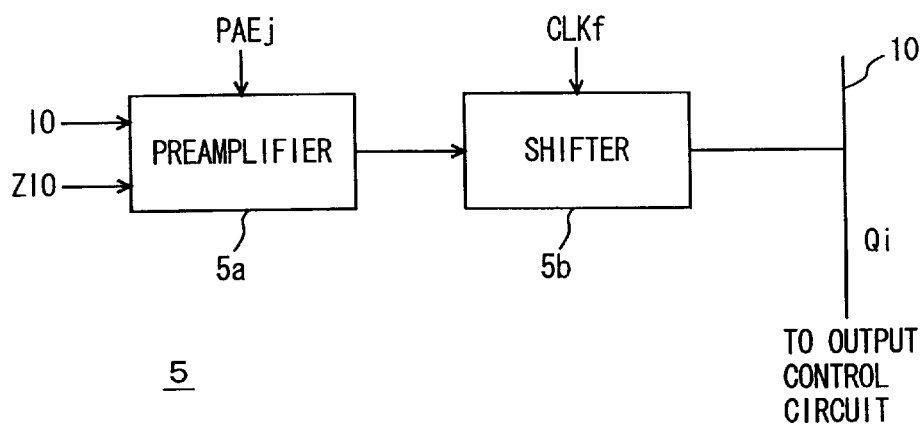
FIG. 38 is a schematic diagram showing the construction of a reading circuit shown in FIG. 37.
Figure 39:
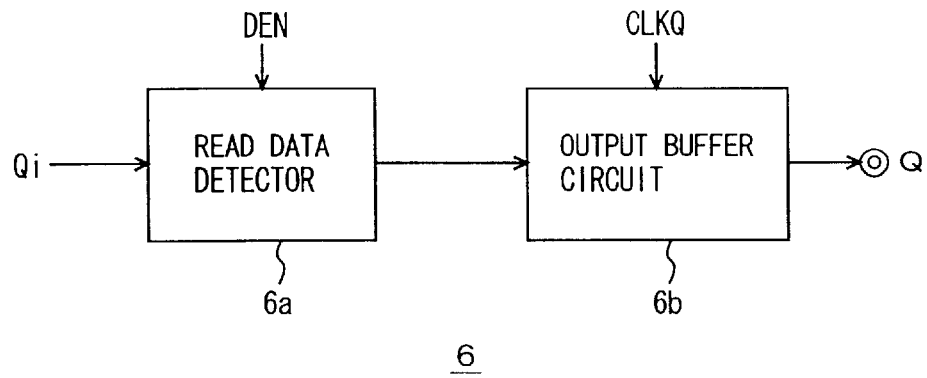
FIG. 39 is a schematic diagram showing the construction of an output control circuit shown in FIG. 37.
Figure 40:
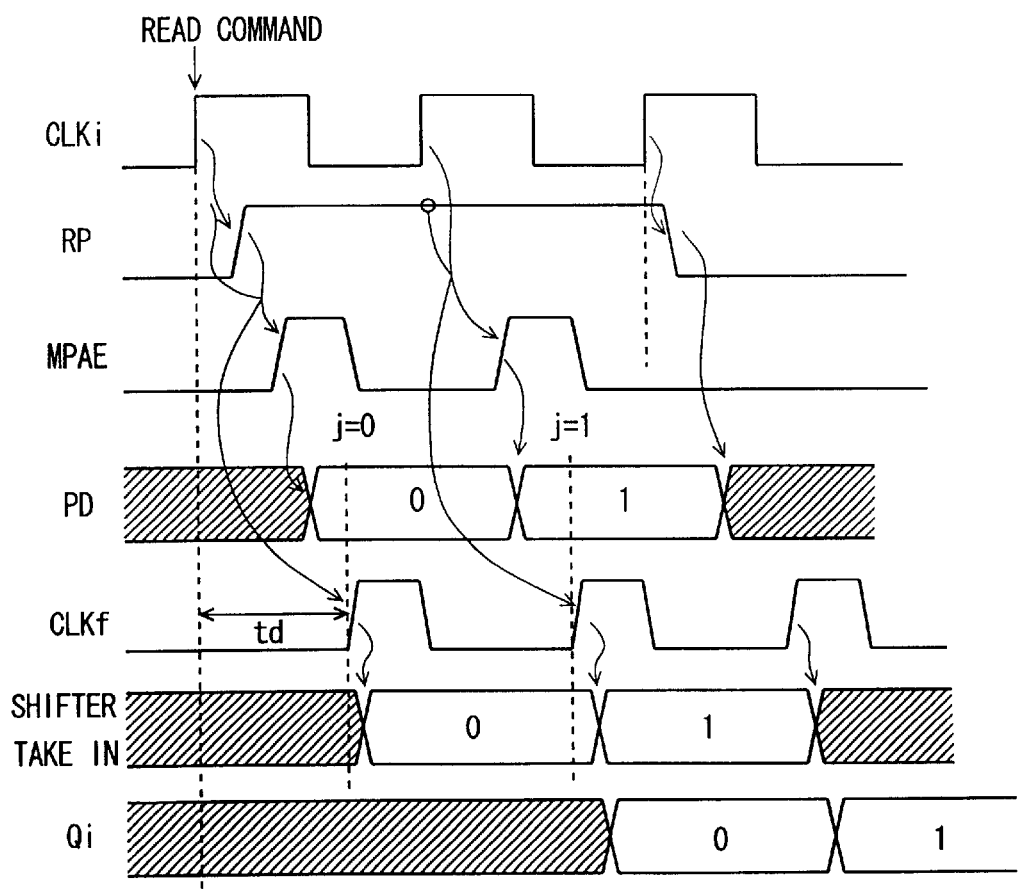
FIG. 40 is a timing chart representing a data reading operation of a synchronous type semiconductor memory device shown in FIG. 37.
Figure 41:
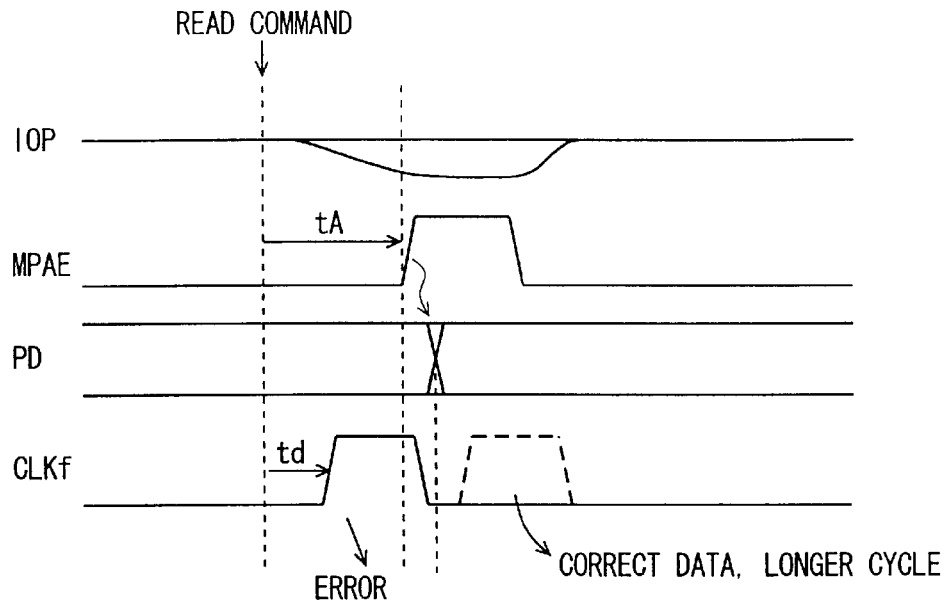
FIG. 41 is a timing chart representing the operation of a reading circuit shown in FIG. 38.
Figure 42:
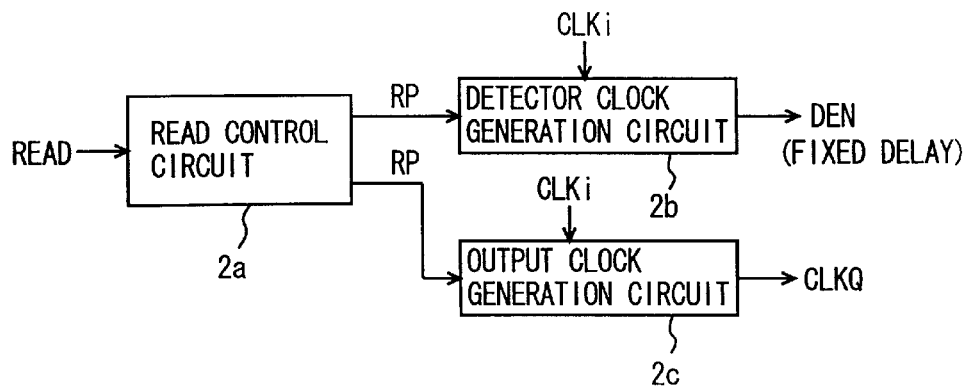
FIG. 42 is a schematic diagram showing the construction of a data output control clock signal generation section in the conventional synchronous type semiconductor memory device.
Figure 43:
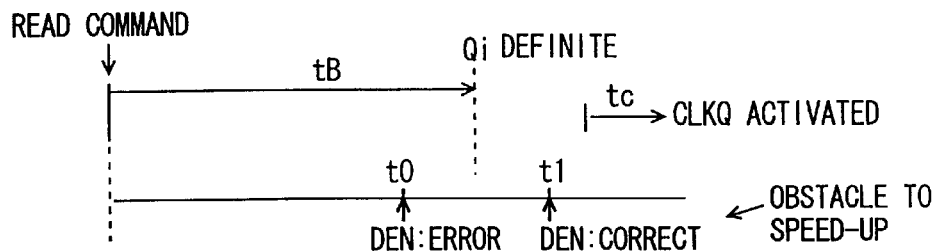
FIG. 43 is a diagram illustrating a problem with the data output control circuit shown in FIG. 42.

FIG. 36 is a schematic diagram showing a construction of a main portion of a semiconductor memory device in accordance with the thirteenth embodiment of the present invention. FIG. 36 schematically shows the construction of a circuit for transmitting data. In FIG. 36, this data transfer circuit includes a first circuit 200 that is operated in accordance with a delay clock signal FCLK which is non-adjusted in phase and has a delay time depending on the frequency of an internal clock signal, and amplifies or transfers internal read data Q1, and a second circuit 210 that is operated in accordance with a phase-adjusted clock signal LCLK that is adjusted in phase relative to an external clock signal and has a delay time (fixed delay) which is not dependent on the clock frequency, and transfers or amplifies the output data of the first circuit 200, for transferring data Q2 to a next-stage circuit.

The time te required for the first circuit 2000 to transfer the data to the second circuit is determined in accordance with the operation frequency. The first circuit 200 is supplied with delay clock signal FCLK generated by a buffer circuit or a delay circuit and having a delay time depending on the frequency of the clock signal. The use of delay clock signal FCLK make it possible to optimize the operation timing of the first circuit in accordance with the operation frequency.

Here, in order to achieve a high speed operation, it is necessary for the second circuit 210 to transfer data Q2 to the next-stage circuit (or an external device) in a period of time as short as possible, and the time tf required for the data transfer in the second circuit 210 is made as short as possible. To this end, the second circuit 210 is supplied with the clock signal CLK, which has a fixed delay and is phase-adjusted with respect to an external clock signal (or internal clock signal), as an operation timing signal. This fixed delay is an specific period of time determined by the construction of the second circuit 210.

When the operation frequency is determined, the sum of the time te and the time tf is uniquely determined. The time tf required for the signal propagation in the second circuit 210 is set to a fixed value independent of the clock frequency. The propagation delay time in the second circuit 210 is made as short as possible down to the specific, inherent time determined by the second circuit construction to make the time te required for the signal propagation through the first circuit 200 as long as possible. Thus, the operation conditions in the first circuit 200 are mitigated, and it becomes possible to transfer data at high speed. Accordingly, even in a high speed operation, it is possible to transfer data accurately, while ensuring a sufficient operation time for the first circuit 200.

Here, the first and second circuits 200 and 210 may be constructed so as to transfer ternary data.

Other Embodiments

In the above described embodiments, the internal data bus may transfer internal write data and internal read data in a separate manner. Moreover, the internal IO line may have a separated IO construction in which write data to a memory cell and read data from the memory cell are transmitted through individual paths.

Moreover, as for the semiconductor memory device, any memory device may be used as long as it has a circuit for transferring data sequentially in synchronization with a clock signal.

As described above, in accordance with the present invention, a clock signal that has a delay time dependent on the clock frequency and also is non-adjusted in phase with respect to a basic clock signal that is, for example, an external clock signal and a clock signal having a fixed delay that is adjusted in phase with respect to the basic clock signal are used to operate the circuits. Thus, each of the circuits is operated at an optimal timing to transfer signals at high speed accurately. Thus, it is possible to implement a signal transfer circuit superior in frequency characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    clock generation circuitry including a phase adjusting circuit, for generating a phase-adjusted output clock signal in accordance with a basic clock signal;
    read clock generation circuitry for generating a read clock signal non-adjusted in phase and delayed with respect to said basic clock signal from said basic clock signal;
    internal read circuitry for transmitting data of a selected memory cell in a memory array in accordance with said read clock signal to an internal data bus;
    latch circuitry for latching data on said internal data bus; and
    output circuitry for transferring the data latched in said latch circuitry in accordance with said output clock signal.

2. The semiconductor memory device according to claim 1, wherein
    said latch circuitry latches data of a plurality of bits on said internal data bus in parallel with each other in response to said output clock signal, and said semiconductor memory device further comprises:
        a parallel/serial conversion circuit for converting the data latched by said latch circuitry to serial data for transmission to said output circuitry, in accordance with said output clock signal.

3. The semiconductor memory device according to claim 1, further comprising a clock repeater for buffering said output clock signal for transmission to said latch circuitry and said output circuitry.

4. The semiconductor memory device according to claim 1, further comprising clock adjusting circuitry for adjusting in timing said output clock signal for transmission to said latch circuitry and said output circuitry.

5. The semiconductor memory device according to claim 2, further comprising clock adjusting circuitry for adjusting in timing said output clock signal for transmission to said latch circuitry, said parallel/serial conversion circuit and said output circuitry.

6. The semiconductor memory device according to claim 1, wherein
    said clock generation circuitry further comprises a logic circuit for combining an internal clock signal non- adjusted in phase with respect to said basic clock signal and said phase-adjusted output clock signal, and
    said latch circuitry performs a latching operation in accordance with a combined clock signal generated from said logic circuit.

7. The semiconductor memory device according to claim 1, wherein
    said clock generation circuitry generates said phase-adjusted output clock signal and an internal clock signal non-adjusted in phase with respect to said basic clock signal, and
    said latch circuitry comprises:
        a confining gate set to a latch state in response to said internal clock signal; and
        an amplifier circuit for amplifying data applied through said confining gate in response to a combined clock signal of said phase-adjusted output clock signal and said internal clock signal.

8. The semiconductor memory device according to claim 6, further comprising a clock adjusting circuit for delaying said phase-adjusted output clock signal for transmission to said output circuitry.

9. The semiconductor memory device according to claim 1, wherein said latch circuitry further comprises an amplifier circuit activated in response to said output clock signal, for amplifying data on said internal data bus.

10. The semiconductor memory device according to claim 1, further comprising a clock selection circuit receiving said output clock, for selecting either of said output clock signal, an inverted clock signal of said output clock signal and either of a rising edge and falling edge of said output clock signal in accordance with a selection signal for application to said latch circuitry as a latch triggering clock signal.

11. The semiconductor memory device according to claim 2, further comprising a bypass circuit for transferring data of said latch circuitry to said output circuitry while bypassing said parallel/serial conversion circuit.

12. The semiconductor memory device according to claim 2, wherein said clock generation circuitry generates first and second phase-adjusted clock signals synchronized in phase to said basic clock signal, and
    said semiconductor memory device further comprises;
        a clock selection circuit for selecting either of said first and second phase-adjusted clock signal for said parallel/serial conversion circuit in accordance with a clock selection signal, and also for selecting a triggering edge of the clock selection signal for application to said parallel/serial conversion circuit.

13. A semiconductor memory device comprising:
    a preamplifier circuit for amplifying data transferred from a memory array in response to a first clock signal, said first clock signal being generated in accordance with an external clock signal through delay of said external clock signal with a phase thereof non-adjusted; and
    a shift circuit for transferring output data from said preamplifier circuit in response to a second clock signal, said second clock signal being a clock signal having a phase adjusted relative to said external clock signal.

14. The semiconductor memory device according to claim 13, further comprising a selection circuit for selecting either of a third clock generated from said external clock signal and having a non-adjusted phase and delayed with respect to said external clock signal, and said second clock signal for application to said shift circuit as a transferring clock signal determining a shift operation of said shift circuit.

15. The semiconductor memory device according to claim 13, wherein said preamplifier circuit generates ternary complementary signals, and said shift circuit transfers the ternary complementary signals from said preamplifier circuit and generates internal data in a ternary internal transfer signal form.

16. The semiconductor memory device according to claim 15, further comprising:

a circuit responsive to said first clock signal, for resetting said preamplifier circuit to an initial state prior to activation of said preamplifier circuit.

17. A semiconductor memory device comprising:

a first circuit for generating and outputting first data from applied data in accordance with a first clock signal generated from an external clock signal; and a second circuit for generating and outputting second data in accordance with the data generated by said first circuit, in accordance with a second clock signal generated from said external clock signal in a manner different from said first clock signal, said first clock signal being a clock signal generated by delaying said external clock signal with a phase thereof non-adjusted, and said second clock signal being a clock signal having a phase thereof adjusted with respect to said external clock signal.

18. The semiconductor memory device according to claim 17, wherein said second clock signal has a timing adjusted independently from said first clock signal.

19. The semiconductor memory device according to claim 17, further comprising:

a circuit for generating a third clock signal from said external clock signal in a same manner as said first clock signal; and a clock control circuit for operating said second circuit in accordance with either of said third clock signal and said second clock signal.

* * * * *